(12) United States Patent
Hamamoto et al.

(10) Patent No.: US 6,333,895 B1
(45) Date of Patent: Dec. 25, 2001

(54) CLOCK SYNCHRONOUS SEMICONDUCTOR DEVICE HAVING A REDUCED CLOCK ACCESS TIME

(75) Inventors: Takeshi Hamamoto; Satoshi Kawasaki, both of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/678,792

(22) Filed: Oct. 4, 2000

(30) Foreign Application Priority Data

Oct. 7, 1999 (JP) .................................................. 11-286624

(51) Int. Cl.[7] .................................................. G11C 8/00
(52) U.S. Cl. ........................................... 365/233; 365/226
(58) Field of Search ...................................... 365/233, 226

(56) References Cited

U.S. PATENT DOCUMENTS 6,107,700 * 8/2000 Ishikawa et al. ................... 307/116

6,252,820 * 6/2001 Nakamura ........................... 365/233

FOREIGN PATENT DOCUMENTS 10-162573    6/1998  (JP) .

\* cited by examiner

*Primary Examiner*—David Nelms
*Assistant Examiner*—M. Tran
(74) *Attorney, Agent, or Firm*—McDermott, Will & Emery

(57) ABSTRACT

In an output data control circuit for transferring complementary data signals read from a memory array to an external data output node in accordance with an output clock signal, a clocked gate circuit transferring complementary data signals in synchronization with an output clock signal and an output data latch circuit latching an output signal of the clocked gate circuit are operated using a voltage level not exceeding an internal power supply voltage, and the complementary data signals read from a memory cell is subjected to an amplitude expanding processing in a stage preceding the clocked gate circuit, and then is applied to the clocked gate circuit. A clock synchronous semiconductor memory device allowing reduction of a clock access time is provided.

37 Claims, 25 Drawing Sheets

FIG. 17 (CORRESPONDING TO FIG. 1)

CLOCK SYNCHRONOUS SEMICONDUCTOR DEVICE HAVING A REDUCED CLOCK ACCESS TIME

BACKGROUND OF THE INVENTION

1. Field of the Invention

The present invention relates to a clock synchronous semiconductor device, and particularly to a clock synchronous semiconductor device, such as a clock synchronous semiconductor memory device, of which clock access time can be reduced. More particularly, the invention relates to a structure of a data output portion of a clock synchronous semiconductor memory device.

2. Description of the Background Art

FIG. 31 schematically shows a structure of a data output portion of a clock synchronous semiconductor memory device in the prior art. In FIG. 31, a clock synchronous semiconductor memory device includes an internal power supply circuit VDC for producing an internal power supply voltage Vint by lowering an external power supply voltage Vex supplied to a power supply node PDE, a memory cell array MA having a plurality of memory cells arranged in rows and columns, a read circuit PAM receiving internal power supply voltage Vint from internal power supply circuit VDC as one operation power supply voltage, for amplifying data of a selected memory cell in memory cell array MA, a clock buffer CB receiving internal power supply voltage Vint as one operation power supply voltage, for buffering an externally applied clock signal CLKe to produce an internal clock signal CLKi, and an output data control circuit ODC for transferring memory cell data read from read circuit PAM onto an internal data bus DBB in synchronization with clock signal CLKi and transmitting the read data to a data output node group QG.

Output data control circuit ODC receives internal power supply voltage Vint supplied from internal power supply circuit VDC, an external power supply voltage Vex supplied from power supply node PDE and an output power supply voltage VDDQ supplied to a power supply node PDD. Output power supply voltage VDDQ is independent of external power supply voltage Vex, and is dedicated to the output buffer. The purpose of supplying external power supply voltage Vex to output data control circuit ODC is to convert an internal read signal, which is at the level of internal power supply voltage Vint and is applied onto internal data bus DBB, into a signal at the level of external power supply voltage Vex for outputting the read data at the level of output power supply voltage VDDQ to data output node group QG. Now, an operation of a clock synchronous semiconductor memory device shown in FIG. 31 will be briefly described below with reference to a timing chart of FIG. 32.

In a clock cycle #a, a read command instructing data reading is issued. In accordance with this read command, selection of an addressed memory cell column in memory cell array MA and activation of read circuit PAM are performed under the control of a command control circuit (not shown). When read circuit PAM is activated, the data of the selected memory cell is transmitted onto internal data bus DBB. Output data control circuit ODC is in a latch state when internal clock signal CLKi is at L-level so that data read onto data bus DBB is not transferred in clock cycle #a.

In a clock cycle #b, output data control circuit ODC takes in data on internal data bus DBB and then transfers the data to data output node group QG in synchronization with internal clock signal CLKi.

Data Q read onto data output node group QC is sampled by an external device in synchronization with external clock signal CLKe in a clock cycle #c. Accordingly, the read data is sampled by the external device when two clock cycles elapse after the read command is applied. Clock cycle periods required after application of the read command and before output of valid data is referred to as a "CAS latency" or a "column latency".

As shown in FIG. 32, the data can be transferred to an external device in synchronization with clock signal CLKi. Since the data transfer speed is determined by clock signal CLKi (CLKe), data transfer can be performed in synchronization with a fast clock signal, and therefore fast data transfer can be achieved.

Internal power supply circuit VDC is used for reducing a charge/discharge current of a signal line and therefore a whole power consumption of the semiconductor memory device. With increase in memory capacity, MOS transistors which are the components of the memory device are increasingly miniaturized. For ensuring reliability of miniaturized MOS transistors (insulated gate field effect transistors), the power supply voltage applied to the MOS transistors is lowered. The reliability of the MOS transistor to be ensured specifically includes reliability (breakdown characteristics) of a gate insulating film having a thickness reduced in accordance with miniaturization of the element, and reliability of an immunity to hot carriers caused by a short-channelization of the MOS transistors due to miniaturization of the components (if hot carries generated by a high drain electric field are trapped in a gate insulating film, insulating properties of the gate insulating film will deteriorate).

FIG. 33 shows an example of a structure of an output data control circuit in the prior art. FIG. 33 shows a structure of a circuit for transferring data of one bit.

In FIG. 33, output data control circuit ODC includes a clocked gate 900 activated when internal clock signal CLKi is at H-level, to pass signals on an internal data line pair DB and /DB, an output data latch circuit 902 for latching signals applied from clocked gate 900 onto internal read data lines /RL4 and RL4, an inverter circuit 903 inverting a signal applied from output data latch circuit 902 onto internal read data line RL5, and cascaded inverter circuits 904 and 905 of two stages receiving a signal applied from output data latch circuit 902 onto a complementary internal read data line /RL5. Each of these clocked gate 900, output data latch circuit 902, and inverter circuits 903, 904 and 905 receives internal power supply voltage Vint as one operation power supply voltage.

Clocked gate 900 includes an NAND circuit G1 receiving internal clock signal CLKi and a signal on internal data line DB, and an NAND circuit G2 receiving internal clock signal CLKi and a signal on internal data line /DB. Internal data lines DB and /DB are included in internal data bus DBB shown in FIG. 31, and receives complementary data signals from read circuit PAM.

Output data latch circuit 902 includes NAND circuits G3 and G4 forming a flip-flop set when the signal on internal read data line /RL4 is at L-level and reset when the signal on internal read data line RL4 is at L-level. Output data latch circuit 902 further includes NAND circuits G5 and G6 forming a flip-flop reset when the signal on internal read data line /RL4 is at L-level and set when the signal on internal read data line RL4 is at L-level. Output data latch circuit 902 inverts the signals that are transferred from clocked gate 900 onto internal read data lines /RL4 and RL4, and latches and transfers the inverted signals onto internal read data lines RL5 and /RL5.

Output data control circuit ODC further includes a level converting circuit 906 for converting an amplitude of the signal on internal read data line RL5 to a level of external power supply voltage Vex in accordance with the signal on internal read data line RL5 and the output signal of inverter circuit 903, and an output buffer 908 for driving a data output node Q in accordance with the signal that is applied from level converting circuit 906 onto an internal read data line /RL3P and the signal that is applied from inverter circuit 905 onto an internal read data line /RL3N.

Level converting circuit 906 includes a P-channel MOS transistor T1 connected between an external power supply node and a node N1 and having a gate connected to a node N2, a P-channel MOS transistor T2 connected between the external power supply node and node N2 and having a gate connected to node N1, an N-channel MOS transistor T3 connected between node N1 and a ground node supplying a ground voltage providing a reference voltage with a gate thereof connected to internal read data line RL5, an N-channel MOS transistor T4 connected between node N2 and the ground node and having a gate receiving the output signal of inverter circuit 903, a P-channel MOS transistor T5 turned on when the signal on node N2 is at L-level, to drive an internal read data line /RL3P to the level of external power supply voltage Vex, and an N-channel MOS transistor T6 turned on when the signal on node N2 is at H-level, to drive internal read data line /RL3P to the level of ground voltage VSS.

In this level converting circuit 906, when the signal on internal read data line RL5 is at H-level, MOS transistor T3 is on and MOS transistor T4 is off, so that node N2 is charged to the level of external power supply voltage Vex by MOS transistor T2. MOS transistors T5 and T6 form a CMOS inverter, and the signal on internal read data line /RL3 attains the L-level equal to the reference voltage level.

When the signal on internal read data line RL5 is at L-level, MOS transistor T3 is off, and MOS transistor T4 is on so that node N2 is discharged to the level of ground voltage. Responsively, transistor T5 is turned on so that the signal on internal read data line /RL3P attains H-level of external power supply voltage Vex.

Output buffer 908 includes a P-channel MOS transistor MP connected between the power supply node and the output node and having a gate connected to internal read data line /RL3P, and an N-channel MOS transistor MN connected between data output node Q and the ground node supplying reference potential VSSQ with a gate thereof coupled to internal read data line /RL3N. Data output node Q has a relatively large load, and MOS transistors MP and MN have increased sizes (ratio of gate width to gate length) for rapidly driving the relatively large load. For rapid driving of relatively large gate capacitances of MOS transistors MP and MN, level converting circuit 906 utilizes the CMOS inverter formed of MOS transistors T5 and T6, and inverter 905 is also employed.

In the structure of output data control circuit ODC shown in FIG. 33, when internal clock signal CLKi is at H-level, clocked gate 900 is turned on, and signals corresponding to the signals on internal data lines DB and /DB are transferred onto internal read data lines RL5 and /RL5, and are latched. When internal clock signal CLKi is at L-level, clocked gate 900 is off, and the signals on internal read data lines RL4 and /RL4 are at H-level, and output data latch 902 is in the latching state. Accordingly, clocked gate 900 and output data latch 902 transfer the data on internal data lines DB and /DB in synchronization with rising of internal clock signal CLKi.

Level converting circuit 906 is provided for reliably turning off MOS transistor MP included in output buffer 908. Therefore, external power supply voltage Vex is at a voltage level equal to or higher than output power supply voltage VDDQ.

FIG. 34A shows another structure of the output data control circuit in the prior art. In the structure of output data control circuit ODC shown in FIG. 34A, output data latch circuit 902 generates signals at L-level onto internal read data lines RL5 and /RL5 when an output enable control signal ZOEM is inactive. When output enable control signal ZOEM is in the active state of L-level, output data latch circuit 902 operates as a latch circuit to latch signals that are applied from clocked gate 900 onto internal read data lines /RL4 and RL4. Structures other than the above are the same as those shown in FIG. 33, and the corresponding portions bear the same reference numerals.

Output data latch circuit 902 shown in FIG. 34A includes NOR gates G9 and G10 receiving output enable control signal ZOEM, an NAND circuit G4 receiving the signal on internal read data line RL4 and the output signal of NOR gate G9, an AND circuit G7 receiving the signal on internal read data line /RL4 and the output signal of NAND circuit G4, an NAND circuit G5 receiving the signal on internal read data line /RL4 and the output signal of NOR circuit G10, and an AND circuit G8 receiving the signal on internal read data line RL4 and the output signal of NAND circuit G5.

When output enable control signal ZOEM is in the inactive state of H-level, the output signals of NOR circuits G9 and G10 attain L-level so that the signal potentials on internal read data lines RL5 and /RL5 attain L-level. In this state, the signal transmitted from inverter circuit 905 on internal read data line /RL3N is at L-level, and the signal transmitted from level converting circuit 906 on internal read data line /RL3P attains H-level of external power supply voltage Vex. Accordingly, both MOS transistors MP and MN of output buffer 908 are off, and output buffer 908 enters the output high-impedance state.

When output enable control signal ZOEM attains the active state of L-level, NOR circuits G9 and G10 operate as inverter circuits. In this state, AND circuit G7 and NOR circuit G9 operate, in combination, as an NAND circuit, and AND circuit G8 and NOR circuit G10 operate, in combination, as an NAND circuit. In this state, therefore, the signals on internal read data lines /RL4 and RL4 are latched, and the signals corresponding to the data latched on internal read data lines RL5 and /RL5 are generated as is done by the structure of the output data latch circuit already described and shown in FIG. 33.

Output enable control signal ZOEM is driven to the active state at an elapse of the CAS latency less one cycle from application of a read command. Output enable control signal ZOEM is kept active for a clock cycle period of a burst length equal to the number of data successively read after application of the read command. FIG. 34B shows a case where the burst length is equal to four.

Output data Q is transmitted via clocked gate 900 in accordance with internal clock signal CLKi. Therefore, valid data is output in synchronization with rising of internal clock signal CLKi after elapsing of a delay time of the output data control circuit.

In the structure of output data control circuit ODC shown in FIG. 34A, the internal circuit operation can be stopped by utilizing output enable control signal ZOEM, and the current consumption can be reduced. In the case where data output node Q is common to a terminal for write data inputting, output buffer 908 can enters the output high-impedance state by utilizing output enable control signal ZOEM, and the write data can be internally written without data conflict.

FIG. 35A shows still another structure of output data control circuit ODC in the prior art. Output data control circuit ODC shown in FIG. 35A differs from the structure of the output data control circuit shown in FIG. 34A in that output data latch circuit 902 is supplied with an output enable signal ZOE instead of output enable control signal ZOEM, and that level conversion is effected on both the complementary data signals of output data latch circuit 902. Structures other than the above are the same. The corresponding portions bear the same reference numerals, and their description is not repeated.

In the output data control circuit ODC shown in FIG. 35A, output enable signal ZOE is applied, instead of output enable control signal ZOEM, to NOR circuits G9 and G10 of output data latch circuit 902.

Level converting circuit 910 includes a level converting circuit 906 for generating a signal at the level of external power supply voltage Vex onto internal read data line /RL3P in accordance with the signal on internal read data line RL5 and the output signal of inverter circuit 903, and a level converting circuit 912 for transmitting a signal at the level of external power supply voltage Vex onto internal read data line /RL3N in accordance with the signal on internal read data line /RL5 and an output signal of an inverter circuit 911 inverting the signal on internal read data line /RL5. Level converting circuit 906 provided for internal read data line RL5 and inverter circuit 903 has the same structure as level converting circuit 906 shown in FIG. 34, and the corresponding portions bear the same reference numerals.

Level converting circuit 912 has a P-channel MOS transistor T7 connected between the external power supply node and a node N3 and having a gate connected to internal read data line /RL3N, a P-channel MOS transistor T8 connected between the external power supply node and internal read data line /RL3N and having a gate connected to node N3, an N-channel MOS transistor T9 connected between node N3 and the ground node and having a gate connected to internal read data line /RL5, and an N-channel MOS transistor T10 connected between internal read data line /RL3N and the ground node and having a gate receiving the output signal of inverter circuit 911. Level converting circuit 912 transmits the signal at the level of external power supply voltage Vex onto internal read data line /RL3N when the signal on internal read data line /RL5 is at H-level.

Output enable signal ZOE becomes active before valid data is output after application of a read command as shown in FIG. 35B. Output enable signal ZOE is periodically driven to the active state of L-level while the burst length data are being outputted. Output enable signal ZOE is deactivated to attain H-level in each cycle, and internal read data lines RL5 and /RL5 are once precharged to L-level. Responsively, internal read data lines /RL3P and /RL3N are set to H-level and L-level (ground voltage level), respectively, and output buffer circuit 908 is set to the output high-impedance state.

In FIG. 35B, output enable signal ZOE is driven to the inactive state of H-level for a predetermined period in synchronization with rising of internal clock signal CLKi. However, output enable signal ZOE may be driven to H-level for a predetermined period before completion of each clock cycle as shown by dotted line in FIG. 35B.

By temporarily setting output buffer circuit 908 to the output high-impedance state, fast change in voltage on output node Q can be achieved in the data read operation.

As shown in FIGS. 34A and 35A, the output data control circuit performs the data output operation using internal clock signal CLKi as a trigger signal for reading. Therefore, data is transferred to data output node Q in synchronization with the clock signal, and fast data transfer is achieved.

Owing to the operation of lowering external power supply voltage Vex to produce internal power supply voltage Vint by internal power supply circuit VDC, the signal amplitude of an internal signal line can be reduced, and the charge/discharge current and therefore the current consumption can be reduced. In the case where the components are formed of MOS transistors, however, the operation speed changes in accordance with the gate voltage. In the case where internal power supply voltage Vint is utilized as the operation power supply voltage, therefore, the operation speed of the MOS transistor lowers, and the transmission speed of the internal signal lowers.

In the case where clock buffer CB produces internal clock signal CLKi from external clock signal CLKe as shown in FIG. 36, internal clock signal CLKi is transmitted from clock buffer CB to output data control circuit ODC with a delay time of td0. Accordingly, start of the operation of clocked gate 900 is delayed with respect to external clock signal CLKe. Further, internal clock signal CLKi has an amplitude of the internal power supply voltage level, and the operation speed of clocked gate 900 also lowers (the components of clocked gates 900 are MOS transistors), so that the output of the clocked gate likewise changes with a certain delay time of td1. This output signals of clocked gate 900 are applied to the output data latch. Output data latch circuit 902 likewise operates using internal power supply voltage Vint as one operation power supply voltage, and the operation speed thereof is slow. The output signal of output data latch circuit 902 likewise changes with a delay time of td2 with respect to the output of clocked gate 900. Particularly, if output data latch circuit 902 is supplied with output enable control signal ZOEM or output enable signal ZOE, these output control signals affect the delay time of the output signals of output data latch circuit 902 because these output control signals ZOEM and ZOE are signals each having an amplitude of the internal power supply voltage level.

An output signal of output data latch circuit 902 is converted into the signal at the level of external power supply voltage Vex by level converting circuit 906 or 910, for outputting. The level converting circuit produces a signal at the level of external power supply voltage Vex. The converted signal has a large logical amplitude as compared with an output signal of a usual logic gate, and therefore has a delay time longer than a signal of an amplitude of the internal power supply voltage level. Accordingly, the delay time in level converting circuit 906 is longer than the delay time in other logic circuit, and the output signal of level converting circuit 906 is made definite after a delay time of td3. Output buffer circuit 908 drives output node Q in accordance with the output signal of level converting circuit 906 or 910, and an innegligible gate delay time td4 is likewise present in output buffer 908. Accordingly, valid data is applied to node Q with a delay of a time (td0+td1+td2+td3+td4) with respect to external clock signal CLKe.

Meanwhile, in a fast semiconductor memory device, it is important to reduce an access time tAC after a trigger signal for externally outputting read data is externally applied and before the read data is actually and externally outputted. In a signal waveform diagram of FIG. 36, an external device samples the output data of this semiconductor memory device in synchronization with a rising edge of external clock signal CLKe. Relative to this rising of external clock signal CLKe, read data Q is required to have a setup time tsu. For stable data sampling, it is preferable to maximize the setup time tsu. Accordingly, clock access time tAC must be minimized for increasing the setup time tsu. This is particularly required when external clock signal CLKe is fast and has a shortened period.

In many cases, output power supply voltage VDDQ applied to the output buffer is at a voltage level equal to or slightly lower than external power supply voltage Vex, but is higher than internal power supply voltage Vint. As described above, the voltage higher than the internal power supply voltage is employed as output power supply voltage VDDQ to be applied to the output buffer. This is because a load present on the data output node must be driven fast, and because a data signal of an amplitude corresponding to the power supply voltage of an external device must be transferred (external power supply voltage Vex is the system power supply voltage).

If external clock signal CLKe is made faster, its period T becomes short. In shortening the period T of external clock signal CLKe, the clock speed can be increased only to a restricted extent due to clock access time tAC so that the semiconductor memory device cannot be applied to a system operating in accordance with a fast clock.

In the case where many circuits related to clock access time tAC operate using internal power supply voltage Vint as the operation power supply voltage, such operations are required, during a period in which the semiconductor memory device receives the external clock signal and outputs data via the output buffer, that data signals and control signals are transferred via circuits using internal power supply voltage Vint as the operation power supply voltage and then the data signals are converted in voltage level to external power supply voltage Vex level or the output power supply voltage VDDQ level and then the data is outputted via the output buffer. In any of the circuits, the signal propagation time is long, and therefore clock access time tAC becomes long, so that it is impossible to implement a semiconductor memory device capable of fast data output.

In the case where the level conversion is performed within an output data control circuit, a difference in propagation time between complementary data signals and therefore error data may outputted if only one of the complementary data signals is subject to level conversion. In the structure shown in FIG. 35A, the numbers of gates for level conversion of the complementary data signals are different from each other, resulting in a similar problem.

This semiconductor memory device is merely required to perform data output in synchronization with the clock signal, and the same or similar problem occurs in any one of a SDRAM (Synchronous Dynamic Random Access Memory), a synchronous SRAM (Static Random Access Memory) and serial EEPROM (Electrically Erasable and Programmable Nonvolatile Semiconductor Memory Device).

In addition, the semiconductor device such as a processor operates in synchronization with a clock signal, and outputs/inputs data and signals in synchronization with the clock signal, and may be suffered from the similar problem.

SUMMARY OF THE INVENTION

An object of the invention is to provide a synchronous semiconductor device allowing reduction in clock access time.

Another object of the invention is to provide a synchronous semiconductor memory device allowing a clock access time to be reduced without impairing reliability of an output data control circuit.

Still another object of the invention is to provide a synchronous semiconductor memory device capable of stably outputting data in synchronization with a fast clock signal.

According to the invention, a clock synchronous semiconductor memory device includes an internal power supply circuit for producing an internal power supply voltage at a level equal to or lower than a level of an external power supply voltage from the external power supply voltage; a memory cell array having a plurality of memory cells; an internal circuit receiving the internal power supply voltage from the internal power supply circuit as one operation power supply voltage, for selecting an addressed memory cell in said memory cell array and reading, in the form of the complementary data signal pair, data from the selected memory cell; an amplitude expanding circuit receiving the memory cell data read by the internal circuit, for expanding an amplitude of each of the complementary data signals to produce internal read data at the level of the external power supply voltage; a transfer circuit receiving a voltage at a level equal to or higher than the internal power supply voltage as one operation power supply voltage, for transferring the internal read data from the amplitude expanding circuit in synchronization with an output clock signal; an output data latch circuit receiving a voltage equal to or higher than the internal power supply voltage as one operation power supply voltage, for latching the output data of the transfer circuit; and an output buffer receiving an output power supply voltage supplied independently of the external power supply voltage as its operation power supply voltage for operation, for buffering the latch data of the output data latch circuit to output external read data onto an output node.

The complementary data signals, which are read from the memory cell array and are at the level of a maximum internal power supply voltage, are applied to the transfer circuit after both the signals are converted into the signals of the amplitude of the external power supply voltage level by the amplitude expanding circuit. The transfer circuit performs the transfer operation in synchronization with the output clock signal, and circuits subsequent to the transfer circuit operate using, as the operation power supply voltage, the voltage at the level different from the internal power supply voltage. In these subsequent circuits, the level conversion of the data signals is not required, and fast data transfer is achieved so that a clock access time can be reduced. Further, propagation delays of the complementary data signals can be equal to each other.

By employing the output clock signal at the level of the external power supply voltage, the output clock signal can be transmitted fast to the data transfer circuit, and the transfer circuit can operate fast to achieve the fast data transfer. In particular, a circuit receiving the internal power supply voltage as the operation power supply voltage is not present in the circuits on a path related to the above described transfer and output of the output data. Therefore, fast clock synchronous transfer can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
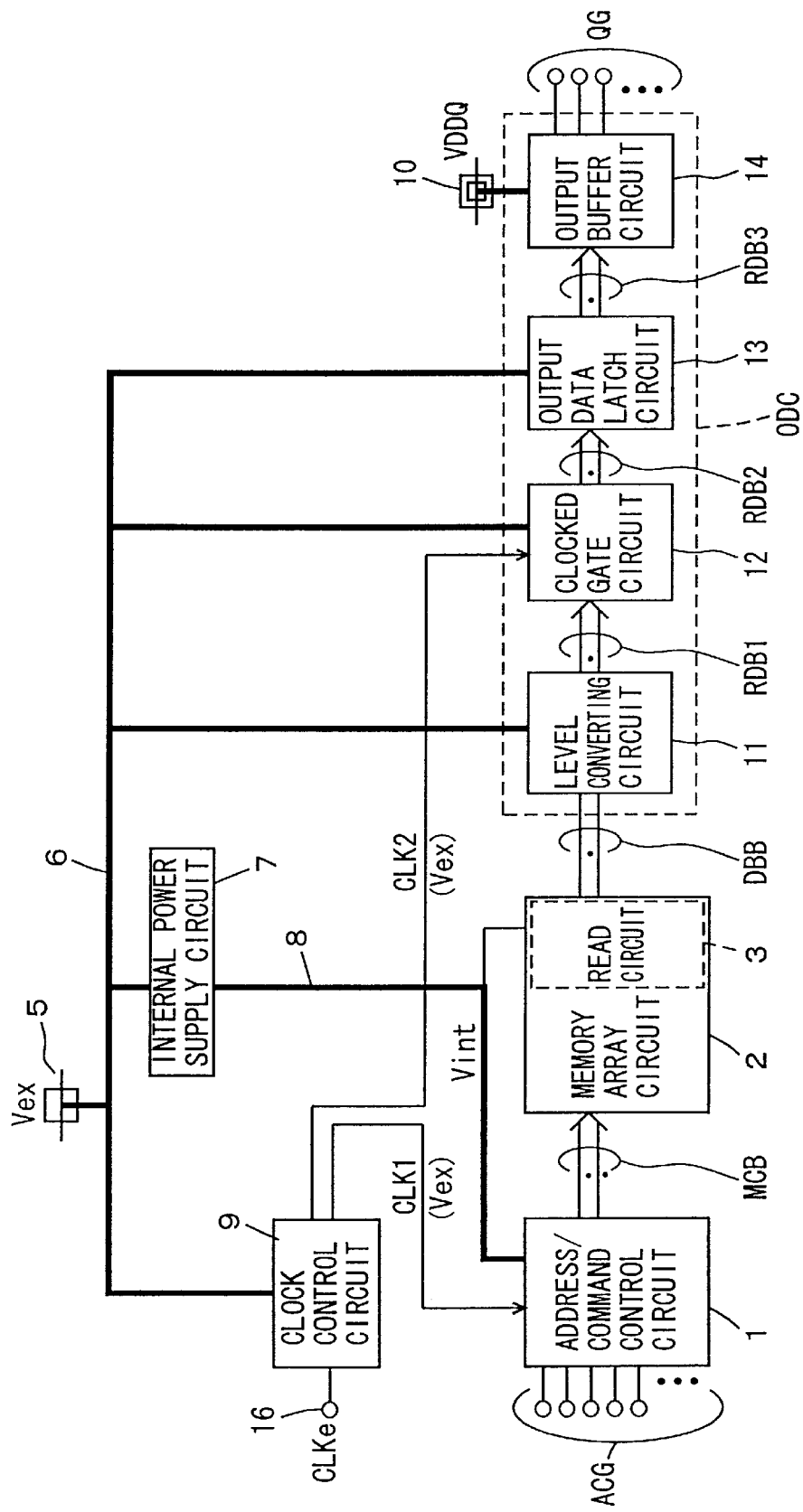
FIG. 1 schematically shows a whole structure of a clock synchronous semiconductor memory device according to a first embodiment of the invention.

FIG. 1 schematically shows a whole structure of a clock synchronous semiconductor memory device according to a first embodiment of the invention. In FIG. 1, a clock synchronous semiconductor memory device includes an internal power supply circuit 7 receiving external power supply voltage Vex applied to an external power supply node 5 via an external power supply line 6, for producing internal power supply voltage Vint on an internal power supply line 8, a clock control circuit 9 receiving external power supply voltage Vex on external power supply line 6 as an operation power supply voltage, for producing internal clock signals CLK1 and CLK2 of an amplitude of external power supply voltage Vex from external clock signal CLKe applied to a clock input node 16, an address/command control circuit 1 operating in synchronization with internal clock signal CLK1 from clock control circuit 9, for producing memory array control signals on a memory control signal line group MCB in accordance with an address and a command applied to an address/command input node group AGG including an address input node and a command input node, and a memory array circuit 2 including memory cells arranged in rows and columns, for performing selection of a memory cell and reading of data from the selected memory cell in accordance with the memory array control signals received from address/command control circuit 1. Memory array circuit 2 includes a read circuit 3 for reading data from the selected memory cell in the memory array within memory array circuit 2 in accordance with the memory array control signals on memory array control signal line group MCB.

Address/command control circuit 1 and read circuit 3 are supplied with internal power supply voltage Vint from internal power supply circuit 7.

Clock control circuit 9 is supplied with one clock signal CLKe via a clock input node 16, but may be supplied with a plurality of (complementary) control clock signals for producing internal clock signals CLK1 and CLK2 in accordance with the received complementary clock signals. Internal clock signals CLK1 and CLK2 may be a common clock signal.

Internal power supply voltage Vint supplied from internal power supply circuit 7 is at a level equal to or lower than external power supply voltage Vex. If internal power supply voltage Vint is equal in level to external power supply voltage Vex, internal power supply circuit 7 is formed of a usual power supply interconnection line. If internal power supply voltage Vint is lower than external power supply voltage Vex, internal power supply circuit 7 is formed of an internal voltage down converting circuit (VDC) including a comparator and a current drive transistor.

A sense amplifier circuit for sensing and amplifying data of a memory cell in the memory array and others included in memory array circuit 2 may be supplied with an internal power supply voltage (array power supply voltage) from another internal power supply circuit.

Memory array control signals generated from address/command control circuit 1 includes a row address signal, a column address signal, a word line activating signal, row/column decoder activating signals, a read circuit activating signal. Read circuit 3 receives internal power supply voltage Vint supplied from internal power supply circuit 7 as one operation power supply voltage, and an internal read data applied from read circuit 3 onto internal data bus DBB has an amplitude of the level equal to internal power supply voltage Vint.

Clock synchronous semiconductor memory device further includes an output control circuit ODC for transferring the data read onto internal data bus DBB in synchronization with output clock signal CLK2 for output to a data output node group QG.

Output data control circuit ODC includes a level converting circuit 11 receiving external power supply voltage Vex on external power supply line 6 as one operation power supply voltage, for converting memory cell data (complementary data signals) read onto internal data bus DBB into signals of an amplitude of the level of external power supply voltage Vex, a clocked gate circuit 12 receiving external power supply voltage Vex on external power supply line 6 as one operation power supply voltage, for transferring the data received from level converting circuit 11 onto a read data bus RDB1 in synchronization with output clock signal CLK2, an output data latch circuit 13 receiving external power supply voltage Vex on external power supply line 6 as one operation power supply voltage, for latching the data transferred from clocked gate circuit 12 on read data bus RDB2, and an output buffer circuit 14 for driving data output node group QG in accordance with the latched data of output data latch circuit 13. Output buffer circuit 14 receives output power supply voltage VDDQ applied to power supply node 10 as one operation power supply voltage.

Clocked gate circuit 12 is turned on when output clock signal CLK2 is active (H-level), to transfer the data applied from level converting circuit 11 onto read data bus RDB1. Clocked gate circuit 12 is turned off when output clock signal CLK2 is inactive (L-level), to isolate read data buses RDB1 and RDB2 from each other.

Output data latch circuit 13 latches the data applied onto read data bus RDB2 when clocked gate circuit 12 is off. Output data latch circuit 13, of which internal structure will be described later in greater detail, may have a structure of a so-called half latch, and read data buses RDB2 and RDB3 may be a common read data bus. In this case, clocked gate circuit 12 transfers the complementary data signals.

Figure 33:
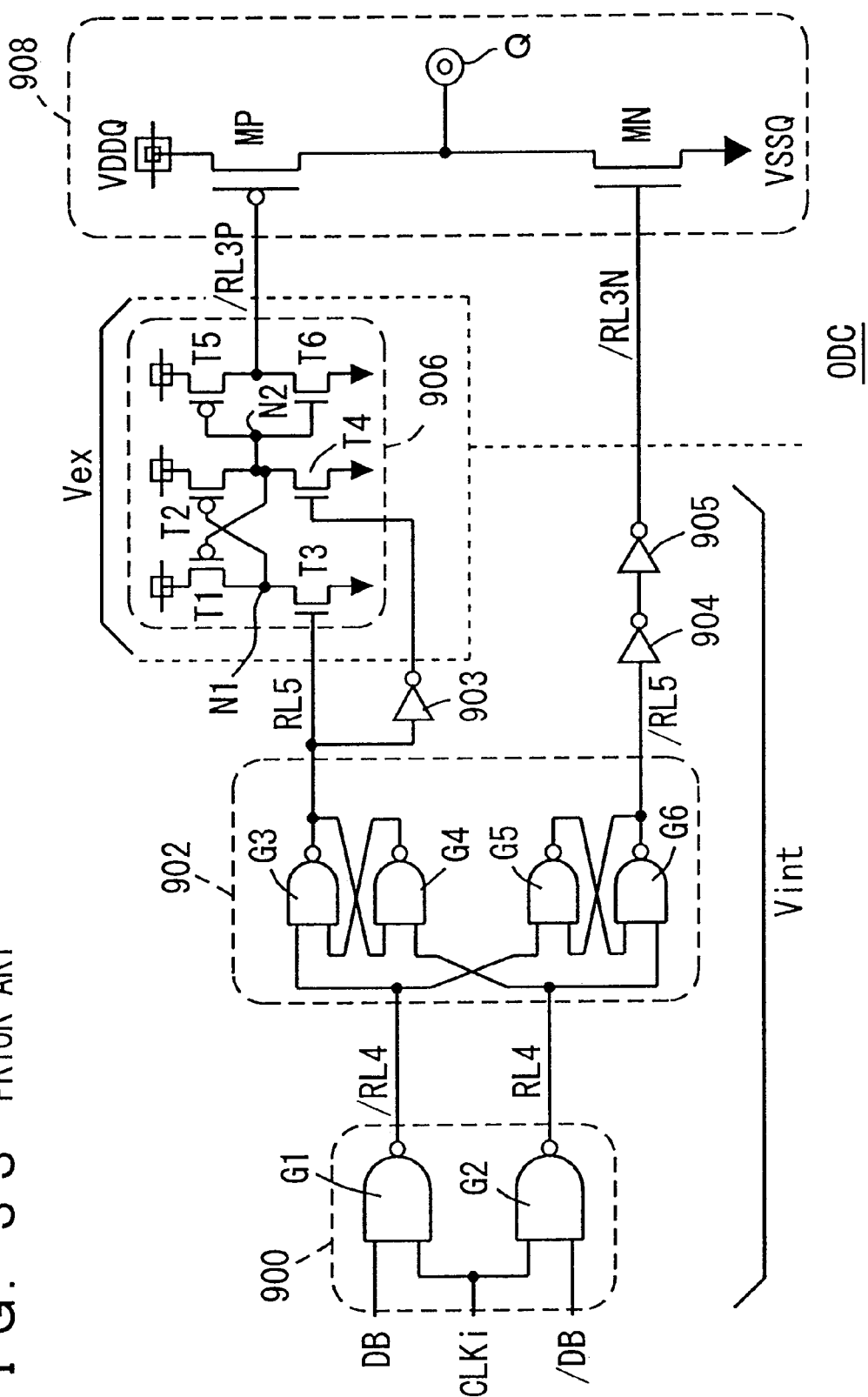
FIG. 33 shows by way of example a structure of an output data control circuit shown in FIG. 31.
Figure 34A:
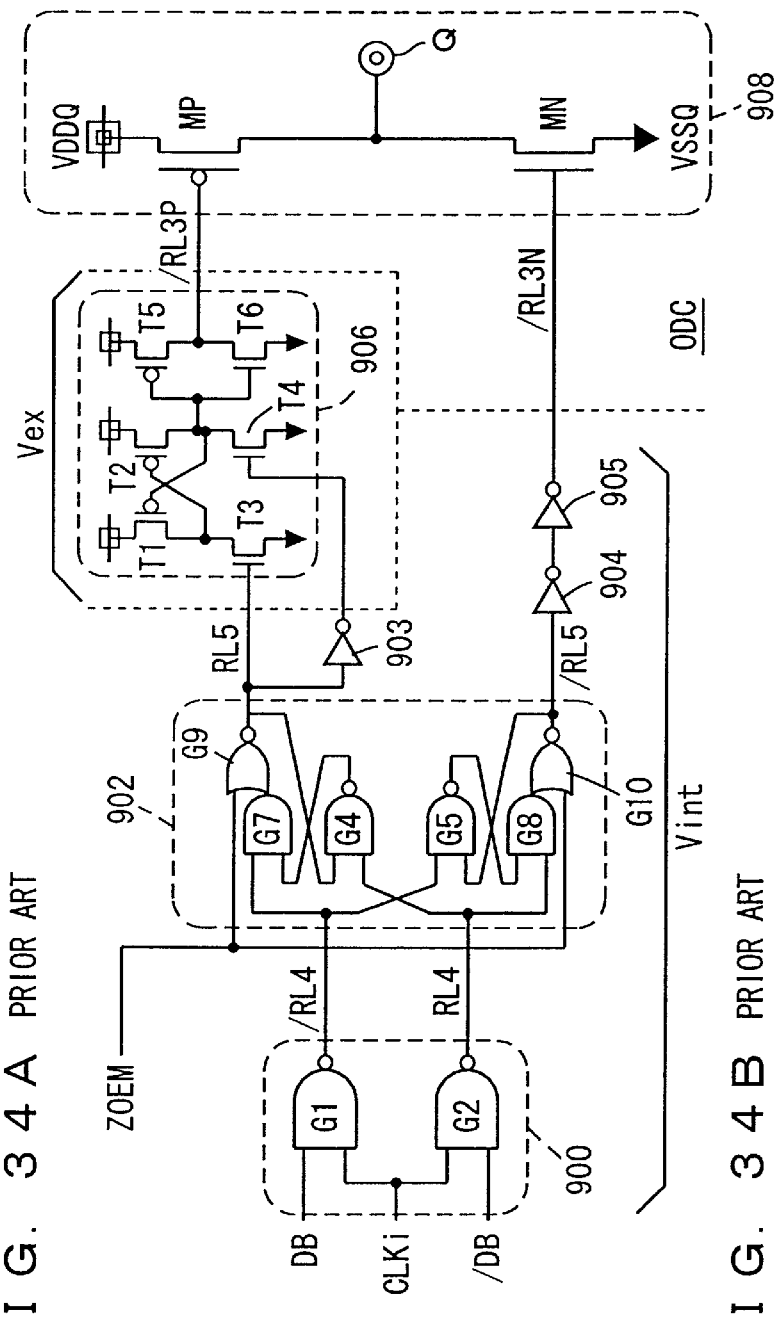
FIG. 34A shows another example of the structure of the output data control circuit shown in FIG. 32.
Figure 34B:
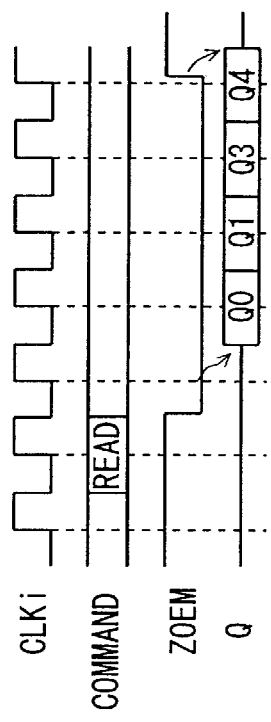
FIG. 34B is a timing chart representing an operation of the output data control circuit shown in FIG. 34A.
Figure 35A:
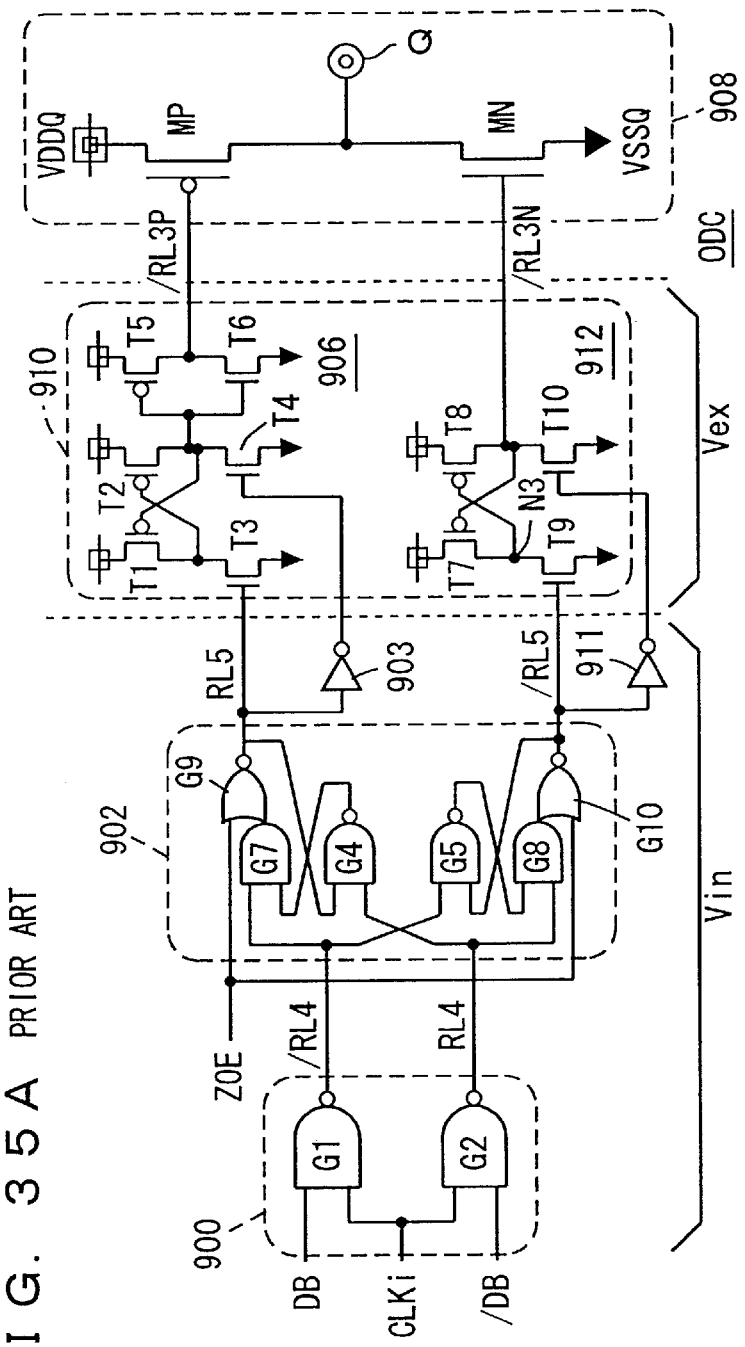
FIG. 35A shows still another example of the structure of the output data control circuit shown in FIG. 31.
Figure 35B:
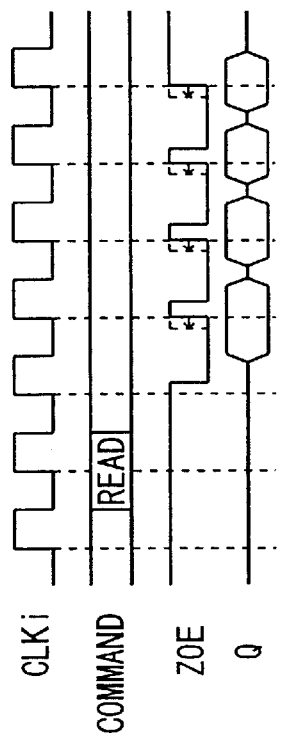
FIG. 35B is a timing chart representing an operation of the output data control circuit shown in FIG. 35A.
Figure 36:
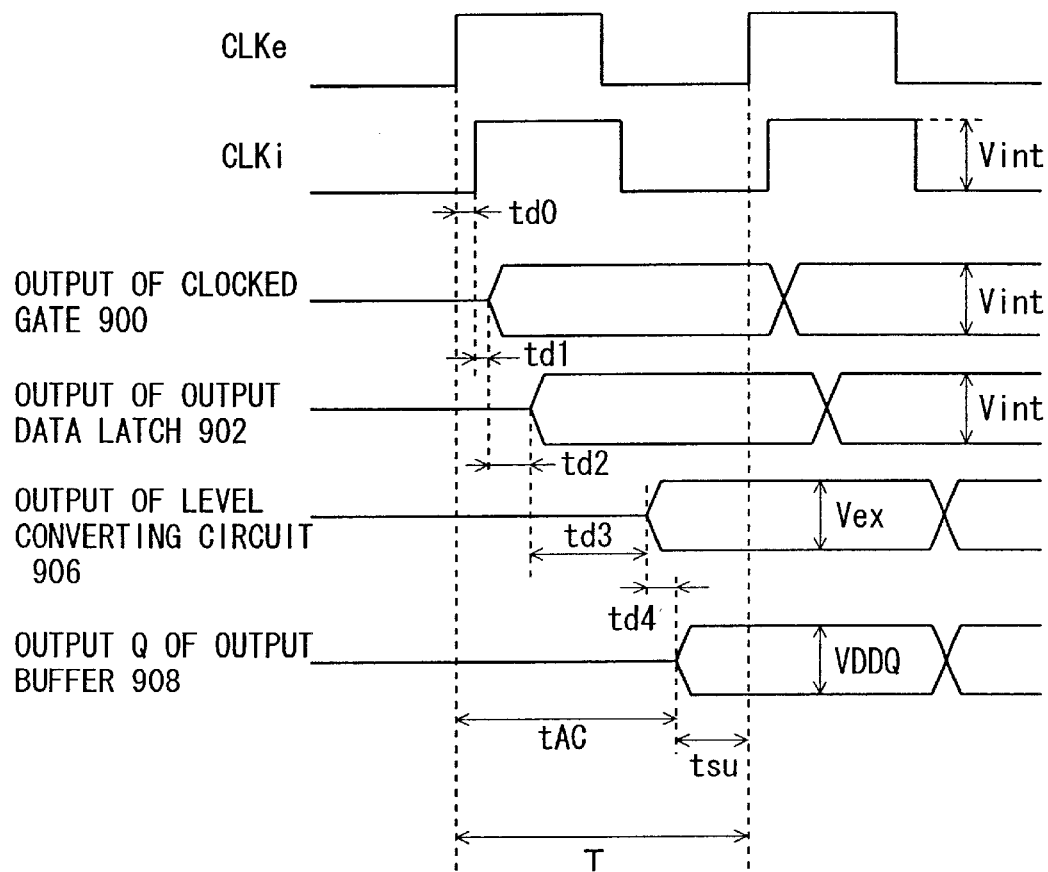
FIG. 36 is a signal waveform diagram representing an operation during data reading of the clock synchronous semiconductor memory device shown in FIG. 31.

Level converting circuit 11, clocked gate circuit 12, output data latch circuit 13 and output buffer circuit 14 may have the same structures as those in the output data control circuit shown in FIGS. 33, 34A and 35A.

Figure 2:
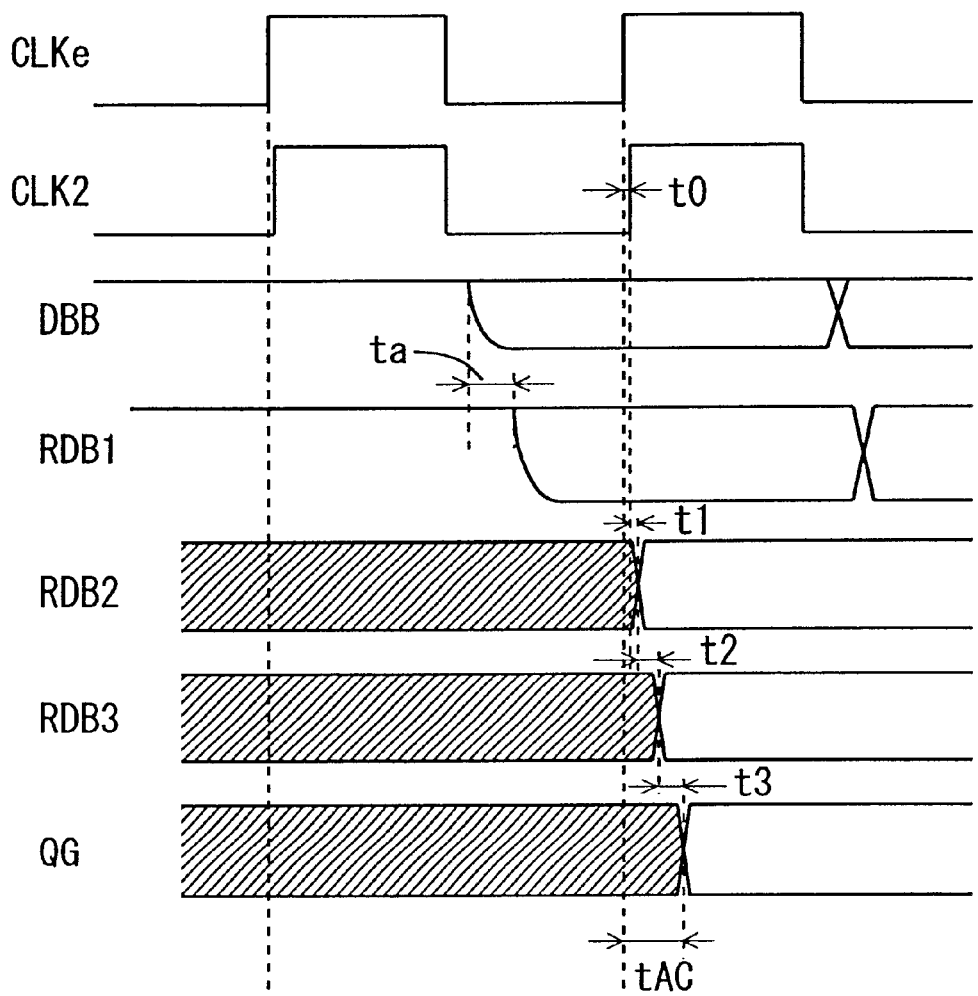
FIG. 2 is a signal waveform diagram representing an operation of an output data control circuit shown in FIG. 1.

In the structure shown in FIG. 1, clocked gate circuit 12 transfers the level-converted data signals, and output data latch circuit 13 latches this level-converted data signal. Accordingly, a level converting circuit is not present between clocked gate circuit 12 and output buffer circuit 14. Now, a data read operation of the clock synchronous semiconductor memory device shown in FIG. 1 will be described with reference to a timing chart diagram of FIG. 2.

Clock control circuit 9 produces output clock signal CLK2 at the level of external power supply voltage Vex in accordance with external clock signal CLKe. Output clock signal CLK2 has a delay time t0 with respect to external clock signal CLKe. Address/command control circuit 1 generates memory array control signals onto memory control signal line group MCB in accordance with the addresses and commands applied to address/command input node group ACG. In accordance with the signals on memory control signal line group MCB, memory array circuit 2 operates, and the data of a selected memory cell in the form of complementary data signals is read onto internal data bus DBB via read circuit 3.

Address/command control circuit 1 and memory array circuit 2 operate in accordance with internal power supply voltage Vint, and the complementary data signals having an amplitude at the level of internal power supply voltage Vint are applied onto internal data bus DBB. At this point of time, output clock signal CLK2 is in the inactive state of L-level, and clocked gate circuit 12 is off. Level converting circuit 11 converts the levels of complementary data signals on internal data bus DBB, and produces signals at the level of external power supply voltage Vex. Accordingly, even if a delay time ta is caused in level converting circuit 11, this delay time ta exerts no influence on data output because clocked gate circuit 12 is off (output clock signal CLK2 is in the inactive state at L-level).

After the output signal of level converting circuit 11 is made definite, output clock signal CLK2 becomes active (H-level) so that clocked gate circuit 12 is turned on to transmit onto read data bus RDB2 the complementary data signals of an amplitude at the level of the external power supply voltage on read data bus RDB1. The clocked gate circuit 12 receives external power supply voltage Vex as one operation power supply voltage, and therefore operates fast. Output clock signal CLK2 from clock control circuit 9 has an amplitude of the level of the external power supply voltage, and clocked gate circuit 12 performs the gate operation at high speed. Output clock signal CLK2 has the amplitude of the level of external power supply voltage Vex, and clock control circuit 9 uses external power supply voltage Vex as its operation power supply voltage so that output clock signal CLK2 synchronized with external clock signal CLKe can be produced at high speed. Accordingly, clocked gate circuit 12 transmits the read data onto read data bus RDB2 with delay time t1.

Output data latch circuit 13 has already latched the applied data, and has a gate delay of t2 depending on the structure of its latching circuit. Therefore, the data is transmitted onto internal read data bus RDB3 after elapsing of delay time t2. Output buffer 14 operates in accordance with output power supply voltage VDDQ, and transmits the read data (signals having an amplitude of the level of output power supply voltage VDDQ) onto data output node group QG in accordance with the signals on read data bus RDB3. This output buffer circuit 14 has a delay time of t3. Accordingly, the delay time ta required for level conversion is "hidden" by clocked gate circuit 12, and clock access time tAC is equal to a time of (t0+t1+t2+t3).

Thus, the clock access time tAC of this semiconductor memory device is determined by the transmission time of the signal transferred via a path extending from clock input node 16 to data output node group QG through clock control circuit 9, a transfer line of output clock signal CLK2, clocked gate circuit 12, read data bus RDB2, output data latch circuit 13, read data bus RDB3 and output buffer circuit 14. This path transmits signals all having the amplitude of the level of external power supply voltage Vex (output buffer circuit 14 operates with output power supply voltage VDDQ), and level converting circuit 11 does not affect this clock access time tAC. Accordingly, clock access time can be sufficiently reduced even if this level converting circuit requires a long time for level conversion. Both paired complementary data signals are level-converted and then transmitted so that these signals can be transmitted with the same transmission characteristics.

Figure 3:
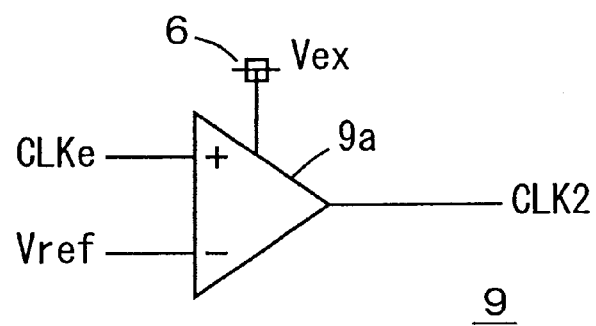
FIG. 3 shows by way of example a structure of a clock control circuit shown in FIG. 1.

FIG. 3 shows an example of a structure of a circuit producing output clock signal CLK2 in clock control circuit 9. In FIG. 3, clock control circuit 9 includes a differential amplifier circuit 9a, operating using external power supply voltage Vex on external power supply line 6 as one operation power supply voltage, for producing output clock signal CLK2 by differentially amplifying external clock signal CLKe and a reference voltage Vref. When external clock signal CLKe is at the voltage level higher than reference voltage Vref, output clock signal CLK2 is at the level of external power supply voltage Vex. When external clock signal CLKe is at the level lower than reference voltage Vref, clock signal CLK2 is at the ground potential level of L-level. Thereby, output clock signal CLK2 synchronized with fast external clock signal CLKe can be produced at high speed without performing any level conversion.

In the structure of clock control circuit 9 shown in FIG. 3, output clock signal CLK2 may be produced by applying complementary clock signals CLKe and /CLKe to differential amplifier circuit 9a for differentially amplifying the same.

In the case where external clock signal CLKe has the amplitude of the level of external power supply voltage Vex, clock control circuit 9 may be simply formed of a buffer circuit buffering external clock signal CLKe.

Output power supply voltage VDDQ is at a voltage level equal to or slightly lower than the level of external power supply voltage Vex.

According to the first embodiment of the invention, as described above, the complementary data signals at the level of the internal power supply voltage and read from the memory cell array converted to the signals of external power supply voltage Vex level in a portion preceding the clocked gate and then transferred in accordance with the output clock signal at the level of external power supply voltage, and further the circuits on the data transfer path are driven by the external power supply voltage Vex. Therefore, the time required for level conversion exerts no adverse affect on the clock access time. Further, each circuit operates using a voltage at the level of the external power supply voltage. Accordingly, the complementary signals can be transferred fast, and the clock access time can be reduced.

[Second Embodiment]

Figure 4:
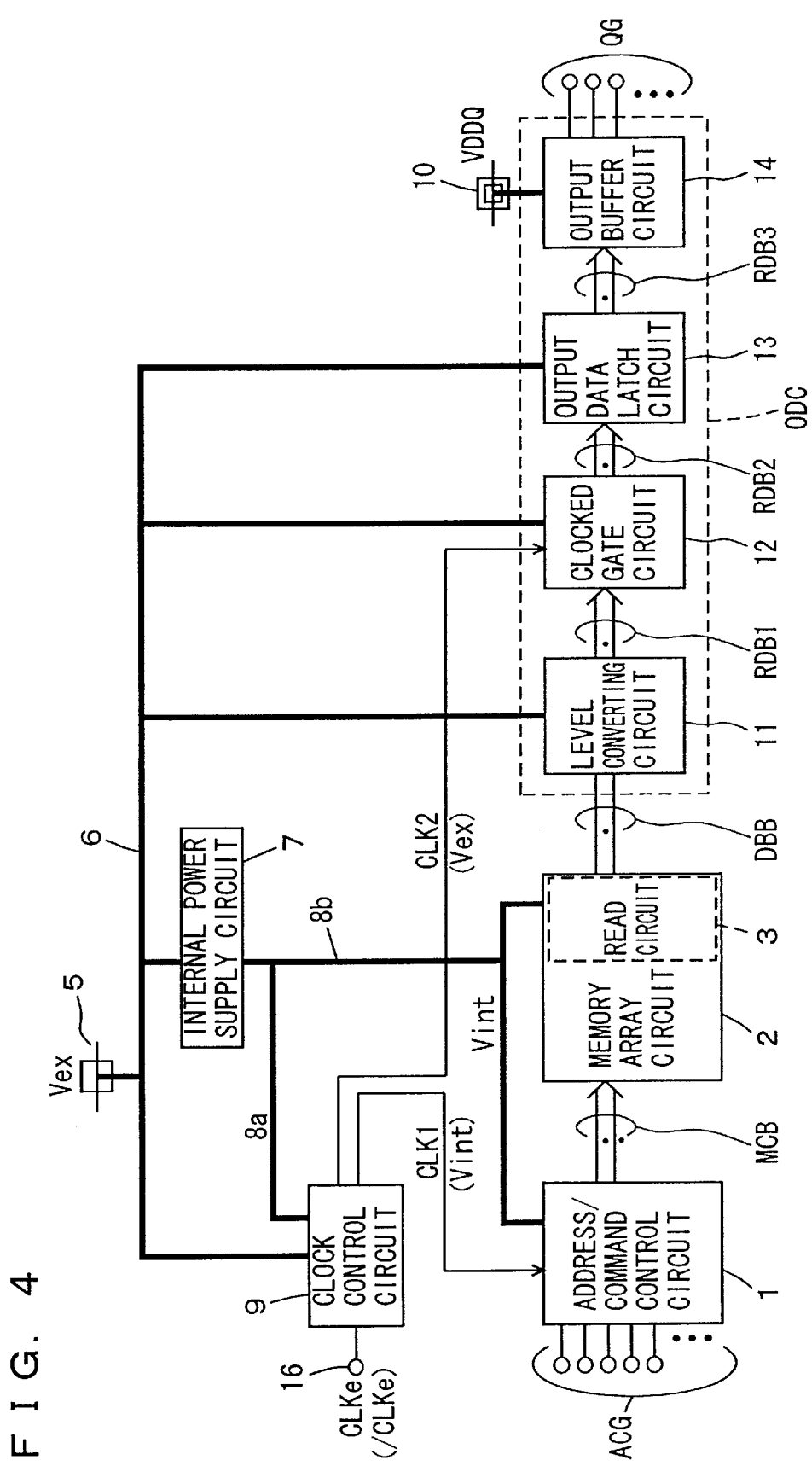
FIG. 4 schematically shows a whole structure of clock synchronous semiconductor memory device according to a second embodiment of the invention.

FIG. 4 schematically shows a whole structure of a clock synchronous semiconductor memory device according to a second embodiment of the invention. The clock synchronous semiconductor memory device shown in FIG. 4 differs from the clock synchronous semiconductor memory device shown in FIG. 1 in the following points. Clock control circuit 9 receives external power supply voltage Vex on external power supply line 6 and internal power supply voltage Vint applied from internal power supply circuit 7 via an internal power supply line 8a, and produces an output clock signal CLK2 having an amplitude of the level of external power supply voltage and an internal clock signal CLK1 having an amplitude of the level of internal power supply voltage Vint. Structures other than the above are the same as those shown in FIG. 1. The corresponding portions bear the same reference numerals, and the description thereof is not repeated.

Internal power supply voltage Vint from internal power supply circuit 7 is applied via an internal power supply line 8b to read circuit 3 included in memory array circuit 2 and address/command control circuit 1. In synchronization with clock signal CLK1 at the level of internal power supply voltage Vint, address/command control circuit 1 takes in applied signals and produces the internal control signals and the internal address signals. Address/command control circuit 1 operates using internal power supply voltage Vint as one operation power supply voltage. Accordingly, even if the clock signal has an amplitude at the level of internal power supply voltage Vint, no problem arises.

On the data output path, operations are performed in accordance with the signals with amplitudes of the level of external power supply voltage Vex, as is done in the first embodiment. Read circuit 3 in memory array circuit 2 transfers the complementary data signals at the level of internal power supply voltage Vint onto internal data bus DBB. If the signal applied from level converting circuit 11 onto read data bus RDB1 is already made definite before clocked gate circuit 12 is turned on, no adverse effect is exerted on the access time. Accordingly, clock access time tAC can likewise be reduced in the structure shown in FIG. 4.

Figure 5:
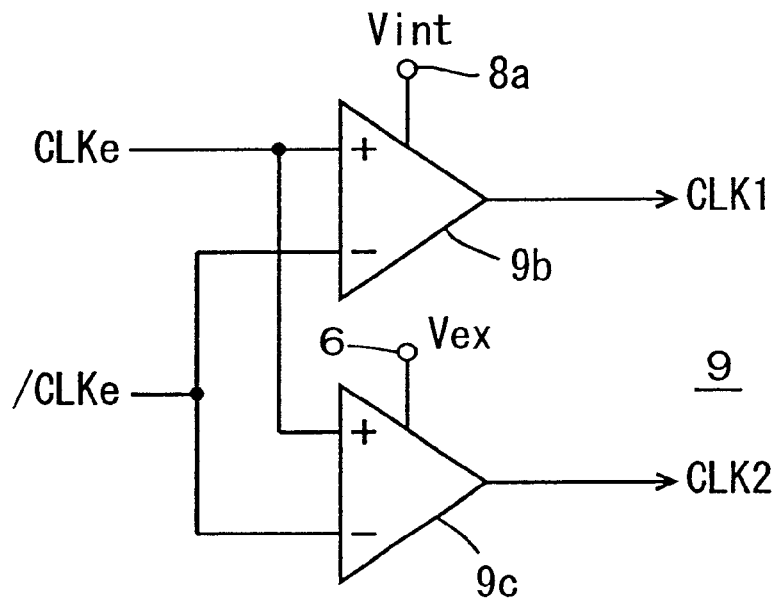
FIG. 5 shows by way of example a structure of a clock control circuit shown in FIG. 4.

FIG. 5 shows an example of a structure of clock control circuit 9. Clock control circuit 9 shown in FIG. 5 is externally supplied with complementary clock signals CLKe and /CLKe. In FIG. 5, clock control circuit 9 includes a differential amplifier circuit 9b using internal power supply voltage Vint on internal power supply line 8a as one operation power supply voltage, for differentially amplifying clock signals CLKe and /CLKe to produce internal clock signal CLK1, and a differential amplifier circuit 9c using external power supply voltage Vex on external power supply line 6 as one operation power supply voltage, for differentially amplifying clock signals CLKe and /CLKe to produce output clock signal CLK2.

Differential amplifier circuits 9b and 9c produce internal clock signals CLK1 and CLK2 using a crossing point between complementary clock signals CLKe and /CLKe as a trigger, respectively. Differential amplifier circuit 9b uses internal power supply voltage Vint as its operation power supply voltage, and therefore internal clock signal CLK1 has an amplitude of the level of internal power supply voltage Vint. Differential amplifier circuit 9c uses external power supply voltage Vex as one operation power supply voltage, and therefore output clock signal CLK2 has an amplitude of the level of external power supply voltage Vex.

In the structure shown in FIG. 5, a reference voltage at the voltage level equal to half the amplitude of external clock signal CLKe may be used instead of complementary clock signal /CLKe.

Figure 6:
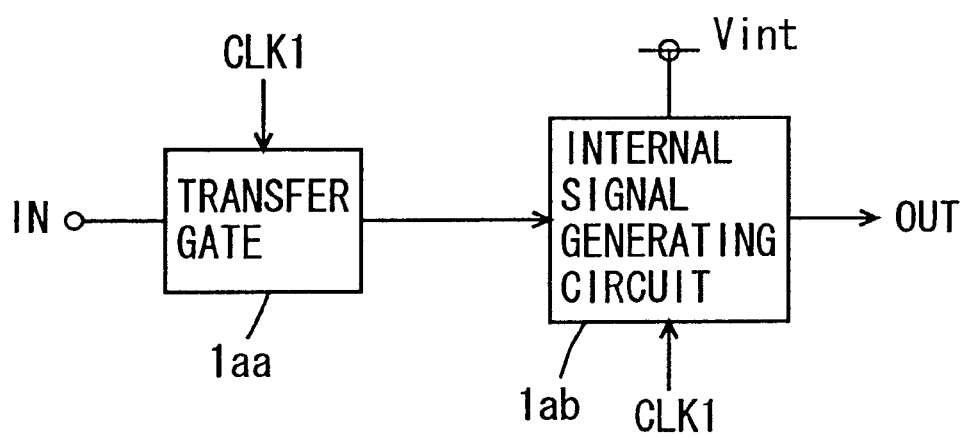
FIG. 6 schematically shows a structure of a signal input portion of an address/command control circuit shown in FIG. 4.

FIG. 6 shows an example of a structure of address/command control circuit 1. In FIG. 6, address/command control circuit 1 includes a transfer gate 1aa for taking in an input signal IN in accordance with clock signal CLK1, and an internal signal generating circuit 1ab for producing an internal signal in accordance with a signal applied from transfer gate 1aa. Transfer gate 1aa is formed of a CMOS transmission gate or MOS transistors, and passes input signal IN therethrough in accordance with clock signal CLK1. Therefore, the amplitude of output signal of transfer gate 1aa is determined by clock signal CLK1, and the output signal of transfer gate laa is at the level of the internal power supply voltage.

Internal signal generating circuit lab uses internal power supply voltage Vint as one operation power supply voltage, and produces the internal signal in accordance with clock signal CLK1. Therefore, even in the case where internal signal generating circuit 1ab has a circuit receiving clock signal CLK1 and the signal applied from transfer gate 1aa, these signals are both at the level of the internal power supply voltage level, and internal signal OUT can be produced without any problem. Internal signal generating circuit lab may be an address buffer, a command decode circuit, or a circuit for producing the internal control signals in accordance with an output signal of command decode circuit.

By employing internal clock signal CLK1 at the level equal to internal power supply voltage Vint, the amplitude of internal clock signal CLK1 can be small, and the charge/discharge current of the transmission path of internal clock signal CLK1 can be reduced so that the power consumption can be reduced. Further, effects similar to those of the first embodiment can be achieved.

[Third Embodiment]

Figure 7:
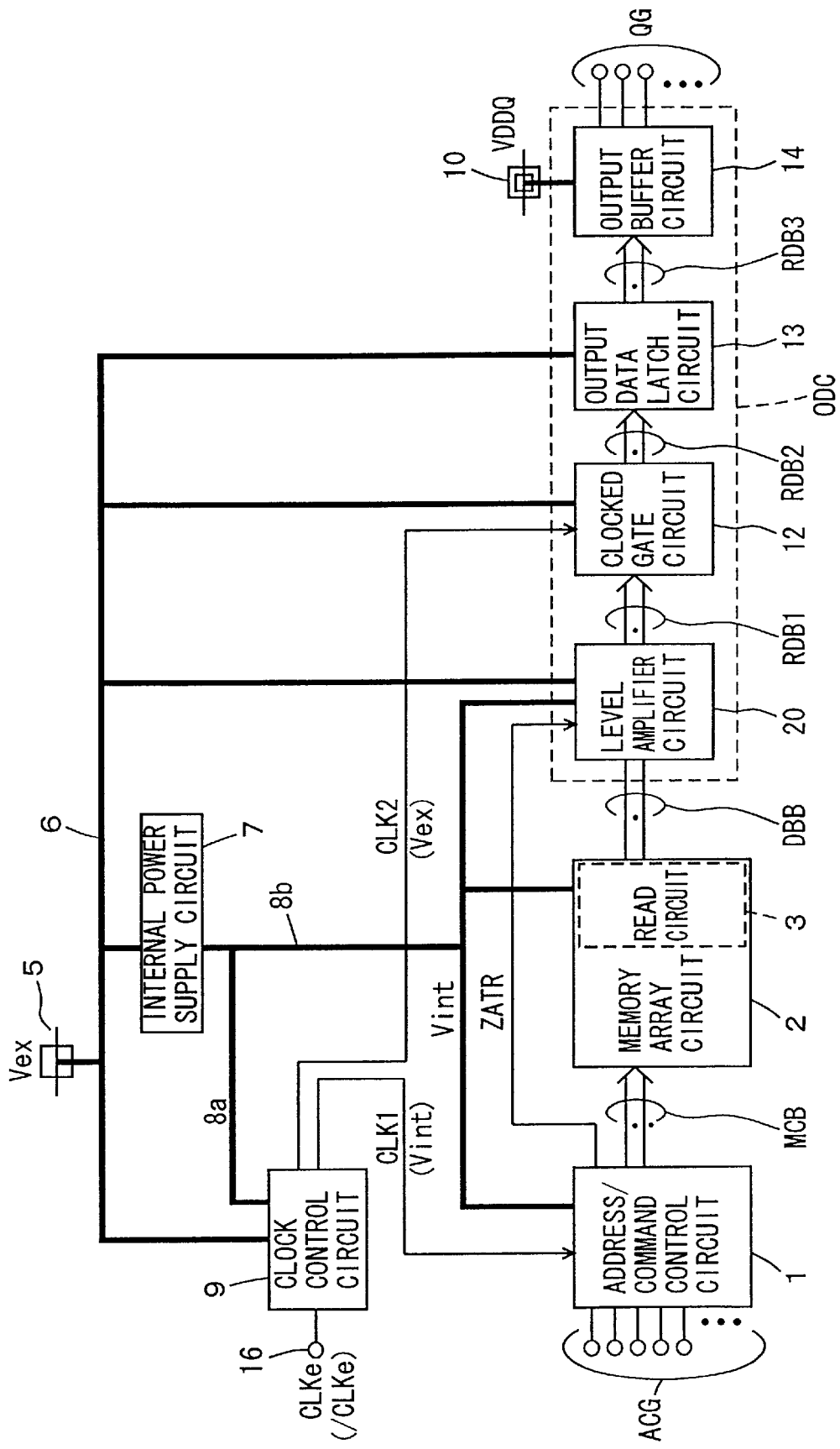
FIG. 7 schematically shows a whole structure of a clock synchronous semiconductor memory device according to a third embodiment of the invention.

FIG. 7 schematically shows a whole structure of a clock synchronous semiconductor memory device according to a third embodiment of the invention. In the clock synchronous semiconductor memory device shown in FIG. 7, output data control circuit ODC includes a level amplifier circuit 20 receiving the data signal on internal data bus DBB. This level amplifier circuit 20 receives external power supply voltage Vex on external power supply line 6 as its operation power supply voltage, and (differentially) amplifies the complementary data signals at the level of internal power supply voltage on internal data bus DBB for transmission onto read data bus RDB 1. Level amplifier circuit 20 is activated to perform the amplification when a level amplification trigger signal ZATR from address/command control circuit 1 is activated. Internal power supply voltage Vint on internal power supply line 8 is supplied to level amplifier circuit 20 to be used to for producing the complementary trigger signal, which is required for the level amplification, of the level amplification trigger signal ZATR at the level of the internal power supply voltage.

Level amplification trigger signal ZATR is activated in accordance with the data reading for a burst length period during the data reading. In periods other than the period of data reading, the logical value of the output signal of level amplifier circuit 20 is set to a logical value for setting output buffer circuit 14 to the output high-impedance state. Thus, level amplifier circuit 20 outputs ternary data. Since level amplifier circuit 20 can generate ternary data, output buffer circuit 14 can be set to an output high-impedance state and data output terminal group QG can be utilized also as a data write terminal group. Clocked gate circuit 12 and output data latch circuit 13 perform charge/discharge in accordance with the output signal of level amplifier circuit 20 only in a necessary period, so that the current consumption can be reduced.

Level amplifier circuit 20 is a circuit for amplifying the amplitude of a signal applied onto internal data bus DBB. Therefore, even if the signal applied onto internal data bus DBB has a small amplitude, it can be reliably amplified to the signal at the level of external power supply voltage Vex. For example, a differential amplifier circuit using external power supply voltage Vex as the operation power supply voltage can be utilized as level amplifier circuit 20. An example of a specific structure of level amplifier circuit 20 will be described later in greater detail.

The internal read data applied from read circuit 3 may be a signal of a small amplitude, and it is not necessary to transmit a signal at the CMOS level onto internal data bus DBB so that the current consumption of read circuit 3 can be reduced. Further, owing to the small amplitude, the complementary signals can be transmitted fast via internal data bus DBB.

Structures of output data control circuit ODC other than the above are the same as those of the first embodiment, and therefore effects similar to those of the first embodiment can also be achieved.

In the case where level amplifier circuit 20 is utilized, memory cell data at the level not exceeding the internal power supply voltage is amplified to the level of external power supply voltage in a stage preceding clocked gate circuit 12, similarly to the foregoing cases. Therefore, a time required for the amplifying operation of level amplifier circuit 20 does not affect the clock access time. Accordingly, the clock access time is determined by clocked gate circuit 12, output data latch circuit 13 and output buffer circuit 14 as well as the delay time of internal output clock signal CLK2 from clock control circuit 9, and therefore the clock access time can be reduced.

Figure 8:
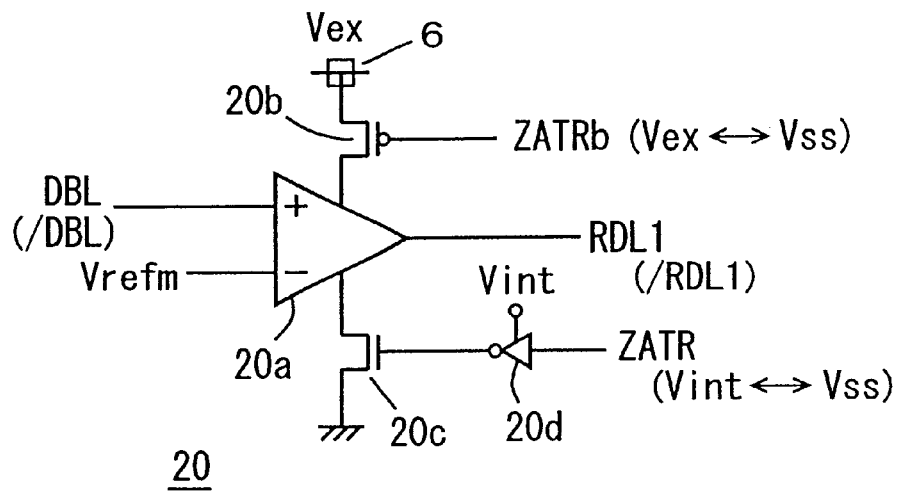
FIG. 8 shows by way of example a structure of a level amplifier circuit shown in FIG. 7.

FIG. 8 shows by way of example a structure of level amplifier circuit 20 shown in FIG. 7. More specifically, FIG. 8 shows a structure of the level amplifier circuit for internal data lines DBL and /DBL of one bit in internal data bus DBB.

In FIG. 8, level amplifier circuit 20 includes a differential amplifier circuit (comparator circuit) 20a for comparing, when activated, a signal on internal data line DBL (or /DBL) and a reference voltage Vrefm, to generate a signal representing the result of comparison onto an internal read data line RDL1 (or /RDL1), an activating P-channel MOS transistor 20b turned on to couple the internal power supply node of differential amplifier circuit 20a to external power supply line 6 when level amplification trigger signal ZATRb is active, and an activating N-channel MOS transistor 20c receiving level amplification trigger signal ZATR via an inverter circuit 20d on its gate and turned on to couple the internal ground node of differential amplifier circuit 20a to the ground node when the output signal of inverter circuit 20d is at H-level. Level amplification trigger signal ZATRb is converted into a signal having an amplitude of the level of external power supply voltage Vex by a level converting circuit (not shown). Level amplification trigger signal ZATR applied to inverter circuit 20d is generated from address/command control circuit 1, and has an amplitude of the level of internal power supply voltage Vint.

Figure 9:
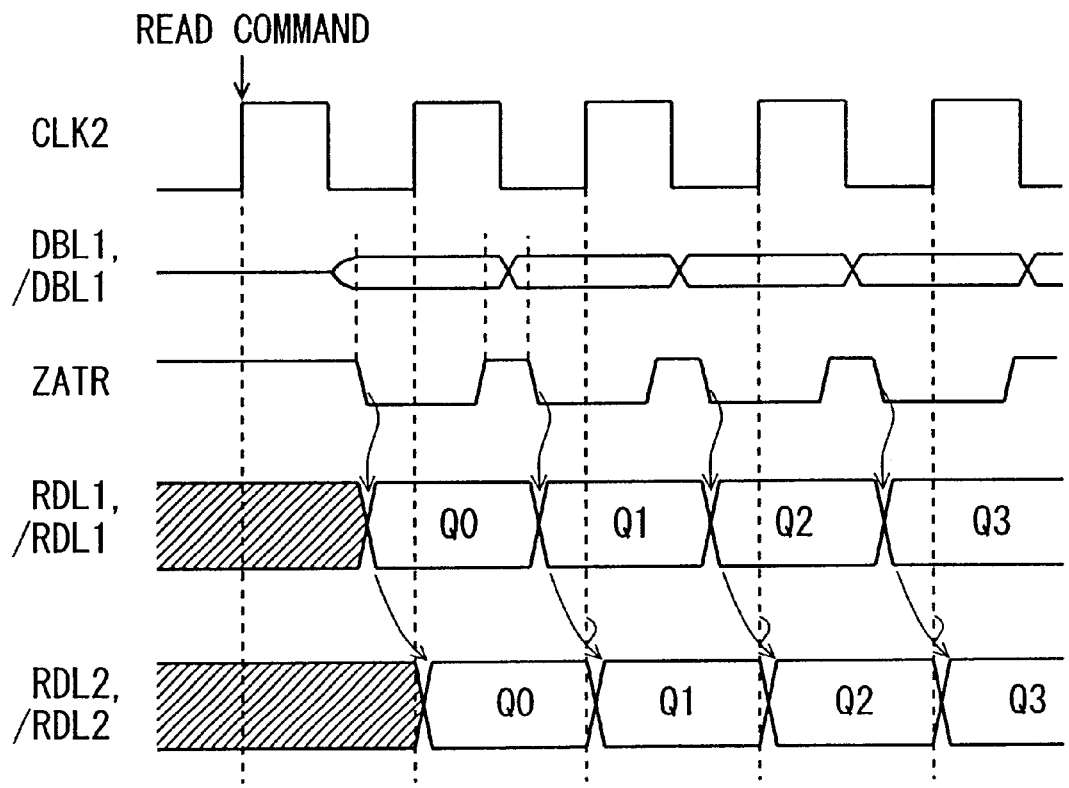
FIG. 9 is a signal waveform diagram representing an operation of the level amplifier circuit shown in FIG. 8.

Differential amplifier circuit 20a shown in FIG. 8 is provided for each of internal data lines DBL and /DBL. Operation of level amplifier circuit 20 shown in FIG. 8 will now be described with reference to a time chart of FIG. 9.

Upon application of a read command instructing data reading, memory selecting operation is performed in the memory array circuit, and read circuit 3 operates to transmit the memory cell data onto internal data lines DBL and IDBL. When the memory cell data is made definite, level amplification trigger signal ZATR is driven to the active state at L-level so that MOS transistors 20b and 20c for activation are turned on, and differential amplifier circuit 20a is enabled to compare the signal on internal data line DBL (or /DBL) with reference voltage Vrefm, and transmit the signal having the amplitude of the level of external power supply voltage Vex onto internal read data line RDL1 (or RDL1) in accordance with the result of comparison.

When output clock signal CLK2 rises to H-level, clocked gate circuit 12 shown in FIG. 7 is turned on to transmit the signals on internal read data lines RDL1 and /RDL1 onto corresponding read data lines RDL2 and /RDL2 included in read data bus RDB2.

When output clock signal CLK2 rises to H-level and the read data is transmitted via clocked gate circuit 12, level amplification trigger signal ZATR is once driven to the inactive state of H-level. Thereby, differential amplifier circuit 20a attains the output high-impedance state.

When new memory cell data is then read out, level amplification trigger signal ZATR is activated, and differential amplifier circuit 20a performs the amplification. Thereafter, the data is transferred via the clocked gate circuit. This operation is repeated until the data of the burst length is completely read out.

By utilizing the differential amplifier circuit shown in FIG. 8, the small amplitude signal can be amplified, and the complementary read data signals having the amplitude of the level of external power supply voltage Vex can be produced without using a special level converting circuit.

The voltage level of reference voltage Vrefm is appropriately determined in accordance with the voltage level of the complementary memory cell data signals read onto read data lines DBL and /DBL.

In the structure shown in FIG. 8, differential amplifier circuit 20a is once set to the output high-impedance state. However, in the case where the latch circuit of a flip-flop type is provided at the next stage of the clocked gate circuit, e.g., as shown in FIGS. 33 and 34A, differential amplifier circuit 20a may be configured such that the output signal is fixed to L-level so as to fix the output signal of the clocked gate circuit to H-level. In this case, the latch data of the latch circuit does not change so that erroneous data reading is prevented.

The circuit for producing the internal read data signal of a small amplitude may be implemented by employing a differential amplifier circuit as a preamplifier receiving data on an internal I/O line pair read from the memory cell array (in this case, the differential amplifier circuit is merely required to have a structure generating an analog signal).

[Fourth Embodiment]

Figure 10:
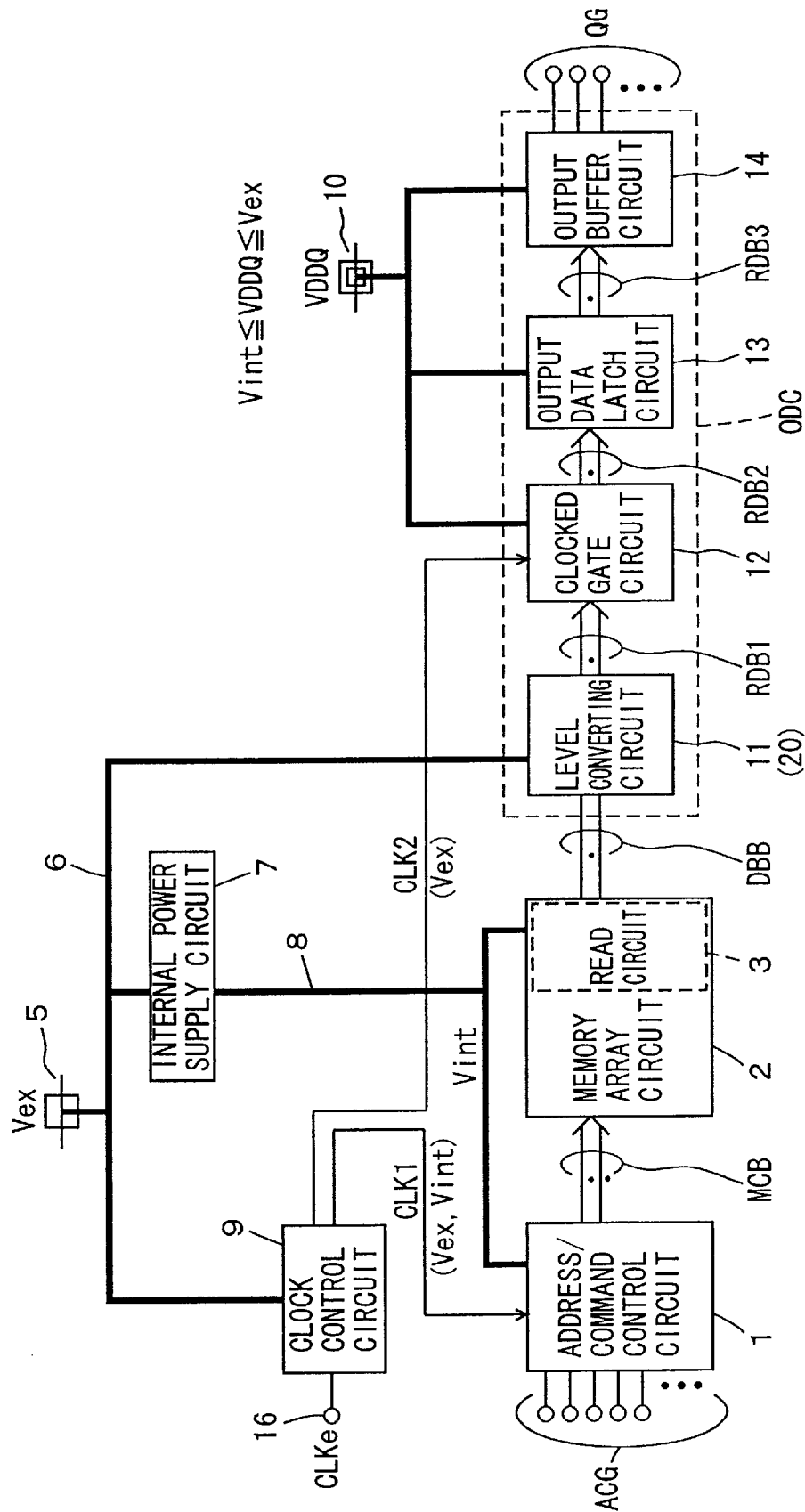
FIGS. 10 to 13 schematically show whole structures of clock synchronous semiconductor memory devices according to fourth to seventh embodiments of the invention, respectively.

FIG. 10 schematically shows a whole structure of a clock synchronous semiconductor memory device according to a fourth embodiment of the invention. In the clock synchronous semiconductor memory device shown in FIG. 10, output power supply voltage VDDQ is applied also to clocked gate circuit 12 and output data latch circuit 13 from output power supply node 10. Structures other than the above are the same as those shown in FIG. 1. The corresponding portions bear the same reference numerals, and the description thereof is not repeated.

Output power supply voltage VDDQ is at a level equal to or slightly lower than external power supply voltage Vex. Internal power supply voltage Vint is likewise at a level equal to or lower than external power supply voltage Vex. Accordingly, output power supply voltage VDDQ has a voltage level equal to or higher than internal power supply voltage Vint. If internal power supply voltage Vint is lower than external power supply voltage Vex, the data at the level of internal power supply voltage Vint is read by read circuit 3 of memory array circuit 2 onto internal data bus DBB and then, is converted into a signal at the level of external power supply voltage Vex by level converting circuit 11.

Each of clocked gate circuit 12 and output data latch circuit 13 uses output power supply voltage VDDQ as one operation power supply voltage, and operates similarly to that in the first to third embodiments. External power supply voltage Vex is at the level equal to or higher than output power supply voltage VDDQ. Accordingly, clocked gate circuit 12 and output data latch circuit 13 convert the signal at the level of external power supply voltage Vex, which is applied from level converting circuit 11 onto internal read data bus RDB1, into a signal having an amplitude of the level of output power supply voltage VDDQ (when Vex≠VDDQ), and then execute transferring and latching. If external power supply voltage Vex is higher than output power supply voltage VDDQ, PMOS transistors in clocked gate circuit 12 and output data latch circuit 13 can be reliably set to the deep off state, preventing flow of a through current. Further, N-channel MOS transistors can be set to a further deep state so that fast data transfer can be achieved.

Output power supply voltage VDDQ is consumed merely in output data control circuit ODC. Since clocked gate circuit 12 and output data latch circuit 13 are not required to drive a large load, supply of output power supply voltage VDDQ to clocked gate circuit 12 and output data latch circuit 13 exerts no adverse effect on the operation of output buffer circuit 14.

Internal clock signal CLK1 may have an amplitude of the level of external power supply voltage Vex, or may have an amplitude of the level of internal power supply voltage Vint.

Instead of level converting circuit 11, level amplifier circuit 20 may be used similarly to the foregoing structure shown in FIG. 7.

According to the fourth embodiment of the invention, as described above, clocked gate circuit 12, output data latch circuit 13 and output buffer circuit 14 are supplied with output power supply voltage VDDQ so that the internal circuits (address/command control circuit 1 and memory array circuit 2) can stably operate because change in power supply voltage caused by the operation of output data control circuit ODC does not exert an adverse effect on the operations of the internal circuits.

Output power supply voltage VDDQ is utilized only in output data control circuit ODC. Further, the clocked gate circuit and the output data latch circuit are merely required to charge/discharge the internal nodes, and have the current drive capability and the current consumption made small, so that the data transfer and the output operation can be performed in accordance with stable output power supply voltage VDDQ.

[Fifth Embodiment]

Figure 11:
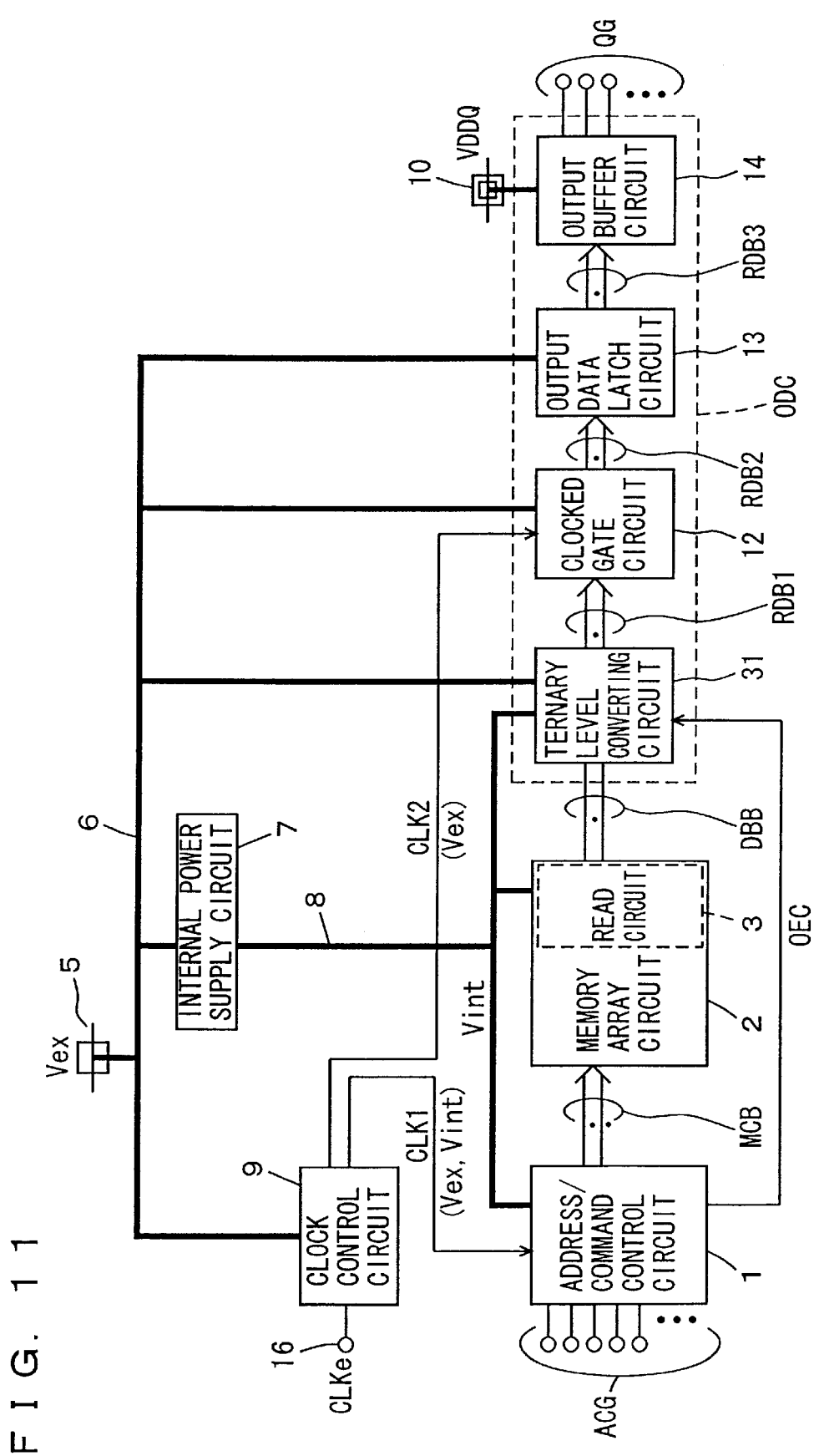

FIG. 11 schematically shows a whole structure of a clock synchronous semiconductor memory device according to a fifth embodiment of the invention. In the clock synchronous semiconductor memory device shown in FIG. 11, a ternary level converting circuit 31 is arranged at an initial stage of output data control circuit ODC. Ternary level converting circuit 31 is activated in response to activation of output enable control signal OEC applied from address/command control circuit 1, and converts the signal at the internal power supply voltage level on internal data bus DBB into a signal having an amplitude of the level of external power supply voltage Vex.

When output enable control signal OEC is inactive, ternary level converting circuit 31 generates a signal of a logical value of setting output buffer circuit 14 to the output high-impedance state. Each of internal data bus DBB and internal read data bus RDB1 has a signal line pair, per one bit of the memory cell data, for transmitting complementary data signals. Ternary level converting circuit 31 generates signals of (H, L) or (L, H) in accordance with the memory cell data on the complementary signal line pair when made active. Ternary level converting circuit 31 generates signals of (H, H) or (L, L) onto the internal read data line pair when output enable control signal OEC is inactive. When ternary level converting circuit 31 generates the signals of (H, H) or (L, L), output buffer circuit 14 is set to the output high-impedance state.

Even while output clock signal CLK2 is repeating the active and inactive states, output buffer circuit 14 continuously maintains the output high-impedance state so that the current consumption is reduced. By setting output buffer circuit 14 to the output high-impedance state, data output node group QG can also be used as the data write terminal group.

The structure shown in FIG. 11 is the same as that shown in FIG. 1 except for ternary level converting circuit 31. Ternary level converting circuit 31 is also supplied with internal power supply voltage Vint for using internal power supply voltage Vint to produce complementary output enable control signal /OEC required when converting output enable control signal OEC at the level of internal power supply voltage Vint applied from address/command control circuit 1 into a signal at the level of external power supply voltage Vex.

[Sixth Embodiment]

Figure 12:
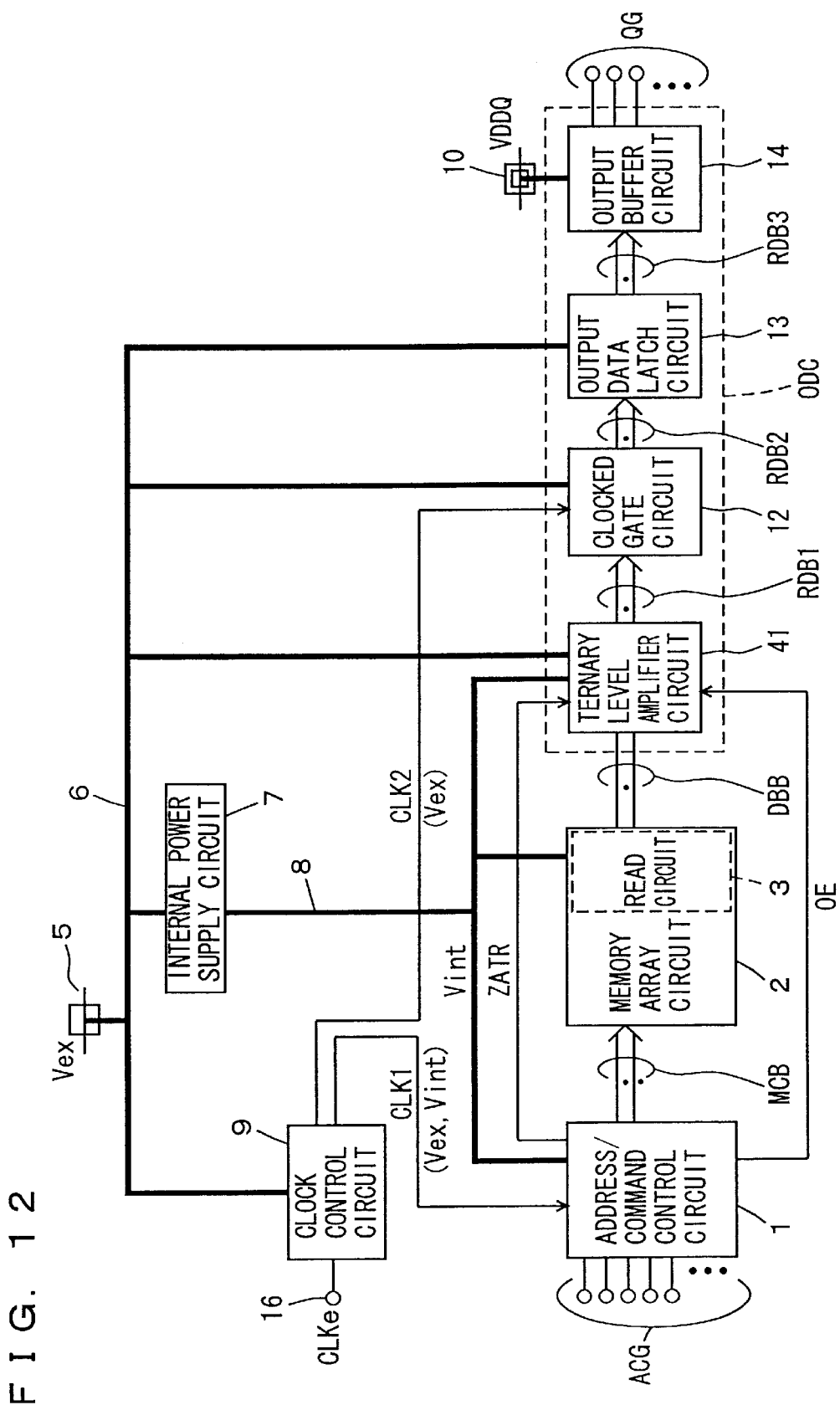

FIG. 12 schematically shows a whole structure of a clock synchronous semiconductor memory device according to a sixth embodiment of the invention. The clock synchronous semiconductor memory device shown in FIG. 12 differs from the clock synchronous semiconductor memory device shown in FIG. 7 in the following points. In output data control circuit ODC, a ternary level amplifier circuit 41 is provided for amplifying the signals on internal data bus DBB to the level of external power supply voltage Vex. Structures other than above are the same as those shown in FIG. 7, the corresponding portions bear the same reference numerals, and description thereof is not repeated.

Ternary level amplifier circuit 41 receives output enable signal OE with an amplitude of the level of internal power supply voltage Vint and level amplification trigger signal ZATR from address/command control circuit 1. Ternary level amplifier circuit 41 generates a signal having a logical value setting output buffer circuit 14 to the output high-impedance state, when output enable signal OE is inactive. When both output enable signal OE and level amplification trigger signal ZATR are active, ternary level amplifier circuit 41 amplifies the signals on internal data bus DBB to generate a signal having an amplitude of the level of external power supply voltage Vex onto read data bus RDB1. Therefore, ternary level amplifier circuit 41 likewise generates, as data representing the output high-impedance state, the signals of (H, H) or (L, L) onto complementary data lines (RDL1, /RDL1). Accordingly, ternary level amplifier circuit 41 generates data representing three values of "1", "0" and "Hi-Z (output high-impedance state)".

In the structure shown in FIG. 12, the operation of amplifying the signals on internal data bus DBB is performed in the stage preceding clocked gate circuit 12, similarly to the third embodiment shown in FIG. 7, and therefore clock access time tAC can be reduced.

By utilizing ternary level amplifier circuit 41 for generating data designating the output high-impedance state, it is possible to stop the operation of output buffer circuit 14 during the above data outputting, so that power consumption can be reduced.

Internal clock signal CLK1 from clock control circuit 9 may have an amplitude of either external power supply voltage Vex or internal power supply voltage Vint.

In the structure shown in FIGS. 11 and 12, each of clocked gate circuit 12 and output data latch circuit 13 may be supplied with output power supply voltage VDDQ as one operation power supply voltage instead of external power supply voltage Vex.

[Specific Structures of Respective Portions of Output Data Control]

[Seventh Embodiment]

Figure 13:
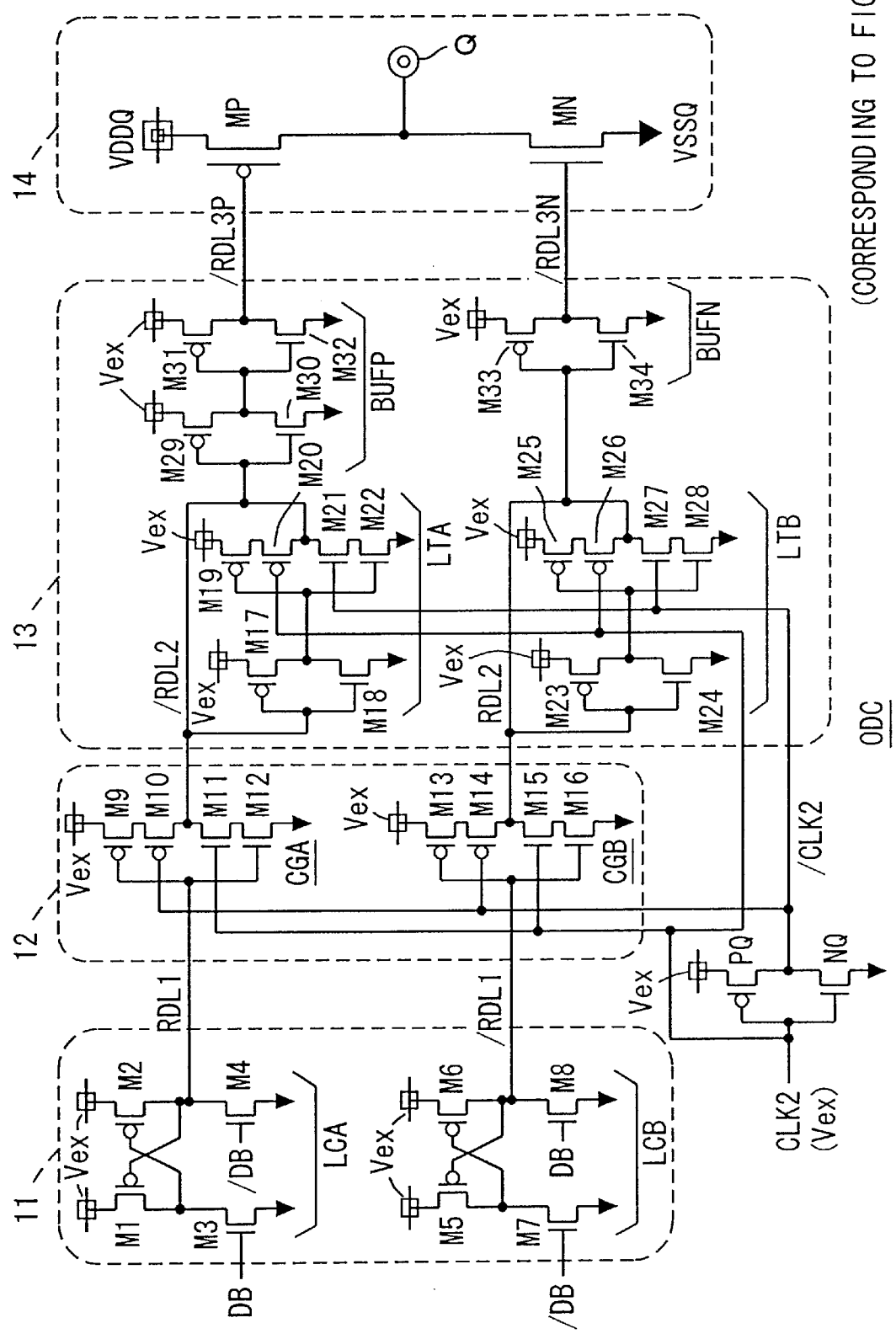

FIG. 13 shows a structure of an output data control circuit according to a seventh embodiment of the invention. Output data control circuit ODC includes circuits corresponding to the data output nodes, respectively. FIG. 13 representatively shows a structure of a portion for reading out data of one bit. The structure shown in FIG. 13 corresponds to the structure shown in FIG. 1.

Level converting circuit 11 includes a level converter LCA for driving internal read data line RDL1 in accordance with signal potentials on internal data lines DB and /DB, and a level converter LCB for performing the level conversion complementarily to the level converter LCA, to drive complementary read data line /RDL1 in accordance with the signal potentials on internal data lines /DB and DB.

Level converter LCA includes P-channel MOS transistors M1 and M2 having cross-coupled gates and drains, an N-channel MOS transistor M3 connected in series to MOS transistor M1 and having a gate coupled to internal data line DB, and an N-channel MOS transistor M4 connected between internal read data line RDL1 and the ground node and having a gate coupled to complementary internal data line /DB.

Level converter LCB includes P-channel MOS transistors M5 and M6 having cross-coupled gates and drains, and N-channel MOS transistors M7 and M8 connected in series to respective MOS transistors M5 and M6 and having gates coupled to internal data lines /DB and DB, respectively.

Sources of P-channel MOS transistors M1, M2, M5 and M6 in these level converters LCA and LCB receive external power supply voltage Vex.

Signals at CMOS level (signals amplified by the preamplifier in a preceding stage) are transmitted onto internal data lines DB and /DB. When internal data line DB is at H-level, and complementary internal data line /DB is at L-level, MOS transistors M2 and M3 in level converter LCA are on, and MOS transistors M1 and M4 are off. Therefore, read data line RDL1 is kept at H-level equal to the level of external power supply voltage Vex. In level converter LCB, MOS transistors M5 and M8 are on, MOS transistors M6 and M7 are off so that internal data line /RDL1 is driven to L-level equal to the level of ground voltage VSS. Accordingly, the signals, which are carried on internal data lines DB and /DB and have the amplitude of the level of internal power supply voltage Vint, are level converted and then transmitted onto internal read data lines RDL1 and /RDL1, respectively.

Internal data lines DB and /DB are driven in a binary manner. A structure of the level converting circuit in ternary driving scheme will be described later.

In this output data control circuit, output clock signal CLK2 is inverted by a CMOS inverter formed of MOS transistors PQ and NQ so that complementary output clock signal /CLK2 is produced. The reason why the CMOS inverter formed of MOS transistors PQ and NQ is arranged in the output control circuit is as follows. When two phase clock signals CLK2 and /CLK2 are transmitted through a signal transmission path from the clock control circuit to the output data control circuit, current consumption occurs due to charging and discharging of the signal lines. Also, deviation in phase may occur due to a difference in signal propagation delay time between clock signals CLK2 and /CLK2. Therefore, complementary output clock signal /CLK2 is produced from clock signal CLK2 in output data control circuit ODC.

Clocked gate circuit 12 includes a clocked CMOS inverter circuit CGA provided for internal read data line RDL1, and a clocked CMOS inverter circuit CGB provided for complementary internal read data line /RDL1. These clocked CMOS inverter circuits CGA and CGB invert and transmit the signals on internal read data lines RDL1 and /RDL1 onto internal read data lines /RDL2 and RDL2, respectively, when output clock signal CLK2 is in the active state at H-level.

Clocked CMOS inverter circuit CGA include P-channel MOS transistors M9 and M10 connected in series between the external power supply node and the internal read data line /RDL2 and having their respective gates receiving the signal on internal read data line RDL1 and complementary output clock signal /CLK2, and N-channel MOS transistors M11 and M12 connected in series between internal read data line /RDL2 and the ground node and having their respective gates receiving the signal on internal read data line RDL1 and output clock signal CLK2.

Clocked CMOS inverter circuit CGB include P-channel MOS transistors M13 and M14 connected in series between the external power supply node and the internal read data line RDL2 and having their respective gates receiving the signal on internal read data line /RDL1 and complementary output clock signal /CLK2, and N-channel MOS transistors M15 and M16 connected in series between internal read data line RDL2 and the ground node and having their respective gates receiving output clock signal CLK2 and the signal on internal read data line /RDL1.

In clocked CMOS inverter circuits CGA and CGB, when output clock signal CLK2 is at H-level, MOS transistors M10, M11, M14 and M15 are on. In this state, internal read data line /RDL2 is driven to the ground voltage level or external power supply voltage Vex level by MOS transistors M9 and M12 in accordance with the signal potential on internal read data line RDL1. Likewise, internal read data line RDL2 is driven to external power supply voltage Vex level or the ground voltage level by MOS transistors M13 and M16 in accordance with the signal potential on complementary internal read data line /RDL1.

When output clock signal CLK2 is in the inactive state at L-level, MOS transistors M10, M11, M14 and M15 are off, and these clocked CMOS inverter circuits CGA and CGB are set to the output high-impedance state. When clocked CMOS inverter circuits CGA and CGB are in the output high-impedance state, internal read data lines RDL1 and /RDL1 are supplied with the memory cell data from level converters LCA and LCB, respectively. After the signal potentials on internal read data lines RDL1 and /RDL1 are made definite, output clock signal CLK2 attains H-level. In the ternary operation, both internal read data lines RDL1 and /RDL1 are held at L-level so that internal read data lines /RDL2 and RDL2 are held at H-level (the level of external power supply voltage Vex).

Output data latch circuit 13 includes a latch circuit LTA for latching the signal potential on internal read data line /RDL2, a latch circuit LTB for latching the signal potential on internal read data line RDL2, a buffer circuit BUFP for buffering latched data of latch circuit LTA, for transmission onto internal read data line /RDL3P, and an inverter buffer circuit BUFN for inverting and transmitting the signal latched by latch circuit LTB onto internal read data line /RDL3N.

Latch circuit LTA includes a CMOS inverter formed of a P-channel MOS transistor M17 and an N-channel MOS transistor M18 for inverting the signal potential on internal read data line /RDL2, and a clocked CMOS inverter circuit formed of MOS transistors M19–M22 and selectively activated in accordance with two phase clock signals CLK2 and /CLK2 to invert and transmit the output signal of the CMOS inverter formed of MOS transistors M17 and M18 onto internal read data line /RDL2. In this clocked CMOS inverter circuit, P-channel MOS transistor M20 and N-channel MOS transistor M21 receive output clock signals CLK2 and /CLK2 on their gates, respectively. P-channel MOS transistors M19 and M22 receive on their gates the output signal of the CMOS inverter circuit formed of MOS transistors M17 and M18.

Likewise, latch circuit LTB includes a CMOS inverter circuit formed of a P-channel MOS transistor M23 and an N-channel MOS transistor M24, for inverting the signal potential on internal read data line RDL2, and a clocked CMOS inverter circuit formed of MOS transistors M25–M28 and operating in accordance with two phase output clock signals CLK2 and /CLK2 to invert and transmit the output signal of the CMOS inverter formed of MOS transistors M23 and M24 onto internal read data line RDL2. MOS transistors M26 and M27 receive output clock signals CLK2 and /CLK2 on their gates, respectively. P-channel MOS transistor M25 and N-channel MOS transistor M28 receive on their gates the output signal of the CMOS inverter formed of MOS transistors M23 and M24.

Buffer circuit BUFP includes cascaded CMOS inverter circuits of two stages. The CMOS inverter circuit in the first stage is formed of a P-channel MOS transistor M29 and an N-channel MOS transistor M30, and inverts the signal potential on internal read data line /RDL2. The CMOS inverter circuit in the second stage is formed of a P-channel MOS transistor M31 and an N-channel MOS transistor M32, and inverts the output signal of the CMOS inverter circuit in the first stage for transmission onto an internal read data line /RDL3P.

Inverter buffer circuit BUFN includes a CMOS inverter circuit formed of a P-channel MOS transistor M33 and an N-channel MOS transistor M34. Buffer circuit BUFN inverts and transmits the signal potential on internal read data line RDL2 onto an internal read data line /RDL3N. Each of latch circuits LTA and LTB as well as buffer circuits BUFP and BUFN included in output data latch circuit 13 is supplied with external power supply voltage Vex as one operation power supply voltage.

In output data latch circuit 13, latch circuits LTA and LTB enter the latch state complementarily to the clocked CMOS inverter circuits CGA and CGB of clocked gate circuit 12. More specifically, when clocked CMOS inverter circuits CGA and CGB are in the output high-impedance state, the clocked CMOS inverter circuit formed of MOS transistors M19–M22 in latch circuit LTA enters the active state to latch the signal potential on internal read data line /RDL2, and the clocked CMOS inverter circuit formed of MOS transistors M25–M28 in latch circuit LTB enters the active state to latch the signal potential on internal read data line RDL2. The signal potential on internal read data line /RDL2 is buffered by buffer circuit BUFP, and then is transmitted onto internal read data line /RDL3P. The signal potential on internal read data line RDL2 is inverted by buffer circuit BUFN, and then is transmitted onto internal read data line /RDL3N. For example, when internal read data lines /RDL2 and RDL2 are at H- and L-levels, respectively, a signal at H-level (the level of external power supply voltage Vex) is transmitted onto internal read data line /RDL3P, and a signal at H-level is transmitted onto internal read data line /RDL3N.

When output clock signal CLK2 is at H-level, clocked CMOS inverter circuit of latch circuits LTA and LTB is in the output high-impedance state (MOS transistors M20, M21, M26 and M27 are off). In this state, clocked inverter circuits CGA and CGB in clocked gate circuit 12 operate and the signal potentials on internal read data lines RDL1 and /RDL1 are inverted and transmitted onto internal read data lines /RDL2 and RDL2, respectively. Latch circuit LTA and LTB are in the unlatching state, and clocked gate circuit 12 can easily drive internal read data lines /RDL2 and RDL2 to the signal potentials corresponding to the signal potentials on internal read data lines RDL1 and /RDL1, respectively. A difference in gate delay corresponding to one stage of the CMOS inverter circuit is present between buffer circuits BUFP and BUFN. However, this gate delay can be sufficiently reduced.

When output high-impedance data is read out, both internal read data lines /RDL2 and RDL2 are at H-level, and internal read data lines /RDL3P and /RDL3N are held at H- and L-levels, respectively.

Output buffer 14 includes a P-channel MOS transistor MP driving data output node Q to the level of output power supply voltage VDDQ in accordance with the signal potential on internal read data line /RDL3, and an N-channel MOS transistor MN driving data output node Q to the level of ground voltage VSSQ in accordance with the signal potential on internal read data line /RDL3. Output buffer circuit 14 must rapidly drive a large load on data output node Q, and the current drive capability of MOS transistors MP and MN are set sufficiently large. Buffer circuits BUFP and BUFN rapidly drive the large gate capacitances of MOS transistors MP and MN, respectively. When the data of the output high-impedance state is read out, internal read data line /RDL3P is at H-level of external power supply voltage Vex, and internal read data line /RDL3N is at L-level of the ground voltage. Therefore, both MOS transistors MP and MN in output buffer circuit 14 are off, and data output node Q is held in the high-impedance state.

As shown in FIG. 13, level converting circuit 11 is arranged in the stage preceding clocked gate circuit 12, whereby clocked gate circuit 12 can execute the transfer operation in accordance with output clock signal CLK2 after completion of the level converting operation in level converting circuit 11, and it is possible to hide an influence on the clock access time due to the delay time in level converting circuit 11.

[First Modification]

Figure 14:
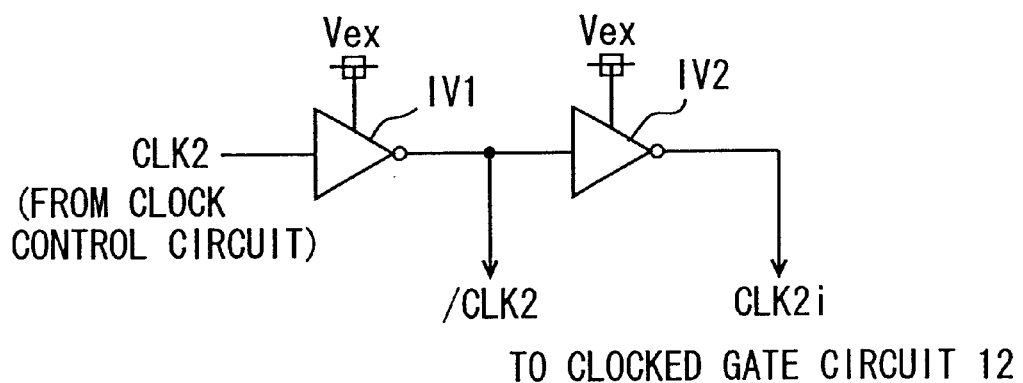
FIG. 14 schematically shows a structure of a modification of an internal output clock signal generating portion shown in FIG. 13.

FIG. 14 schematically shows a structure of a modification of the seventh embodiment of the invention. In FIG. 14, internal output clock signal CLK2 from the clock control circuit (see FIG. 1) is applied to cascaded inverter circuits IV1 and IV2 of two stages. Inverter circuit IV1 produces complementary output clock signal /CLK2, and inverter circuit IV2 produces output clock signal CLK2i. These output clock signals /CLK2 and CLK2i are applied to clocked gate circuit 12 and output data latch circuit 13 shown in FIG. 13, respectively. Each of inverter circuits IV1 and IV2 operates using external power supply voltage Vex as one operation power supply voltage. Inverter circuit IV1 corresponds to the CMOS inverter formed of MOS transistors PQ and NQ shown in FIG. 13.

In the structure shown in FIG. 14, clocked gate circuit 12 and output data latch circuit 13 are supplied with output clock signals /CLK2 and CLK2i from inverter circuits IV1 and IV2. Therefore, internal output clock signal CLK2 from the clock control circuit is not required to drive clocked gate circuit 12 and output data latch circuit 13. Thus, it is possible to reduce the load to be driven by this clock control circuit, and the output clock signal CLK2 can be changed fast in accordance with the external clock signal so that the clock access time can be further reduced.

[Second Modification]

Figure 15:
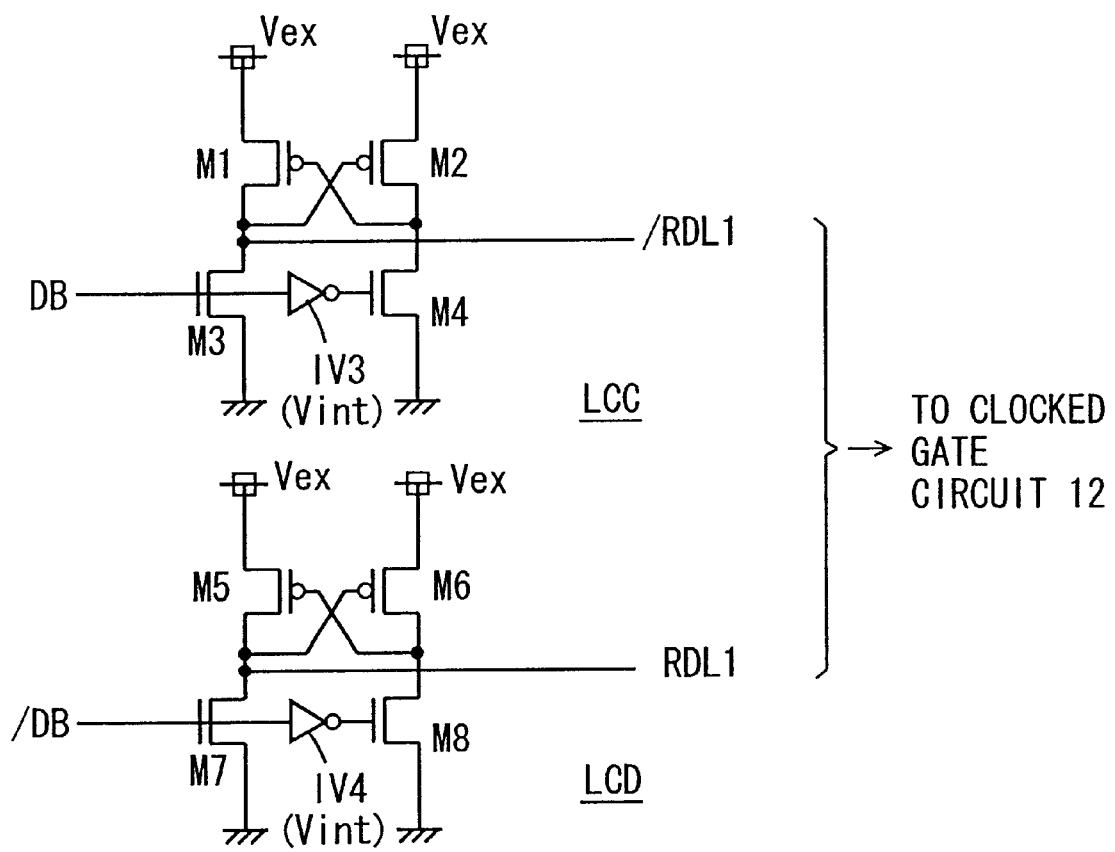
FIG. 15 shows a structure of a modification of a level converting circuit shown in FIG. 13.

FIG. 15 shows a structure of a second modification of the output data control circuit according to the seventh embodiment of the invention. In the structure shown in FIG. 15, level converting circuit 11 includes level converters LCC and LCD provided individually and independently for internal data lines DB and /DB, respectively. Level converter LCC includes an inverter IV3 for inverting the signal potential on internal data line DB, cross-coupled P-channel MOS transistors M1 and M2 coupled to internal read data line /RDL1, an N-channel MOS transistor M3 connected between internal read data line /RDL1 and the ground node and having a gate coupled to internal data line DB, and an N-channel MOS transistor M4 connected between MOS transistor M2 and the ground node and having a gate receiving the output signal of inverter circuit IV3.

Level converter LCD likewise includes cross-coupled P-channel MOS transistors M5 and M6 coupled to internal read data line RDL1, an inverter circuit IV4 for inverting the signal potential on complementary internal data line /DB, an N-channel MOS transistor M7 connected between internal read data line RDL1 and the ground node and having a gate coupled to internal data line /DB, and an N-channel MOS transistor M8 connected between MOS transistor M6 and the ground node and having a gate receiving the output signal of inverter circuit IV4. Each of inverter circuits IV3 and IV4 operates using internal power supply voltage Vint as one operation power supply voltage.

Internal read data line /RDL1 is coupled to the node interconnecting MOS transistors M1 and M3, and internal read data line RDL1 is coupled to the node interconnection MOS transistors M5 and M7. When internal data line DB is at H-level and complementary internal data line /DB is at L-level, in level converter LCC, MOS transistors M3 and M2 are on, and MOS transistors M4 and M1 are off. Internal read data line /RDL1 is driven to the ground voltage level. In level converter LCD, MOS transistors M8 and M5 are on and MOS transistors M7 and M6 are off, so that internal read data line RDL1 is driven to the H-level of external power supply voltage Vex. Conversely, when internal data lines DB and /DB are at L- and H-levels, respectively, internal read data lines /RDL1 and RDL1 are driven to H- and L-levels, respectively.

When internal data lines DB and /DB are both at H-level of internal power supply voltage Vint, internal read data lines /RDL1 and RDL1 are both driven to L-level of the ground voltage level. In this state, as shown in FIG. 13, internal read data lines RDL2 and /RDL2 are held at H-level, and output buffer 14 enters the output high-impedance state. When ternary data is transferred onto internal data lines DB and /DB (internal data lines DB and /DB are not set to the high-impedance state, but are driven to H- or L-level), paths of flowing currents can be cut off in level converters LCC and LCD after internal read data lines RDL1 and /RDL1 are driven to the ground voltage level. Thereby, it is possible to reduce the current consumption in the level converting circuit during output of the ternary data.

In the foregoing structure shown in FIG. 13, the current consumption can be reduced when internal data lines DB and /DB are set to the output high-impedance state (internal data lines DB and /DB themselves are set to H- or L-level).

When Hi-Z data is transmitted onto internal data lines DB and /DB, the read circuit is simply required to be in a standby state (inactive). Therefore, the ternary data can be generated in the configuration where internal data lines DB and /DB are precharged to internal power supply voltage Vint level.

In the case where internal data lines DB and /DB are both precharged to L-level (Hi-Z data corresponds to the state where both internal data lines DB and /DB are at L-level) in the structure shown in FIG. 15, internal read data line RDL1 is coupled to the connection node between MOS transistors M2 and M4 of level converter LCC, and internal read data line /RDL1 is connected to the connection node between MOS transistors M6 and M8 of level converter LCD.

According to the seventh embodiment of the invention, as described above, the output data control circuit employs the clocked CMOS inverter circuit operating in synchronization with output clock signal CLK2, and the CMOS inverter circuit can be driven fast by the signals of the amplitude of the level of external power supply voltage Vex while keeping the advantageous characteristics of the CMOS inverter circuit, i.e., low current consumption, and thus fast data transfer can be performed.

Further, both the complementary data signals are subjected to the level conversion, and therefore can be transferred with the same propagation delay.

In output data control circuit ODC shown in FIG. 13, clocked gate circuit 12 and output data latch circuit 13 may be supplied with output power supply voltage VDDQ instead of external power supply voltage Vex.

[Eighth Embodiment]

Figure 16:
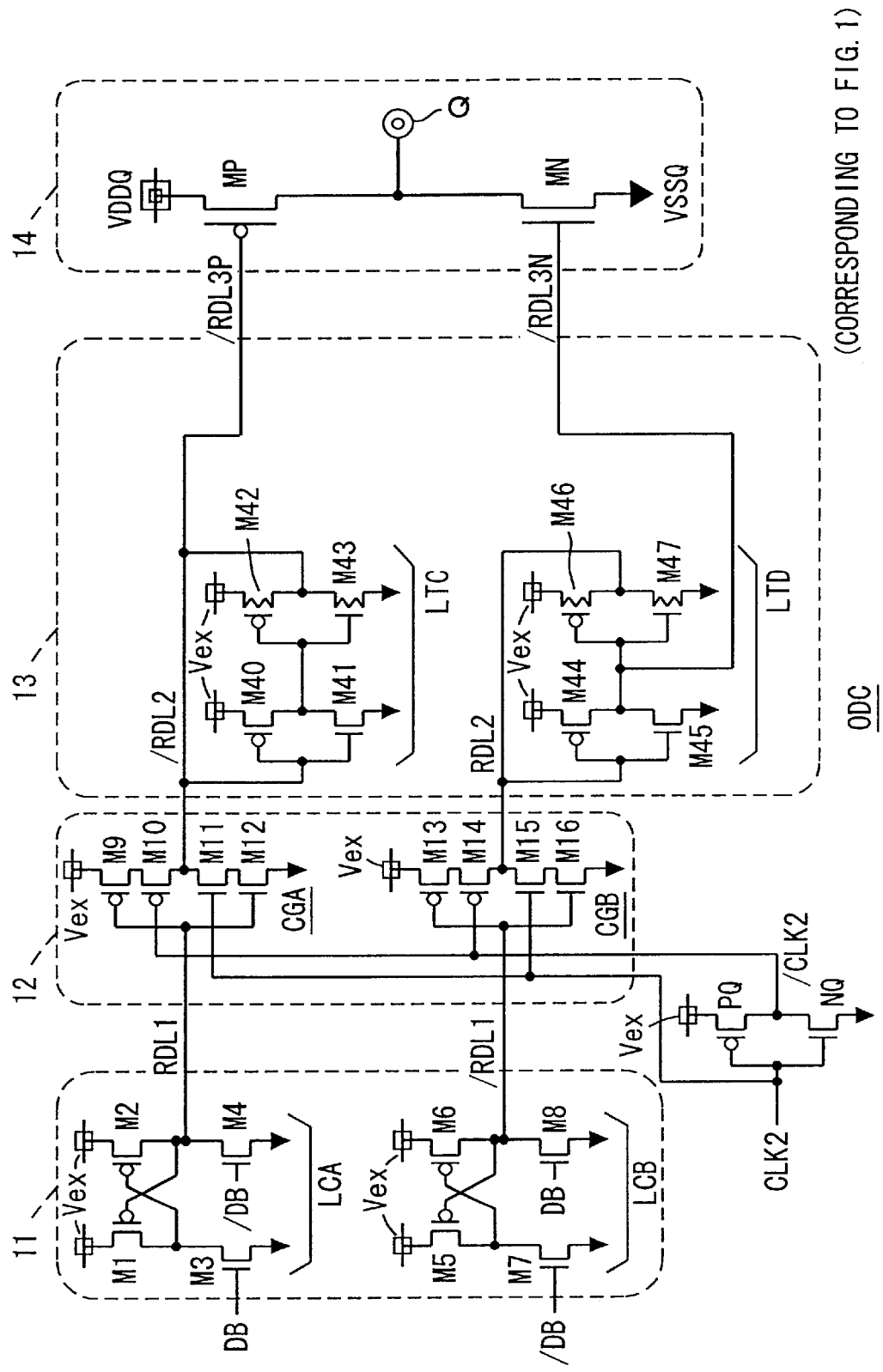
FIG. 16 shows a structure of an output data control circuit according to an eighth embodiment of the invention.

FIG. 16 shows a structure of an output data control circuit according to an eighth embodiment of the invention. Output data control circuit ODC shown in FIG. 16 has a structure corresponding to that shown in FIG. 1. In output data control circuit ODC shown in FIG. 16, the structure of output data latch circuit 13 is different from that shown in FIG. 13. The structures of level converting circuit 11, clocked gate circuit 12 and output buffer circuit 14 are the same as those shown in FIG. 13. The corresponding portions bear the same reference numerals, and the description thereof is not repeated.

In FIG. 16, output data latch circuit 13 includes a latch circuit LTC for latching the signal potential on internal read data line /RDL2, and a latch circuit LTD for latching the signal potential on internal read data line RDL2.

Latch circuit LTC includes cascaded CMOS inverter circuits of two stages. The CMOS inverter circuit in the first stage is formed of a P-channel MOS transistor M40 and an N-channel MOS transistor M41, and inverts the signal potential on internal read data line /RDL2. The CMOS inverter circuit in the second stage is formed of a P-channel MOS transistor M42 and an N-channel MOS transistor M43, and inverts the output signal of the CMOS inverter circuit in the first stage for transmission onto internal read data line /RDL2P. Internal read data line /RDL2 is connected to internal read data line /RDL3P. MOS transistors M42 and M43 have current drive capabilities sufficiently smaller than the current drive capability of clocked CMOS inverter circuit CGA. This is achieved by adjusting the ratio of the gate width to the gate length in these inverters. Thus, these MOS transistors M42 and M43 are weak transistors having reduced current drive capabilities.

Latch circuit LTD includes cascaded CMOS inverter circuits of two stages. The CMOS inverter circuit in the first stage is formed of a P-channel MOS transistor M44 and an N-channel MOS transistor 45, and inverts the signal potential on internal read data line RDL2. The CMOS inverter circuit in the second stage is formed of a P-channel MOS transistor M46 and an N-channel MOS transistor M47, and inverts the output signal of the CMOS inverter circuit in the first stage for transmission onto internal read data line RDL2. MOS transistors M46 and M47 have current drive capabilities sufficiently smaller than the current drive capability of clocked CMOS inverter circuit CGB Thus, these MOS transistors 46 and M47 are likewise weak transistors having reduced current drive capabilities. The output signal of the CMOS inverter in the first stage of latch circuit LTD is transmitted onto internal read data line /RDL3N.

Output data latch circuit 13 shown in FIG. 16 does not include clocked CMOS inverter circuit. Each of latch circuits LTC and LTD is supplied with external power supply voltage Vex as one operation power supply voltage.

In each of latch circuits LTC and LTD, the components of the CMOS inverter in the output stage have reduced current drive capabilities. Therefore, the signal potentials on internal read data lines /RDL2 and RDL2 can be changed in accordance with the output signals of clocked CMOS inverter circuits CGA and CGB in clocked gate circuit 12. Internal read data line /RDL2 is coupled to internal read data line /RDL3P connected to the gate of output MOS transistor MP in output buffer 14. In this case, clocked CMOS inverter circuit CGA drives, with a large current driving capability, the gate of output MOS transistor MP having a large gate capacitance so that the operation speed does not lower.

Internal read data line /RDL3N is driven by the first stage CMOS inverter circuit of the latch circuit LTD, and the first stage CMOS inverter circuit drives, with a large current driving capability, rapidly the large gate capacitance of output MOS transistor MN in output buffer 14. The difference in gate delay between latch circuits LTC and LTD corresponds to the gate delay of one stage of CMOS inverter, and thus is sufficiently small.

As shown in FIG. 16, it is not necessary to use the clocked CMOS inverter circuit in output data latch circuit 13, so that the number of circuit components and the area occupied by the circuit can be reduced. Since the circuit components are reduced in number, the current consumption can also be reduced.

In the structure of output data latch circuit 13 shown in FIG. 16, internal read data lines /RDL2 and RDL2 are held at H-level of external power supply voltage Vex when data in the output high-impedance state (Hi-Z data) is applied. Therefore, internal read data lines RDL1 and /RDLI are both held at L-level during output of the output high-impedance data, and the ternary data can be transferred similarly to the foregoing seventh embodiment by utilizing the structure shown in FIG. 15.

According to the eighth embodiment of the invention, as described above, the output data latch circuit is formed of the CMOS inverter circuits formed of the weak transistors, and a circuit operating in synchronization with the output clock signal is not required. Accordingly, the circuit components can be reduced in number, and therefore the area occupied by the circuit and the power consumption can be reduced. Further, it is possible to reduce the number of stages of the logic circuits through which the signal is transmitted in output data latch circuit 13, and the signal can be transmitted fast. Accordingly, clock access time tAC can be further reduced.

[Ninth Embodiment]

Figure 17:
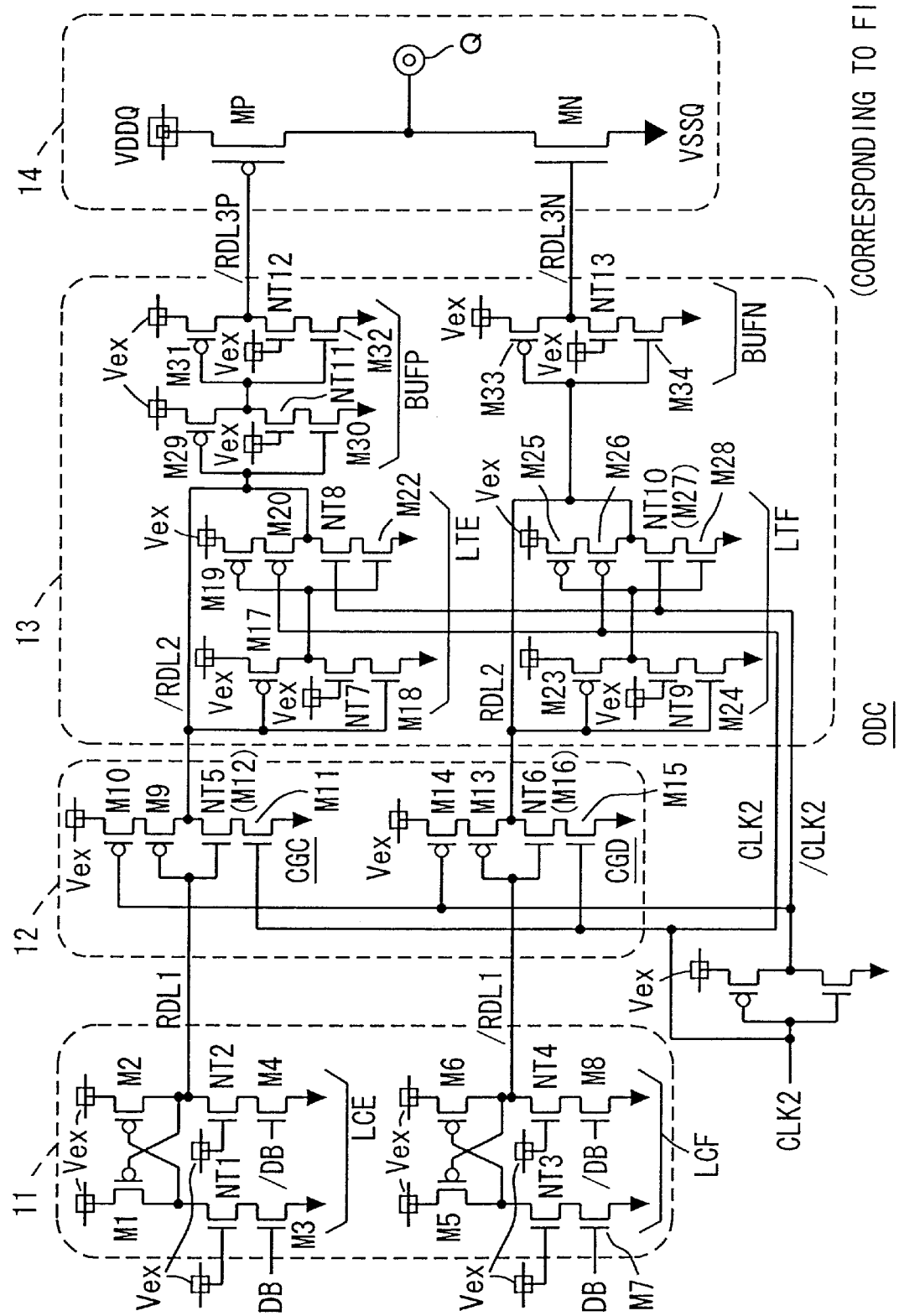
FIG. 17 shows a structure of an output data control circuit according to a ninth embodiment of the invention.

FIG. 17 shows a structure of an output data control circuit ODC according to a ninth embodiment of the invention. The output data control circuit shown in FIG. 17 differs from the output data control circuit shown in FIG. 13 in the following points.

Level converting circuit 11 includes an N-channel MOS transistor NT1 interposed between MOS transistors M1 and M3 of a level converter LCE and having a gate receiving external power supply voltage Vex, and an N-channel MOS transistor NT2 interposed between internal read data line RDL1 and MOS transistor M4 and having a gate receiving external power supply voltage Vex.

In level converter LCF, N-channel MOS transistors NT3 and NT4 receiving external power supply voltage Vex on their gates are likewise interposed between MOS transistors M5 and M7, and between MOS transistors M6 and M8, respectively.

In clocked gate circuit 12, clocked CMOS inverter circuit CGC driving internal read data line /RDL2 includes an MOS transistor NT5 having a gate coupled to internal read data line RDL1 and interposed between internal read data line /RDL2 and N-channel MOS transistor M11 receiving output clock signal CLK2 on its gate. MOS transistor NT5 corresponds to MOS transistor M12 shown in FIG. 13. In accordance with the above arrangement, MOS transistor M9 receiving, at a gate thereof, the signal on internal read data line RDL1 is coupled to internal read data line /RDL2. Also, P-channel MOS transistor M10 receiving complementary output clock signal /CLK2 at a gate thereof is disposed between MOS transistor M9 and the external power supply node.

Likewise, in clocked CMOS inverter circuit CGD driving internal read data line RDL2, an N-channel MOS transistor NT6 which having a gate receiving the signal potential on internal read data line /RDL1 is interposed between internal read data line RDL2 and MOS transistor M15 receiving output clock signal CLK2 on its gate. MOS transistor NT6 corresponds to MOS transistor M16 in clocked CMOS inverter circuit CGB of clocked gate circuit 12 shown in FIG. 13. In accordance with the above change in order of connection, P-channel MOS transistor M13 having a gate coupled to internal read data line /RDL1 is coupled to internal read data line RDL2. Also, P-channel MOS transistor M14 receiving output clock signal /CLK2 on its gate is connected between the external power supply node and MOS transistor M13

In output data latch circuit 13, a latch circuit LTE for latching the signal potential on internal read data line /RDL2 includes an N-channel MOS transistor NT7 having a gate receiving external power supply voltage Vex and interposed between the internal output node and MOS transistor M18 in the CMOS inverter circuit at the first stage. In the CMOS inverter circuit at the next stage, an N-channel MOS transistor NT8 receiving output clock signal /CLK2 on its gate is connected between internal read data line /RDL2 and N-channel MOS transistor N22. MOS transistor NT8 corresponds to MOS transistor M21 shown in FIG. 13.

Latch circuit LTF for latching the signal potential on internal read data line RDL2 includes an N-channel MOS transistor NT9 having a gate receiving external power supply voltage Vex and interposed between the output node and MOS transistor M24 in the CMOS inverter at the first stage. In the CMOS inverter at the next stage, an N-channel MOS transistor NT10 is interposed between internal read data line RDL2 and an N-channel MOS transistor N28. MOS transistor NT10 corresponds to MOS transistor M27 shown in FIG. 13.

In buffer circuit BUFP, the cascaded CMOS inverters of two stages include N-channel MOS transistors NT11 and NT12, receiving external power supply voltage Vex on their respective gates and interposed between corresponding output nodes and discharging MOS transistors M30 and M32, respectively.

Likewise, buffer circuit BUFN includes an N-channel MOS transistor NT13 receiving external power supply voltage Vex on its gate and interposed between internal read data line /RDL3 and a MOS transistor M34.

These MOS transistors NT1–NT13 are always on and each operate in a non-saturated region to lower the drain voltage of the adjacent N-channel MOS transistor by a threshold voltage Vth thereof so as to mitigate the drain electric field of the adjacent N-channel MOS transistor.

In this output data control circuit ODC, a potential difference of external power supply voltage Vex is applied between the source and drain of each of P- and N-channel MOS transistors in accordance with a logical state of the output signal. In particular, if an excessively large potential difference occurs between the source and drain of an N-channel MOS transistor in transition of the logical state, hot carriers are injected into the gate insulating film of the N-channel MOS transistor so that characteristics of the MOS transistor will deteriorate after a long term use, as is already known. The injection of hot carriers into the gate insulating film is caused by the stress voltage applied to the MOS transistor.

According to this hot carrier injection, carriers in the channel are accelerated by the drain electric field or the electric field between the gate and the substrate so that the carriers change into hot carriers to be injected into the gate insulating film. Among various factors of hot carrier injection, when a large substrate current flows under such a stress condition that a drain-source voltage Vds is larger than a gate-source voltage Vgs, drain avalanche hot carrier injection occurs. In the normal operation mode, many hot carriers are produced, and the transconductance of the MOS transistor deteriorates. By interposing N-channel MOS transistor NT receiving external power supply voltage Vex on its gate, the drain voltage of the adjacent N-channel MOS transistor is lowered to a voltage of (Vex−Vth) at the maximum so that the voltage stress of the adjacent N-channel MOS transistor is reduced, and hot carrier injection is suppressed.

Since N-channel MOS transistors NT1–NT13 provided for mitigating the electric field shown in FIG. 17 perform the same operations, the following description will be given by way of example on MOS transistors NT1 and NT2 included in level converting circuit 11. The hot carrier injection occurs when a drain current flows in the MOS transistor, or in transition of the logical state of the logic gate (level converter LCE). Further, the hot carrier injection becomes remarkable when the MOS transistor operates in a saturated region. The saturated region is an operation region satisfying the following relationship:

$$Vds \geq Vgs - Vth.$$

MOS transistors NT1 and NT2 are connected in series to MOS transistors M3 and M4, respectively. MOS transistors NT1 and NT2 are connected to internal nodes supplied with external power supply voltage Vex, respectively. When MOS transistor M3 turns on, a current flows via MOS transistors M3 and NT1. In this state, the gate voltage of MOS transistor NT1 is equal to external power supply voltage Vex, and therefore MOS transistor NT1 operates in a linear region in a major period in which transition of the logical state occurs. The above linear region is an operation region satisfying the following relationship.

$$Vds < Vgs - Vth.$$

In MOS transistor NT1, therefore, injection of hot carriers occurs only to a small extent. In MOS transistor M3, the applied voltage is equal to (Vex−Vth) at the maximum as a result of the voltage drop by the threshold voltage of MOS transistor NT1 so that the drain electric field is small, and injection of hot carriers occurs only to a small extent. By series connection of MOS transistor NT1 to MOS transistor M3, therefore, it is possible to reduce an amount of hot carriers injected in MOS transistors NT1 and M3. Likewise, it is possible to reduce an amount of hot carriers injected in MOS transistors NT2 and M4 by series connection of MOS transistor NT2 to MOS transistor M4.

Figure 18:
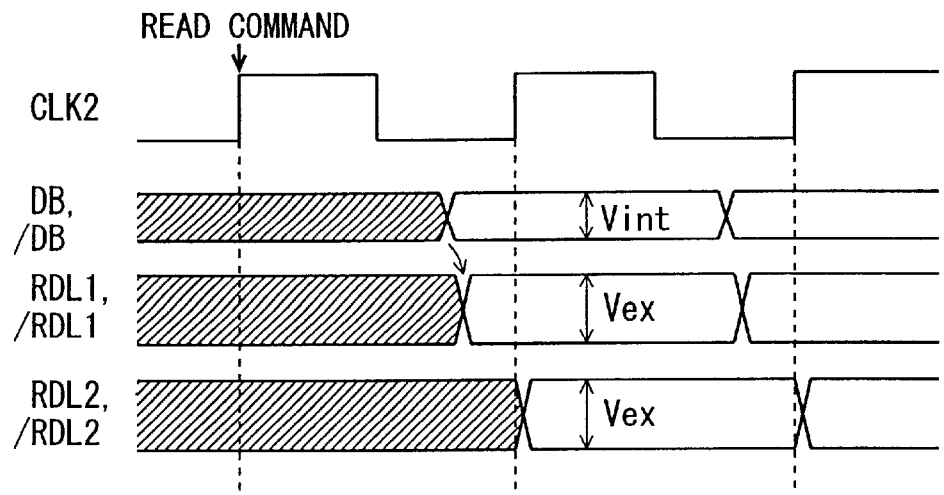
FIG. 18 is a timing chart representing an operation of the output control circuit shown in FIG. 17.

Description will now be given on operation of MOS transistors NT5 and NTG included in clocked gate circuit 12 with reference to a signal waveform diagram of FIG. 18.

For a predetermined period since application of a read command after memory cell data is transmitted to the preamplifier via the internal I/O line and before the memory cell data amplified to internal data lines DB and /DB, the signal amplitudes on internal data lines DB and /DB are at the level of internal power supply voltage Vint. Level converters LCE and LCF perform the level conversion, and transmit the signals of the amplitude of the level of external power supply voltage Vex onto internal read data lines RDL1 and /RDL1. After the signals on internal read data lines RDL1 and /RDL1 are made definite, output clock signal CLK2 is driven to H-level, and clocked gate circuit 12 is turned on.

In this clocked gate circuit 12, MOS transistor NT5 or NT6 is turned on in response to the signal potentials on internal read data lines RDL1 and /RDL1 before N-channel MOS transistors M11 and M15 receiving output clock signal CLK2 on their gates are turned on. Therefore, the drain voltages of MOS transistors M11 and M15 can be lowered, and it is possible to suppress injection of hot carriers in MOS transistors NT5, NT6, M11 and M15. When MOS transistors NT5 and NT6 are off, a drain voltage is not transmitted to adjacent MOS transistors M11 and M15, and a hot carrier does not occur (it is assumed that the primary mechanism of the hot carrier injection is drain avalanche hot carrier injection caused by a high drain electric field and a high gate voltage).

The other MOS transistors NT7–NT13 for the electric field mitigation in output data latch circuit 13 achieve operations and effects similar to those of MOS transistors NT1–NT4 for the electric field mitigation in level converting circuit 11.

In the output data control circuit shown in FIG. 17, output power supply voltage VDDQ, instead of external power supply voltage Vex, may be applied to clocked gate circuit 12 and output data latch circuit 13.

In level converting circuit 11, level converters LCC and LCD shown in FIG. 15 may be used to fit the structure of ternary data so that data bus outputting in which data bus lines DB and /DB are precharged to H-level.

According to the ninth embodiment of the invention, as described above, the MOS transistor for electric field mitigation is added to a node supplied with the external power supply voltage. Therefore, hot carrier injection can be suppressed so that fast data transfer can be achieved, and further element characteristics can be stably maintained to fully maintain the reliability of the output data control circuit.

[Tenth Embodiment]

Figure 19:
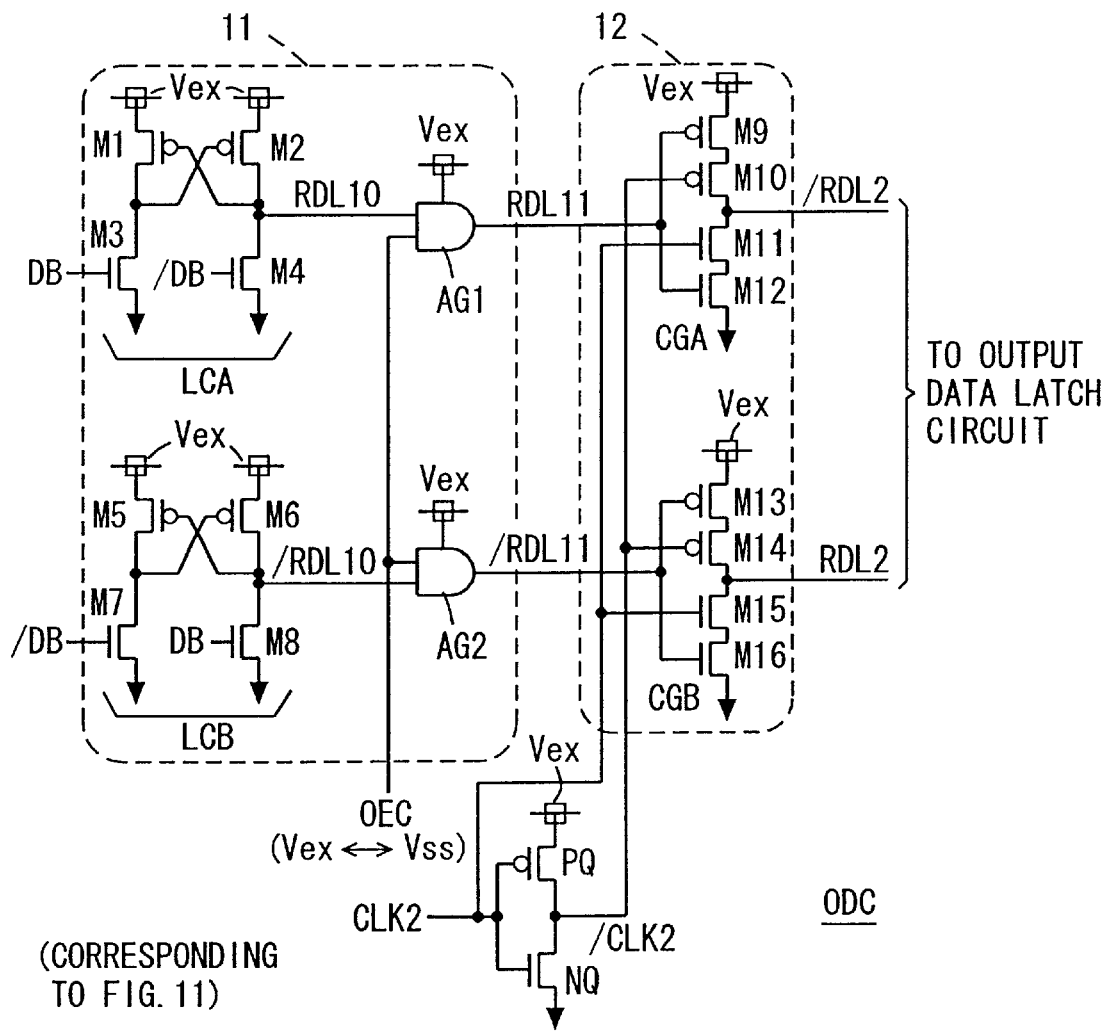
FIG. 19 shows a structure of a main portion of an output data control circuit according to a tenth embodiment of the invention.

FIG. 19 shows a structure of a main portion of output data control circuit ODC according to a tenth embodiment of the invention. FIG. 19 shows structures of level converting circuit 11 and clocked gate circuit 12 included in output data control circuit ODC. Output data latch circuit 13 and output buffer 14 arranged downstream to clocked gate circuit 12 in FIG. 19 may have structures shown in any one of FIGS. 13 to 17. The structure shown in FIG. 19 corresponds to the structure shown in FIG. 11.

In FIG. 19, level converting circuit 11 includes level converter LCA for converting the signal of an amplitude of the level of the internal power supply voltage on internal data lines DB and /DB into the signal at the level of external power supply voltage Vex for transmission onto an internal read data line RDL10, a level converter LCB for converting the signal of an amplitude oft the level of the internal power supply voltage on internal data lines DB and /DB into the signal at the level of external power supply voltage Vex for transmission onto an internal read data line /RDL10, an AND circuit AG1 receiving an output enable control signal OEC and the signal on internal read data line RDL10 to produce an output signal on an internal read data line RDL11, and an AND circuit AG2 receiving output enable control signal OEC and the signal on internal read data line /RDL10 to produce an output signal on an internal read data line /RDL11. Level converters LCA and LCB complementarily perform the level converting operations to produce complementary internal data signals on internal read data line RDL10 and /RDL10, respectively. The structures of level converters LCA and LCB are the same as those shown in FIG. 13, and the corresponding portions bear the same reference numerals, and the description thereof is not repeated.

Each of AND circuits AG1 and AG2 operates using external power supply voltage Vex as one operation power supply voltage. Therefore, output enable control signal OEC is also a signal with an amplitude of the level of external power supply voltage Vex.

Clocked gate circuit 12 includes a clocked CMOS inverter circuit CGA provided for internal read data line RDL11, and a clocked CMOS inverter circuit CGB provided for internal read data line /RDL11. Clocked CMOS inverter circuits CGA and CGB have the same structures as those in FIG. 13, and the corresponding portions bear the same reference numerals, and the description thereof is not repeated.

Figure 20:
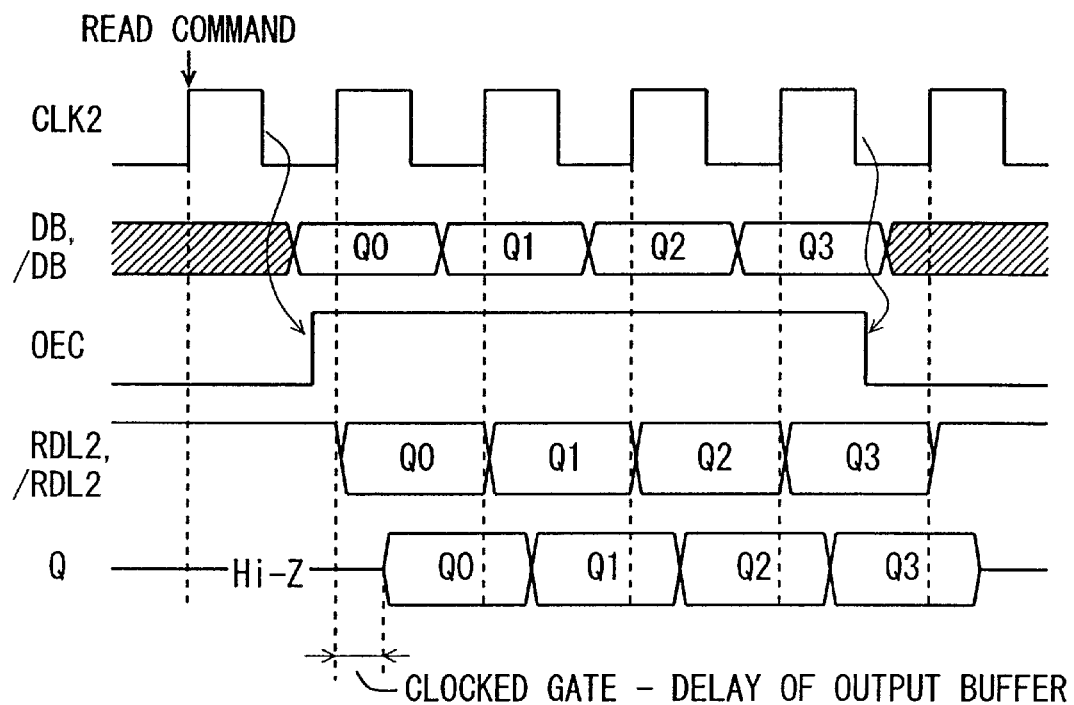
FIG. 20 is a timing chart representing an operation of the output data control circuit shown in FIG. 19.

These clocked CMOS inverter circuits CGA and CGB are supplied with output clock signal CLK2 from the clock control circuit, which has an amplitude of the level of external power supply voltage, and are also supplied with complementary output clock signal /CLK2 from the CMOS inverter formed of MOS transistors PQ and NQ. Now, operation of the circuit shown in FIG. 19 will be described with reference to a signal waveform diagram of FIG. 20.

When a read command is applied, column selecting operation is performed in the memory array circuit, and the data of a selected memory cell is read onto internal data lines DB and /DB. In response to this read command, output enable control signal OEC rises to the active state at H-level. When output enable control signal OEC is in the inactive state at L-level, the output signals of AND circuits AG1 and AG2 are both at L-level, and therefore clocked gate circuit 12 generates the signals at H-level onto internal read data lines /RDL2 and RDL2. In this state, the output buffer is in the output high-impedance state, as can be seen from the structure shown in FIG. 13.

This output enable control signal OEC may be activated after the memory cell data is read onto internal data lines DB and /DB, or may be driven to the active state before the memory cell data is read onto internal data lines DB and /DB. Output enable control signal OEC is merely required to be driven to the active state when output clock signal CLK2 is at L-level.

Output enable control signal OEC is activated, and then clocked gate circuit 12 is turned on in response to rising of output clock signal CLK2 so that the signals corresponding to memory cell data on internal data lines DB and /DB are transferred onto internal read data lines RDL2 and /RDL2. It is now assumed that the burst length is 4. In this case, four data Q0–Q3 are successively outputted in accordance with output clock signal CLK2 via level converting circuit 11 and clocked gate circuit 12. When the burst length period elapses, output enable control signal OEC attains the inactive state at L-level in response to falling of output clock signal CLK2, and AND circuits AG1 and AG2 generate the signals at L-level.

Even if output enable control signal OEC falls to L-level, output clock signal CLK2 stays in the inactive state at L-level, and clocked gate circuit 12 is off so that the signal potentials on internal read data lines /RDL2 and RDL2 do not change. The signal potentials on internal read data lines /RDL2 and RDL2 are transferred onto data output node Q via the output data latch circuit and the output buffer circuit in the following stages.

By utilizing AND circuits AG1 and AG2, level converting circuit 11 can generate the ternary data so that the current consumption can be reduced. In this case, the level converting operation and the production of output high-impedance data are performed in the stage preceding clocked gate circuit 12. Therefore, the delay time of level converting circuit 11 exerts no influence on clock access time tAC, and ternary data can be easily produced without increasing the clock access time.

Figure 21:
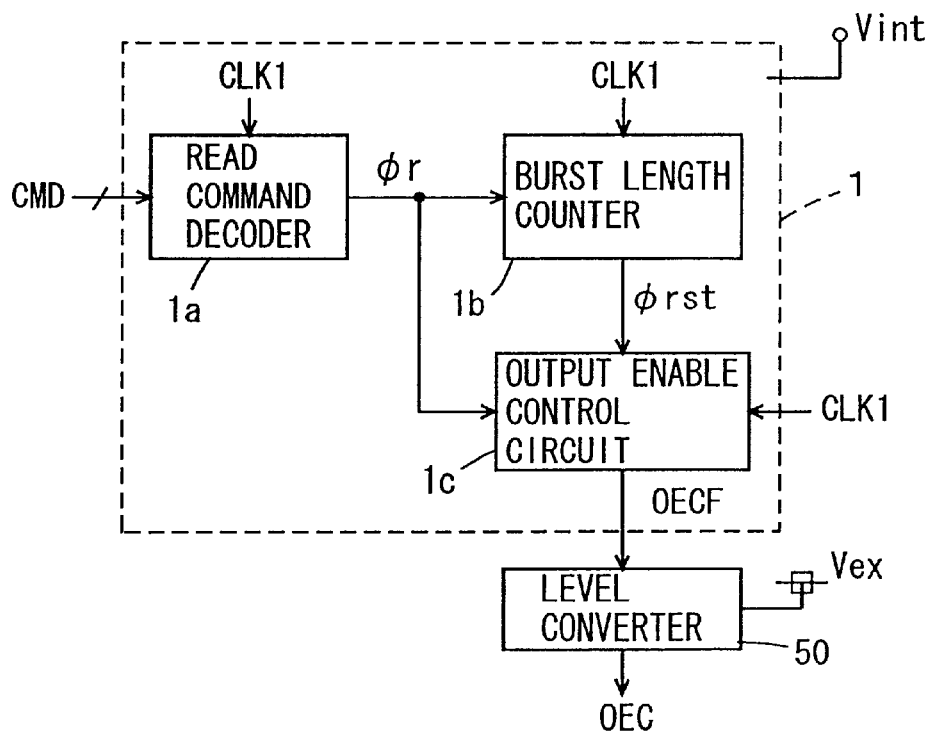
FIG. 21 schematically shows a structure of an output enable control signal generating portion shown in FIG. 19.

FIG. 21 schematically shows a structure of a portion of generating an output enable control signal. In FIG. 21, address/command control circuit 1 includes a read command decoder 1a for decoding externally applied command CMD to drive a read trigger signal φr to the active state when decoded command CMD is a read command, a burst length counter 1b for counting internal clock signal CLK1 for a period of a burst length in accordance with activation of read trigger signal φr received from read command decoder 1a, and an output enable control circuit 1c activated in response to activation of read trigger signal φr, to drive an output enable control signal OECF to the active state in response to a fall of internal clock signal CLK1, and to drive output enable control signal OECF to the inactive state in response to activation of a reset signal φrst received from burst length counter 1b.

Read command decoder 1a, burst length counter 1b and output enable control circuit 1c are supplied with internal clock signal CLK1 and operate in synchronization with internal clock signal CLK1. Address/command control circuit 1 is supplied with internal power supply voltage Vint as one operation power supply voltage. Burst length counter 1b, when made active, counts internal clock signal CLK1, and drives reset signal φrst to the active state when its count becomes equal to the burst length. Output enable control circuit 1c drives output enable control signal OECF to the inactive state in response to internal clock signal CLK1 (rising) in accordance with reset signal φrst.

Output enable control signal OECF from output enable control circuit 1c is a signal at the level of internal power supply voltage Vint, and is converted by a level converter 50 into output enable control signal OEC at the level of external power supply voltage Vex, and then is applied to AND circuits AG1 and AG2 shown in FIG. 19.

Internal clock signal CLK1 and output clock signal CLK2 are synchronized with each other via an external clock signal CLKe.

In the structure shown in FIG. 19, level converters LCA and LCB in level converting circuit 11 may be configured to adapt to the structure, in which internal data lines DB and /DB are precharged to H-level as shown in FIG. 15.

According to the tenth embodiment of the invention, as described above, the level converting circuit produces the ternary data in accordance with the output enable control signal, and the clocked gate circuit et seq. operate in accordance with read data of a memory cell only for a predetermined period. Therefore, the current consumption can be reduced.

[Modification]

Figure 22:
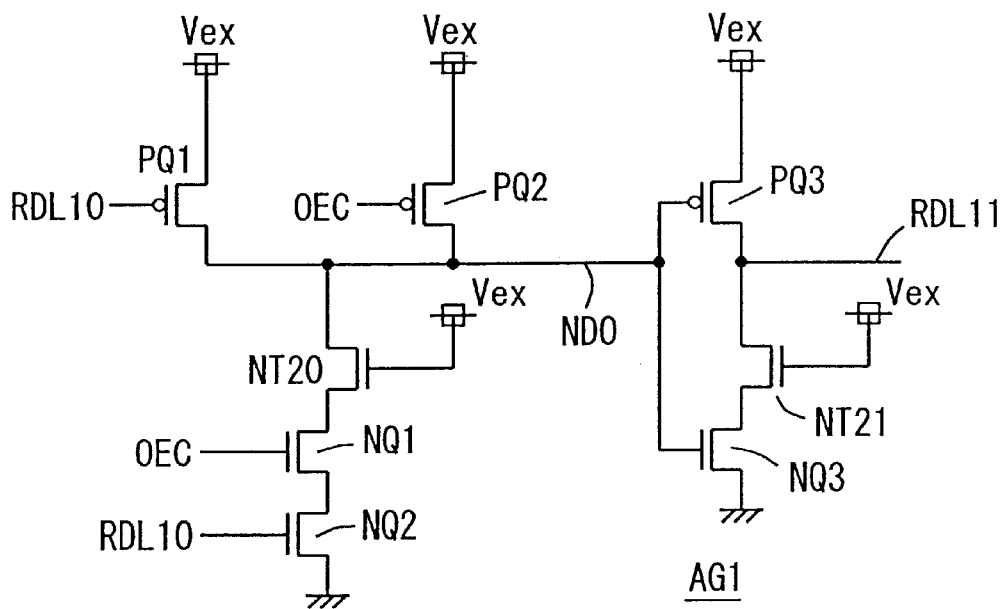
FIG. 22 shows an example of a structure of a modification of the tenth embodiment of the invention.

FIG. 22 schematically shows a structure of AND circuits AG1 and AG2. FIG. 22 shows the structure of AND circuit AG1 as a representative example. In FIG. 22, AND circuit AG1 includes a P-channel MOS transistor PQ1 connected between an external power supply node (external power supply line 6) and an internal node NDO and having a gate connected to internal read data line RDL10, a P-channel MOS transistor PQ2 connected between the external power supply node and the internal node NDO and having a gate receiving output enable control signal OEC, an N-channel MOS transistor NT20 connected at one conduction terminal to internal node NDO and receiving external power supply voltage Vex on its gate, and N-channel MOS transistors NQ1 and NQ2 connected in series between MOS transistor NT20 and the ground node. MOS transistor NQ1 receives output enable control signal OEC on its gate, and MOS transistor NQ2 has a gate coupled to internal read data line RDL10.

AND circuit AG1 further includes a P-channel MOS transistor PQ3 connected between the external power supply node and internal read data line RDL11 and having a gate connected to internal node ND0, an MOS transistor NT21 connected at one conduction terminal to internal read data line RDL11 and connected at its gate to the external power supply node, and an N-channel MOS transistor NQ3 connected between MOS transistor NT21 and the ground node and having a gate connected to internal node ND0.

In AND circuit AG1 shown in FIG. 22, MOS transistors NT20 and NT21 operate as transistors for mitigating the electric field. Therefore, the drain electric field of MOS transistors NQ1–NQ3 is mitigated even if external power supply voltage Vex is utilized as the operation power supply voltage, and injection of hot carriers into the gate insulating film is suppressed. AND circuit AG2 likewise employs N-channel MOS transistors for mitigating the electric field.

Even in the case where the level converting circuit is ternary-driven, injection of hot carriers can be suppressed, and the level converting operation can be stably performed.

[Structure 1 of Read Circuit]

Figure 23:
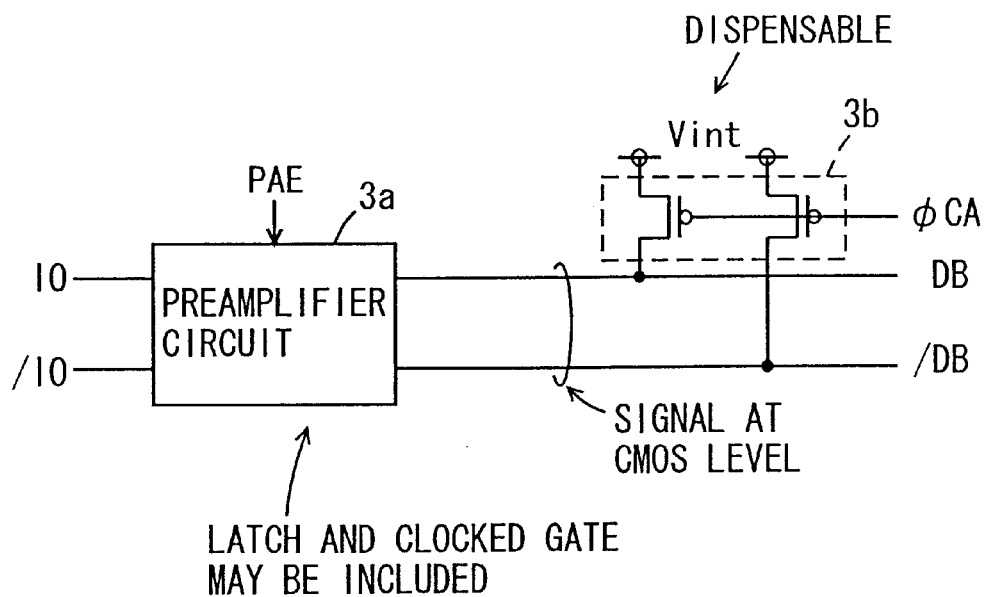
FIG. 23 schematically shows a structure of a data read circuit of one bit of a clock synchronous semiconductor memory device according to the invention.

FIG. 23 shows by way of example a structure of read circuit 3 included in the memory array circuit. In FIG. 23, read circuit 3 includes a preamplifier circuit 3a activated in response to activation of preamplifier activating signal PAE, to amplify the signals on internal I/O lines IO and /IO for transmission onto internal data lines DB and /DB, and a data line precharge circuit 3b activated, when a column access instructing signal φCA is inactive, to precharge internal data lines DB and /DB to the level of internal power supply voltage Vint.

Preamplifier circuit 3a is set to the output high-impedance state when made inactive. Column access instructing signal φCA is activated when the column access operation is performed for selecting a memory cell column and performing the data writing or reading in memory array circuit 2. Thus, column access instructing signal φCA is activated when the read command instructing data reading or the write command instructing data writing is applied. When writing/reading of data are not performed, both internal data lines DB and /DB are held at H-level of internal power supply voltage Vint.

When data access is performed, preamplifier circuit 3a operates, and internal data lines DB and /DB are driven to H- and L-levels in accordance with data signals read on internal I/O lines IO and /IO, respectively. Preamplifier circuit 3a generates the signals at the CMOS level. Therefore, internal data lines DB and /DB are driven in the ternary manner so that the level converting circuit has the structure of the level converting circuit shown in FIG. 15.

When data line precharge circuit 3b is not employed, internal data lines DB and /DB are driven in the binary manner (i.e., the manner in which complementary signals are always transmitted). In this case, the level converting circuit described with reference to FIG. 13 and others may be utilized.

The structure shown in FIG. 23 is configured to transmit both the write data and the read data through internal data lines DB and /DB. However, internal data lines DB and /DB may transmit only the read data, while internal data lines transmitting write data may be separately arranged.

Preamplifier circuit 3a may include a preamplifier for performing amplification in response to a preamplifier activating signal PAE, a latch circuit for latching the output of the preamplifier, and a transfer gate for transferring the latched data onto internal data lines DB and /DB in accordance with internal clock signal CLK1.

[Eleventh Embodiment]

Figure 24:
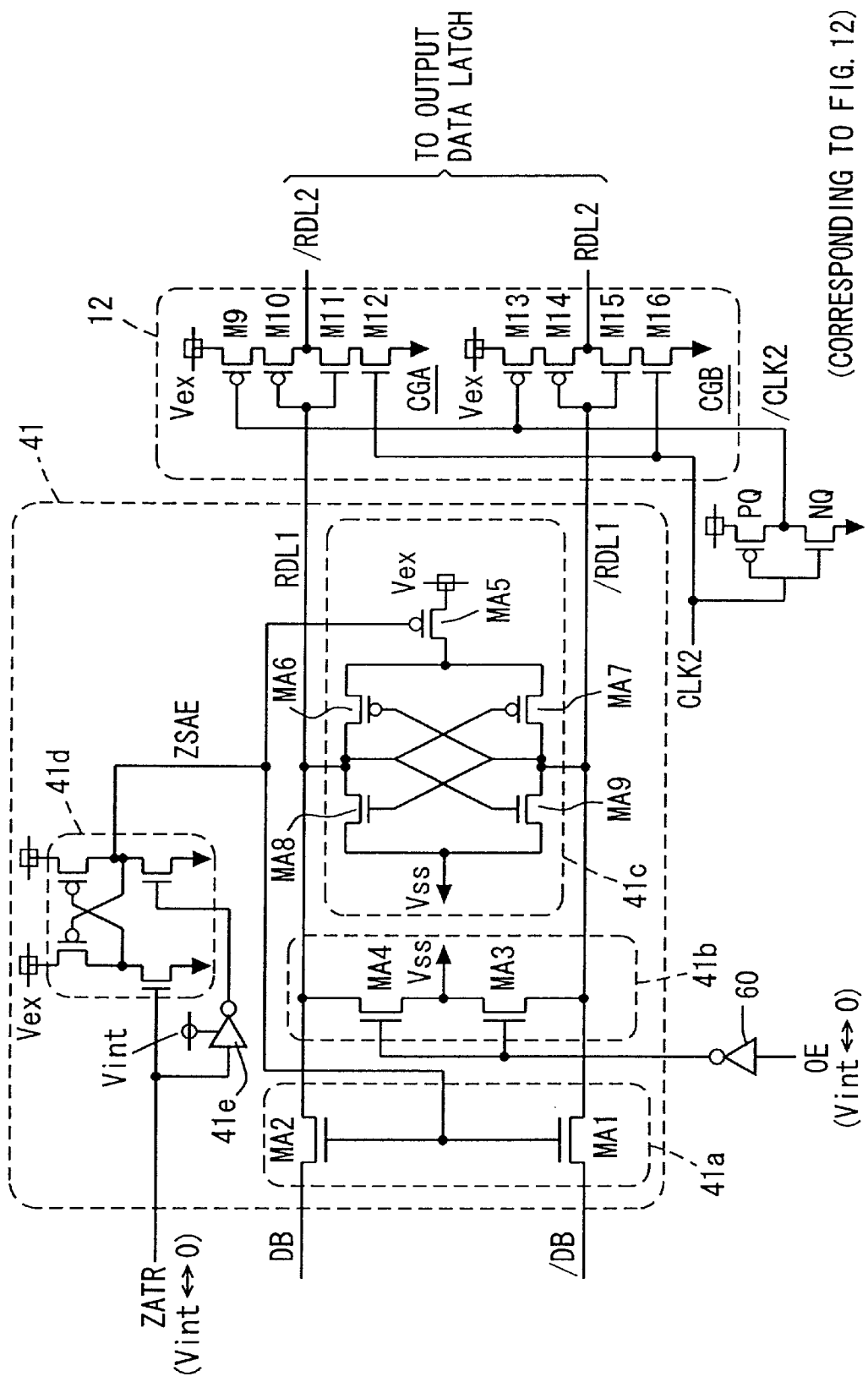
FIG. 24 shows a structure of an output data control circuit according to an eleventh embodiment of the invention.

FIG. 24 shows a structure of a main portion of the output data control circuit according to the eleventh embodiment of the invention. FIG. 24 shows structures of ternary level amplifier circuit 41 shown in 12 as well as clocked gate circuit 12 receiving the output signal of ternary level amplifier circuit 41. In FIG. 24, ternary level amplifier circuit 41 includes an inverter circuit 41e for inverting level amplification trigger signal ZATR having an amplitude of the level of internal power supply voltage Vint, a level converting circuit 41d for producing a level amplification activating signal ZSAE having an amplitude of the level of external power supply voltage Vex in accordance with the output signal of inverter circuit 41e and level amplification trigger signal ZATR, a transfer gate circuit 41a turned on, when level amplification activating signal ZSAE is inactive, to connect internal data lines DB and /DB to internal read data lines RDL1 and /RDL1, respectively, a read amplifier 41c activated, when level amplification activating signal ZSAE is active, to differentially amplify the signals on internal read data lines RDL1 and /RDL1, and a read amplifier equalize circuit 41b responsive to the output signal of an inverter 60 receiving output enable signal OE, for precharging internal read data lines RDL1 and /RDL1 to the level of ground voltage Vss.

Each of inverter circuits 41e and 60 operates using internal power supply voltage Vint as one operation power supply voltage. Level converting circuit 41d sets level amplification activating signal ZSAE to H-level of external power supply voltage Vex when level amplification trigger signal ZATR is at H-level. Output enable signal OE is driven to the active state at H-level in the data read operation. Inverter circuit 60 may operate using internal power supply voltage Vint as one operation power supply voltage, and may have a function of performing a level conversion to the level of external power supply voltage Vex.

Transfer gate circuit 41a includes transfer gates MA2 and MA1 turned on, when level amplification activating signal ZSAE is in the inactive state at H-level, to connect internal data lines DB and /DB to internal read data lines RDL1 and /RDL1, respectively. Transfer gate circuit 41a is turned off, when level amplification activating signal ZSAE is in the active state at L-level, to isolate internal data lines DB and /DB from internal read data lines RDL1 and /RDL1, respectively.

Read amplifier equalize circuit 41b includes N-channel MOS transistors MA4 and MA3 turned on, when output enable signal OE is in the inactive state at L-level, to drive read data lines RDL1 and /RDL1 to ground voltage Vss level, respectively. These MOS transistors MA3 and MA4 are turned off, when output enable signal OE is active, to stop precharging of internal read data lines RDL1 and /RDL1 to the ground voltage level, respectively.

Read amplifier 41c includes a P-channel MOS transistor MA5 for transmitting external power supply voltage Vex when level amplification activating signal ZSAE is active, a P-channel MOS transistor MA6 connected between MOS transistor MA5 and internal read data line RDL1 and having a gate connected to internal read data line /RDL1, a P-channel MOS transistor MA7 connected between MOS transistor MA5 and internal read data line /RDL1 and having a gate connected to internal read data line RDL1, an N-channel MOS transistor MA8 connected between internal read data line RDL1 and the ground node and having a gate connected to internal read data line /RDL1, and an N-channel MOS transistor MA9 connected between internal read data line /RDL1 and the ground node and having a gate connected to internal read data line RDL1. Read amplifier 41c is activated, when MOS transistor MA5 is turned on, to differentially amplify the signal potentials on internal read data lines RDL1 and /RDL1.

Clocked gate circuit 12 has the structure similar to the clocked gate circuits shown in FIGS. 13, 16 and 19. Thus, clocked gate circuit 12 in FIG. 24 includes clocked CMOS inverter circuit CGA provided for internal read data line RDL1, and clocked CMOS inverter circuit CGB provided for internal read data line /RDL1. Clocked gate circuit 12 may have the structure shown in FIG. 17. The clocked gate circuit 12 and the portion generating complementary output clock signal /CLK2 have the same structures as those shown in FIG. 13. The corresponding portions bear the same reference numerals, and the description thereof is not repeated. Operation of the ternary level amplifier circuit shown in FIG. 24 will now be described with reference to a timing chart of FIG. 25.

Before a read command instructing the data reading is applied, output enable signal OE is at L-level, and read amplifier equalize circuit 41b is active so that internal read data lines RDL1 and /RDL1 are precharged to the ground voltage level. Level amplification trigger signal ZATR is in the inactive state at H-level, and therefore level amplification activating signal ZSAE is at H-level of external power supply voltage Vex. In this state, transfer gate circuit 41a is turned on, and internal data lines DB and /DB are precharged to the ground voltage level.

When the read command is applied, output enable signal OE attains the active state at H-level in response to falling of output clock signal CLK2. Output enable signal OE is kept active or at H-level for a period of the burst length. When output enable signal OE is activated, the output signal of inverter circuit 60 attains L-level, and read amplifier equalize circuit 41b becomes inactive, whereby the operation of precharging internal read data lines RDL1 and /RDL1 to the ground voltage level is completed.

Then, data reading from a memory cell is performed in the memory array circuit in accordance with the read command, and the memory cell data is transmitted onto internal data lines DB and /DB. In accordance with the signal potentials on internal data lines DB and /DB, the voltage levels on internal read data lines RDL1 and /RDL1 change. When a sufficiently large potential difference occurs between internal read data lines RDL1 and /RDL1, level amplification trigger signal ZATR attains the active state at L-level, and level amplification activating signal ZSAE is driven to the active state at L-level. In response to the activation of level amplification activating signal ZSAE, transfer gate circuit 41a is turned off, and internal data lines DB and /DB are isolated from internal read data lines RDL1 and /RDL1, respectively. In this state, read amplifier 41c is activated to amplify differentially the potentials on internal read data lines RDL1 and /RDL1 so that the signals on internal read data lines RDL1 and /RDL1 are driven to the levels of external power supply voltage Vex and ground voltage in accordance with the memory cell data.

After the signal potentials on internal read data lines RDL1 and /RDL1 are made definite, output clock signal CLK2 attains H-level so that clocked gate circuit 12 is turned on to transmit the complementary data signals on internal read data lines RDL1 and /RDL1 onto internal read data lines /RDL2 and RDL2, respectively. Thereafter, output data Q is externally applied via the output data latch circuit and the output buffer circuit.

When clocked gate circuit 12 is turned off after one operation of reading a memory cell data is completed, level amplification trigger signal ZATR becomes inactive in response to falling of output clock signal CLK2. In response to deactivation of level amplification trigger signal ZATR, level amplification activating signal ZSAE is deactivated so that read amplifier 41c is deactivated, and transfer gate circuit 41a is turned on. Internal data lines DB and /DB are then supplied with next memory cell data from the read circuit.

Figure 25:
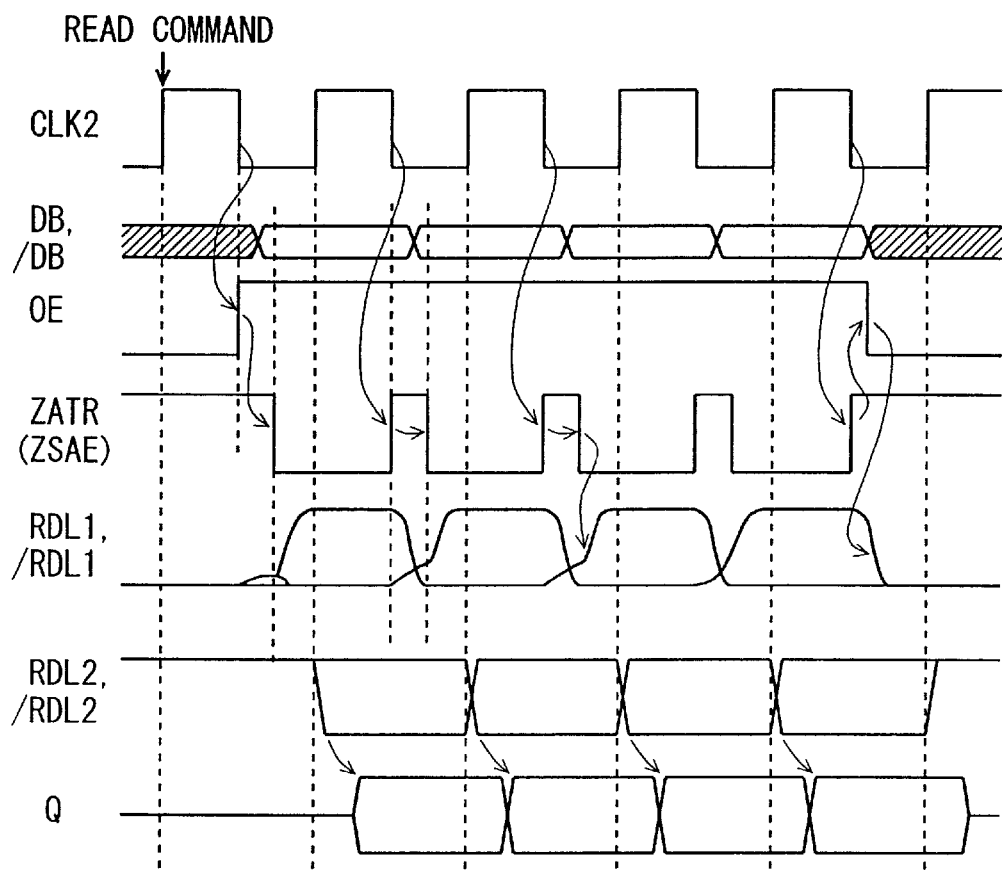
FIG. 25 is a timing chart representing an operation of the output data control circuit shown in FIG. 24.

While read amplifier 41c is inactive, the voltage levels on internal read data lines RDL1 and /RDL1 change in accordance with the data signals transferred via transfer gate circuit 41a from internal data lines DB and /DB, respectively. When the signal potentials on internal read data lines RDL1 and /RDL1 are made definite, level amplification trigger signal ZATR is activated so that transfer gate circuit 41a is turned off, and read amplifier 41c is activated. The memory cell data subsequently supplied is amplified, and is latched by read amplifier 41c. Thereafter, the foregoing operations is repeated for a period while the burst length data are read out. FIG. 25 shows waveforms in data read operation with the burst length of 4. When all the burst length data are read out, output enable signal OE is deactivated in response to the deactivation of level amplification trigger signal ZATR, and internal read data lines RDL1 and /RDL1 are driven to the ground voltage level by read amplifier equalize circuit 41b.

By holding internal read data lines RDL1 and /RDL1 at the ground voltage level, the output buffer circuit (not shown) can be set to the output high-impedance state. Thus, ternary data can be generated by utilizing read amplifier equalize circuit 41b for internal read data lines RDL1 and /RDL1. Internal read data lines RDL1 and RDL1 are not electrically floated, and internal data lines DB and /DB are precharged to the ground voltage level by read amplifier equalize circuit 41b via transfer gate circuit 41a.

The read circuit is implemented by utilizing a preamplifier circuit entering the output high-impedance state (it is possible to utilize a structure equivalent to that in FIG. 23 with precharge circuit 3b eliminated).

In the case where preamplifier circuit 3a shown in FIG. 23 is used, the signals on the CMOS level are transmitted onto internal data lines DB and /DB. By utilizing transfer gate circuit 41a, however, charges can be confined in internal read data lines RDL1 and /RDL1, and amplification can be performed by read amplifier 41c. Therefore, fast and reliable amplification can be performed by read amplifier 41c even when signals of a small amplitude are transmitted onto internal data lines DB and /DB.

[Structure 2 of Read Circuit]

Figure 26:
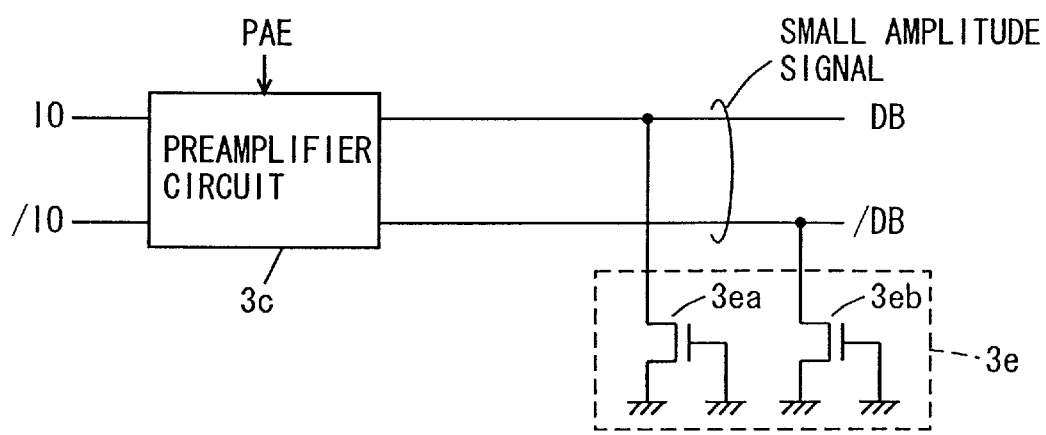
FIG. 26 shows by way of example a structure of a read circuit used in the eleventh embodiment of the invention.

FIG. 26 schematically shows another structure of the read circuit. In FIG. 26, preamplifier circuit 3c amplifies the signals on internal I/O lines IO and /IO for transmission onto internal data lines DB and /DB in response to activation of preamplifier activating signal PAE. A pull-down circuit 3e of a high resistance is arranged on internal data lines DB and /DB. Pull-down circuit 3e includes a resistance-connected N-channel MOS transistor 3ea for internal data line DB, and a resistanceconnected N-channel MOS transistor 3eb for internal data line /DB.

In the structure shown in FIG. 26, pull-down circuit 3e restricts the amplitude of the signal at H-level outputted from preamplifier circuit 3c. Therefore, signals of a small amplitude are transmitted onto internal data lines DB and /DB.

Preamplifier circuit 3c is set to the output high-impedance state when made inactive.

[Structure 3 of Read Circuit]

Figure 27A:
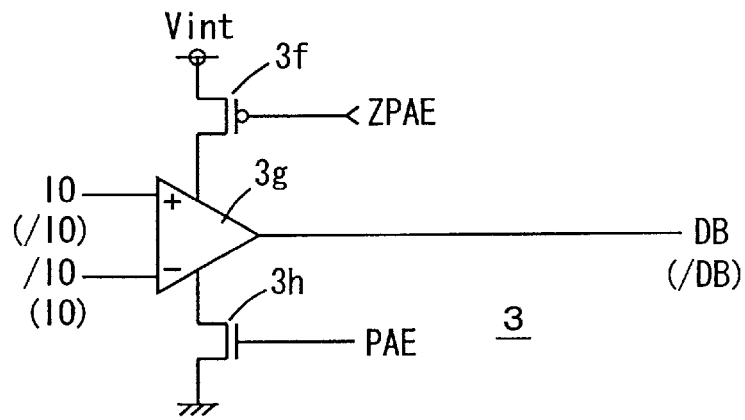
FIG. 27A shows by way of example a structure of a preamplifier circuit shown in FIG. 26.

FIG. 27A shows another structure of the preamplifier circuit included in read circuit 3. In FIG. 27A, the preamplifier circuit includes a differential amplifier circuit 3g for differentially amplifying memory cell data on internal I/O lines IO and /IO, an activating transistor 3f turned on when preamplifier activating signal ZPAE is active (L-level), to couple differential amplifier circuit 3g to internal power supply node Vint, and an activating transistor 3h turned on, when preamplifier activating signal PAE is active (H-level), to couple differential amplifier circuit 3g to the ground node.

Figure 27B:
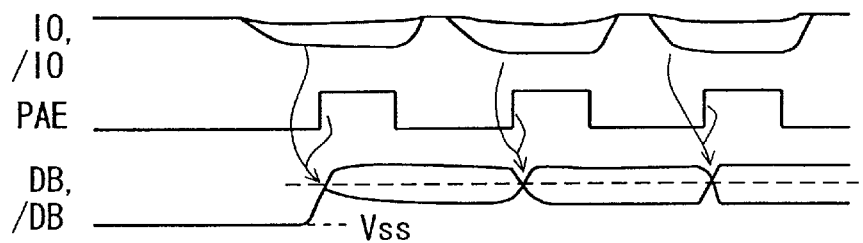
FIG. 27B is a signal waveform diagram representing an operation of the preamplifier circuit shown in FIG. 27A.

Differential amplifier circuit 3g, when made active, drives internal data line DB in accordance with the signal potentials on internal I/O lines IO and /IO. A similar structure is provided for internal data line /DB, with internal I/O lines IO and /IO connected to differential amplifier circuit 3g in a reverse relationship as indicated inside the parentheses in FIG. 27A. In the structure shown in FIG. 27A, internal data lines DB and /DB are supplied with complementary data signals. Now, operation of the preamplifier circuit shown in FIG. 27A will be described with reference to a signal waveform diagram of FIG. 27B.

When a memory cell data is read out and the signal potentials on internal I/O lines IO and /IO change, preamplifier activating signals PAE and ZPAE are activated. For differential amplifier circuit 3g, a current path from the internal power supply node to the ground node is formed, and differential amplifier circuit 3g executes the differential amplification. Differential amplifier circuit 3g generates a signal corresponding to the voltage levels on internal I/O lines IO and /IO, and the signal potentials on internal data lines DB and /DB have small amplitudes with a certain reference voltage being a center (differential amplifier circuit 3g performs analog operation, and does not generate a signal at the CMOS level). Internal data line DB is precharged to the ground voltage level by read amplifier equalize circuit 41b shown in FIG. 24 before data reading.

When data reading starts, precharging of data lines DB and /DB is completed. When preamplifier activating signals PAE and ZPAE become inactive, differential amplifier circuit 3g attains an output high-impedance state, and internal data lines DB and /DB maintain the signal potential levels equal to those that were read out when differential amplifier circuit 3g was activated. For successively reading out the burst length data, preamplifier activating signals PAE and ZPAE are periodically activated.

In the structure wherein the data signal of a small amplitude is transmitted onto internal data line DB as shown in FIG. 27A, read amplifier 41c performs the amplification after transfer gate circuit 41a causes the potential change corresponding to this small amplitude signals on internal read data lines RDL1 and /RDL1. Thus, the small amplitude signal can be amplified to the level of external power supply voltage Vex. Therefore, it is possible to reduce the charge/discharge current of the internal data bus, and the internal data signal can be transferred fast.

Figure 28:
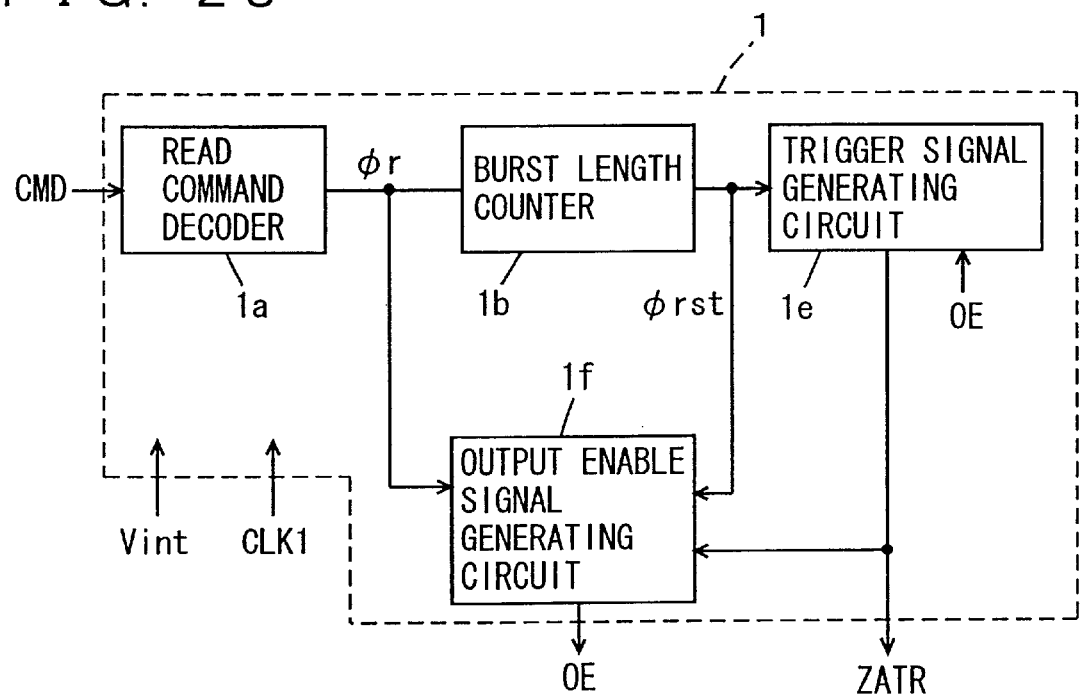
FIG. 28 schematically shows a structure of a control signal generating portion shown in FIG. 24.

FIG. 28 schematically shows a structure of the output control portion for generating output enable signal OE and level amplification trigger signal ZATR. The output control portion show in FIG. 28 is included in address/command control circuit 1 shown in FIG. 1, for example.

In FIG. 28, output control portion (address/command control circuit) 1 includes a read command decoder 1a for decoding an externally supplied command CMD, to drive read trigger signal φr to the active state when the read command is applied, a burst length counter 1b activated, in response to activation of read trigger signal φr, to count the burst length period, an output enable signal generating circuit 1f for driving output enable signal OE to the active state in response to activation of read trigger signal φr, and a trigger signal generating circuit 1e for generating level amplification trigger signal ZATR in response to a fall of internal clock signal CLK1 while output enable signal OE is active.

Output enable signal generating circuit if operates when a burst length count-up instructing signal (reset signal) φrst from burst length counter 1b is activated, to drive output enable signal OE to the inactive state in response to inactivation of subsequently generated level amplification trigger signal ZATR. Trigger signal generating circuit 1e maintains level amplification trigger signal ZATR inactive after reset signal φrst from burst length counter 1b becomes active.

In address/command control circuit 1, burst length counter 1b and trigger signal generating circuit 1e are supplied with internal clock signal CLK1. Each of read command decoder 1a, burst length counter 1b, trigger signal generating circuit 1e and output enable signal generating circuit if operate using internal power supply voltage Vint as one operation power supply voltage.

Signals ZATR and OE generated from trigger signal generating circuit 1e and output enable signal generating circuit 1f shown in FIG. 28, respectively, are applied to ternary level amplifier circuit 41 shown in FIG. 24.

The read circuit can employ another structure provided that it can generate a small amplitude signal.

Address/command control circuit 1 shown in FIG. 28 includes a circuit for generating preamplifier activating signal PAE in accordance with the output signals of output enable signal generating circuit 1f and burst length counter 1b. After preamplifier activating signal PAE is activated, trigger signal ZATR is driven to the active state.

According to the eleventh embodiment, as described above, the read amplifier is activated to apply the signal on the internal data line to the clocked gate circuit after the signal on the internal data line is confined on the internal read data line, and the signal can be precisely amplified to the data signal at the level of external power supply voltage even when the data signal of a small amplitude is transmitted through internal data line. Therefore, it is possible to implement the output data control circuit operating fast with a low current consumption.

[Other Examples of Application]

Figure 29:
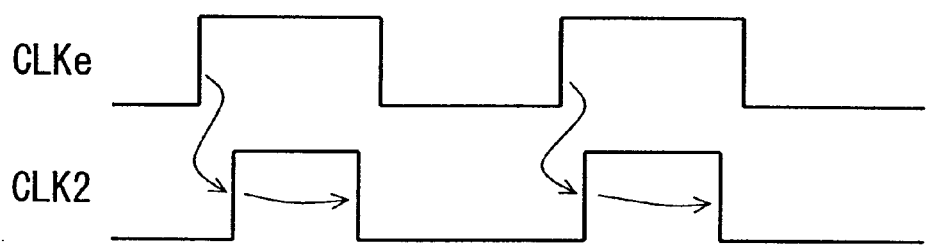
FIG. 29 schematically shows another example of a waveform of an output clock signal used in the invention.

Output clock signal CLK2 may be a one shot pulse that keeps H-level for a predetermined period in response to rising of external clock signal CLKe, as shown in FIG. 29. In the case where output clock signal CLK2 of one shot pulse is utilized as shown in FIG. 29, the pulse width (period of H-level) of the output clock signal CLK2 can be made constant, resulting in stable operation of the internal circuits (because the falling timing is always fixed with respect to the rising timing).

Figure 30:
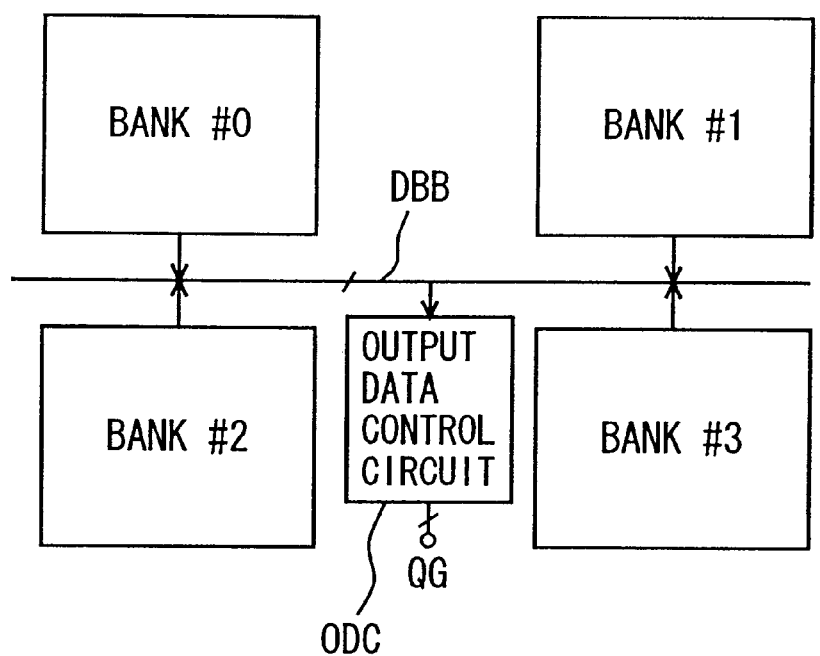
FIG. 30 schematically shows a whole structure of a clock synchronous semiconductor memory device according to the invention.
Figure 31:
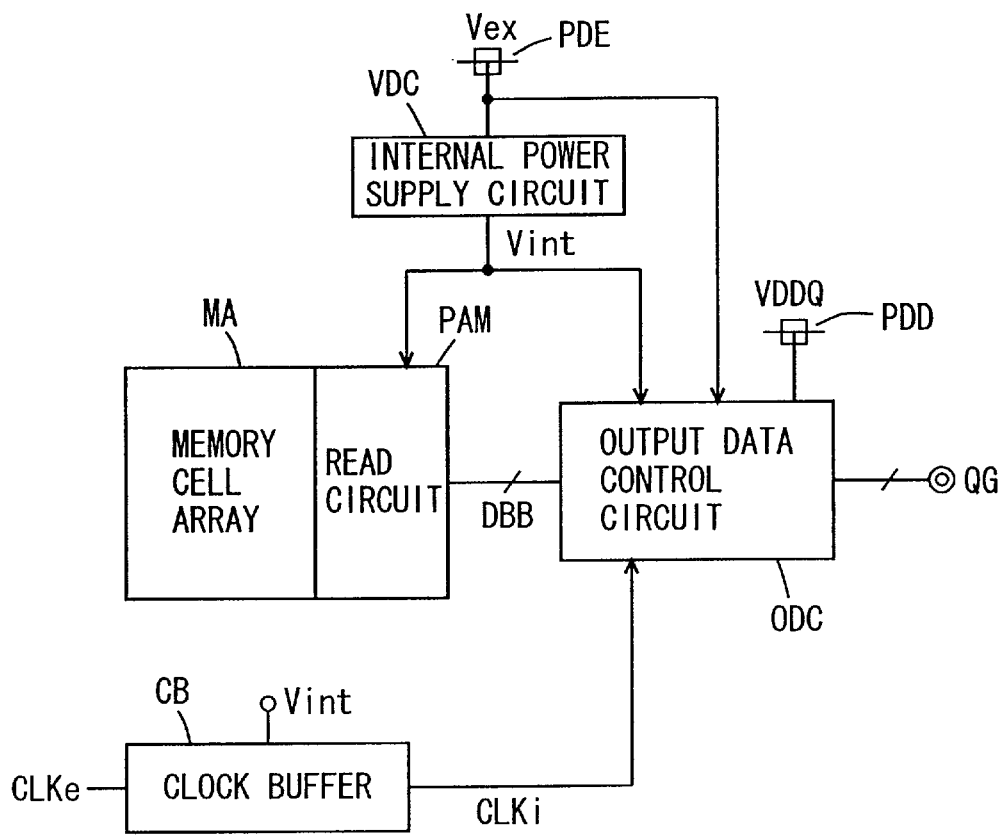
FIG. 31 schematically shows a structure of a main portion of a clock synchronous semiconductor memory device in the prior art.
Figure 32:
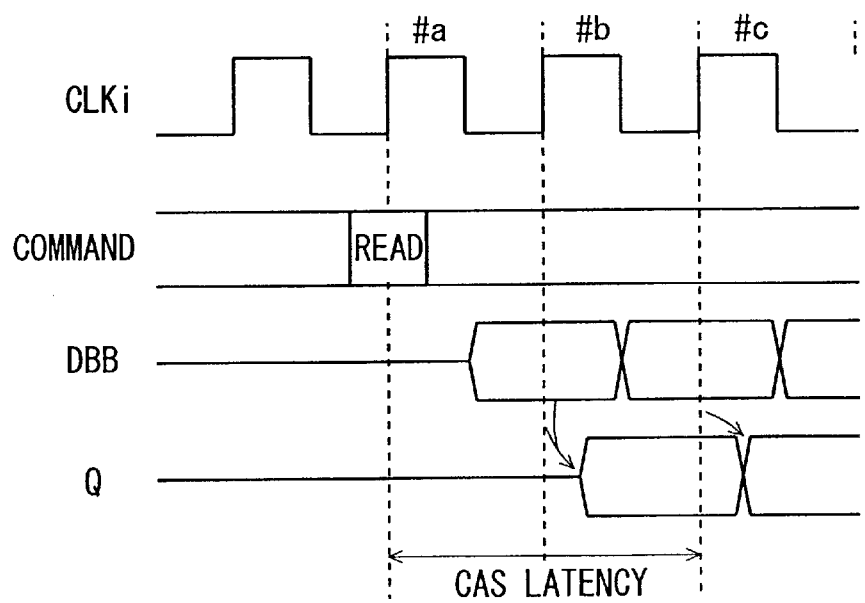
FIG. 32 is a timing chart representing an operation of the clock synchronous semiconductor memory device shown in FIG. 31.

FIG. 30 schematically shows another structure of a clock synchronous semiconductor memory device according to the invention. In FIG. 30, a memory array circuit includes four banks #0–#3. Banks #0–#3 can be driven to the active state independently of each other. Internal data bus DBB is disposed commonly to these banks #0–#3, and output data control circuit ODC is coupled to internal data bus DBB. Among banks #0–#3 each allowing driving to the active state independently of the other banks, only a bank including a column to be accessed in accordance with an instruction transfers the read data of selected memory cells to output data control circuit ODC via internal data bus DBB.

In the structure shown in FIG. 30, output control circuits ODC are disposed in a dispersed fashion in correspondence to respective data output pads.

In the clock synchronous semiconductor memory device having the bank structure as shown in FIG. 30, fast data transfer can be achieved by operating output data control circuit ODC with the external power supply voltage.

The invention can be applied to any clock synchronous semiconductor memory device, provided that read data of a memory cell is transferred in synchronization with a clock signal.

Internal data bus DBB may have such a structure that a write data bus for transmitting write data is provided separately and independently from a read data bus for transmitting read data.

According to the clock synchronous semiconductor memory device of the invention, as described above, the circuits related to the clock access time operate with the voltage level equal to or higher than the internal power supply voltage. Therefore, the circuits related to the clock access time can operate fast, and the clock access time can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A clock synchronous semiconductor memory device comprising:
   an internal power supply circuit for producing an internal power supply voltage at a level not higher than a level of an external power supply voltage from said external power supply voltage;
   a memory cell array having a plurality of memory cells;
   internal circuitry receiving the internal power supply voltage from said internal power supply circuit as one operation power supply voltage for operation, for selecting an addressed memory cell in said memory cell array and reading memory cell data from the selected memory cell;
   amplitude expanding circuitry receiving, in a form of complementary data signals, the memory cell data read by said internal circuitry for producing a pair of complementary internal read data signals of an amplitude of the level of said external power supply voltage received as an operation power supply voltage thereof, said amplitude expanding circuitry including a circuit for enlarging the amplitude of each of said complementary data signals;
   a transfer circuit receiving a voltage at a level not lower than said internal power supply voltage as one operation power supply voltage for operation, for transferring the internal read data signals outputted from said amplitude expanding circuitry in synchronization with an output clock signal;
   an output data latch circuit receiving a voltage not lower than said internal power supply voltage as one operation power supply voltage for operation, for latching the data outputted from said transfer circuit; and
   an output buffer receiving an output power supply voltage supplied independently of said external power supply voltage as operation power supply voltage for operation, for buffering the latch data of said output data latch circuit to output external read data onto an output node.

2. The clock synchronous semiconductor memory device according to claim 1, further comprising:
   clock control circuitry receiving said external power supply voltage as one operation power supply voltage for operation, for generating and applying said output clock signal having an amplitude of the level of said external power supply voltage to said transfer circuit.

3. The clock synchronous semiconductor memory device according to claim 2, wherein
   said clock control circuitry includes a circuit for producing an input clock signal of an amplitude of the level of said external power supply voltage, and
   said internal circuitry includes an input circuit for taking in an externally applied signal to produce an internal control signal in synchronization with said input clock signal.

4. The clock synchronous semiconductor memory device according to claim 2, wherein
   said clock control circuitry includes a circuit for producing an input clock signal having an amplitude of the level of said internal power supply voltage in accordance with an externally applied clock signal, and
   said internal circuitry includes an input circuit for taking in an externally supplied signal to produce an internal control signal in synchronization with said input clock signal.

5. The clock synchronous semiconductor memory device according to claim 1, wherein
   said one operating power supply voltage received by each of said transfer circuit and said output data latch circuit is said external power supply voltage.

6. The clock synchronous semiconductor memory device according to claim 1, wherein
   said one operation power supply voltage received by each of said transfer circuit and said output data latch circuit is said output power supply voltage.

7. The clock synchronous semiconductor memory device according to claim 1, wherein
   said amplitude expanding circuitry includes:
     a transfer gate for transferring the memory cell data signals received from said internal circuitry in response to a level amplification trigger signal,
     a read amplifier activated to amplify the data applied via said transfer gate in response to said level amplification trigger signal, and
     a read amplifier equalize circuit connected between said read amplifier and said transfer gate, for precharging an amplification node of said read amplifier to a predetermined potential level when an output enable signal is inactive;
   said read amplifier operates using a voltage not lower than said internal power supply voltage as one operation power supply voltage;
   said level amplification trigger signal is enlarged in amplitude to a voltage level not lower than said internal power supply voltage and then applied to said transfer gate and said read amplifier;
   said read amplifier is made inactive when said transfer gate is on; and
   said read amplifier equalize circuit is made inactive when said read amplifier is active.

8. The clock synchronous semiconductor memory device according to claim 1, wherein
   said internal circuitry includes a read circuit for transferring said memory cell data through a data bus as small amplitude signals, and
   said circuit in said amplitude expanding circuitry includes a level amplifier circuit coupled to said data bus for producing the internal read data signals in accordance with said small amplitude signals transferred through said data bus.

9. The clock synchronous semiconductor memory device according to claim 1, wherein
   said circuit in said amplitude expanding circuitry includes:
     a level converter for converting a signal voltage level of the memory cell data read from said internal circuitry into the level of said operation power supply voltage of said amplitude expanding circuitry, and
     a gate circuit operating with said operation power supply voltage of said amplitude expanding circuitry for producing a signal corresponding to an output signal of said level converter when an output enable signal is active, said gate circuit generating the signal at a logical level setting said output buffer to an output high-impedance state when said output enable signal is inactive.

10. The clock synchronous semiconductor memory device according to claim 1, wherein
    said transfer circuit includes a clocked buffer circuit attaining an output high-impedance state when said output clock signal is at a first logical level.

11. The clock synchronous semiconductor memory device according to claim 1, wherein
said amplitude expanding circuitry includes a level converter provided for each of said complementary data signals,
said level converter includes:
a first insulated gate field effect transistor connected between an internal output node and a first node, and receiving, at a gate thereof, said operation power supply voltage thereof,
a second insulated gate field effect transistor connected between said first node and a reference potential node, and receiving, on a gate thereof, the memory cell data signal applied from said internal circuitry, and
a pull-up element for pulling up said internal output node to said operation power supply voltage.

12. The clock synchronous semiconductor memory device according to claim 10, wherein
said clocked buffer circuit includes:
first and second insulated gate field effect transistors each receiving, on a gate thereof, an output signal of said amplitude expanding circuitry;
a third insulated gate field effect transistor coupled between the first insulated gate field effect transistor and a power supply node supplying said one operation power supply voltage, and receiving, on a gate thereof, said output clock signal; and
a fourth insulated gate field effect transistor coupled between the second insulated gate field effect transistor and a reference potential node, and receiving, on a gate thereof, said output clock signal;
the first and third insulated gate field effect transistors are different in conductivity type from the second and fourth insulated gate field effect transistors;
an output signal of said transfer circuit is generated from an internal output node connecting said first and second insulated gate field effect transistors;
the third and fourth insulated gate field effect transistors are supplied, on their respective gates, with mutually complementary clock signals as said output clock signal; and
the output signal of said amplitude expanding circuitry has an amplitude of a level of said operation power supply voltage thereof when said clocked buffer circuit is in an output high-impedance state.

13. The clock synchronous semiconductor memory device according to claim 1, wherein
said output data latch circuit includes an inverter circuit, and said inverter circuit includes:
a first insulated gate field effect transistor coupled between first and second nodes, and receiving, on a gate thereof, said one operation power supply voltage,
a second insulated gate field effect transistor connected between said second node and a reference potential node, and receiving, on a gate thereof, a signal to be latched, and
a third insulated gate field effect transistor coupled between said first node and a power supply node supplying said one operation power supply voltage, receiving said signal to be latched on a gate thereof, to be turned on complementarily to said second insulated gate field effect transistor.

14. The clock synchronous semiconductor memory device according to claim 1, wherein said output data latch circuit includes cascaded first and second inverter circuits for latching the data outputted from said transfer circuit, an output signal of said second inverter circuit is transferred to an input of said first inverter circuit, and said second inverter circuit has a current driving capability smaller than a current driving capability of said first inverter circuit.

15. The clock synchronous semiconductor memory device according to claim 1, wherein
said output data latch circuit latches each of said complementary internal read data signals to generate first and second internal output signals corresponding to latched signals, respectively; and
said output buffer includes insulated gate field effect transistors of first and second conductivity types receiving, on their respective gates, said first and second internal output signals.

16. A clock synchronous semiconductor device comprising:
an internal power supply circuit for producing an internal power supply voltage at a level not higher than a level of an external power supply voltage from said external power supply voltage;
internal circuitry receiving the internal power supply voltage from said internal power supply circuit as one operation power supply voltage for operation, for reading internal data internally;
amplitude expanding circuitry receiving, in a form of complementary data signals, the internal data read by said internal circuitry for producing a pair of complementary internal read data signals of an amplitude of the level of said external power supply voltage received as an operation power supply voltage thereof, said amplitude expanding circuitry including a circuit for enlarging the amplitude of each of said complementary data signals;
a transfer circuit receiving a voltage at a level not lower than said internal power supply voltage as one operation power supply voltage for operation, for transferring the internal read data signals outputted from said amplitude expanding circuitry in synchronization with an output clock signal;
an output data latch circuit receiving a voltage not lower than said internal power supply voltage as one operation power supply voltage for operation, for latching the data outputted from said transfer circuit; and
an output buffer receiving an output power supply voltage supplied independently of said external power supply voltage as one operation power supply voltage for operation, for buffering the latch data of said output data latch circuit to output external read data onto an output node.

17. The clock synchronous semiconductor device according to claim 16, further comprising:
clock control circuitry receiving said external power supply voltage as one operation power supply voltage for operation, for generating and applying said output clock signal having an amplitude of the level of said external power supply voltage to said transfer circuit.

18. The clock synchronous semiconductor device according to claim 17, wherein
said clock control circuitry includes a circuit for producing an input clock signal of an amplitude of the level of said external power supply voltage, and
said internal circuitry includes an input circuit for taking in an externally applied signal to produce an internal control signal in synchronization with said input clock signal.

19. The clock synchronous semiconductor device according to claim 17, wherein
said clock control circuitry includes a circuit for producing an input clock signal having an amplitude of the level of said internal power supply voltage in accordance with an externally applied clock signal, and
said internal circuitry includes an input circuit for taking in an externally supplied signal to produce an internal control signal in synchronization with said input clock signal.

20. The clock synchronous semiconductor device according to claim 16, wherein
said one operating power supply voltage received by each of said transfer circuit and said output data latch circuit is said external power supply voltage.

21. The clock synchronous semiconductor device according to claim 16, wherein
said one operation power supply voltage received by each of said transfer circuit and said output data latch circuit is said output power supply voltage.

22. A clock synchronous semiconductor memory device comprising:
a memory cell array having a plurality of memory cells;
internal circuitry receiving a first power supply voltage as one operation power supply voltage for operation, for selecting an addressed memory cell in said memory cell array and reading memory cell data from the selected memory cell;
amplitude expanding circuitry receiving, in a form of complementary data signals, the memory cell data read by said internal circuitry for producing a pair of complementary internal read data signals of an amplitude of the level of a second power supply voltage received as an operation power supply voltage thereof, said amplitude expanding circuitry including a circuit for enlarging the amplitude of each of said complementary data signals, and said second power supply voltage being not lower than said first power supply voltage;
a transfer circuit receiving a voltage at a level not lower than said first power supply voltage as one operation power supply voltage for operation, for transferring the internal read data signals outputted from said amplitude expanding circuitry in synchronization with an output clock signal;
an output data latch circuit receiving a voltage not lower than said first power supply voltage as one operation power supply voltage for operation, for latching the data outputted from said transfer circuit; and
an output buffer receiving an output power supply voltage independent of the first and second power supply voltages as one operation power supply voltage for operation, for buffering the latch data of said output data latch circuit to output external read data onto an output node.

23. The clock synchronous semiconductor memory device according to claim 22, further comprising:
clock control circuitry receiving said second power supply voltage as one operation power supply voltage for operation, for generating and applying said output clock signal having an amplitude of the level of said second power supply voltage to said transfer circuit.

24. The clock synchronous semiconductor memory device according to claim 23, wherein
said clock control circuitry includes a circuit for producing an input clock signal of an amplitude of the level of said second power supply voltage, and
said internal circuitry includes an input circuit for taking in an externally applied signal to produce an internal control signal in synchronization with said input clock signal.

25. The clock synchronous semiconductor memory device according to claim 23, wherein
said clock control circuitry includes a circuit for producing an input clock signal having an amplitude of the level of said first power supply voltage in accordance with an externally applied clock signal, and
said internal circuitry includes an input circuit for taking in an externally supplied signal to produce an internal control signal in synchronization with said input clock signal.

26. The clock synchronous semiconductor memory device according to claim 22, wherein
said one operating power supply voltage received by each of said transfer circuit and said output data latch circuit is said second power supply voltage.

27. The clock synchronous semiconductor memory device according to claim 22, wherein
said one operation power supply voltage received by each of said transfer circuit and said output data latch circuit is said output power supply voltage.

28. A clock synchronous semiconductor device comprising:
internal circuitry receiving a first power supply voltage as one operation power supply voltage for operation, for reading internal data;
amplitude expanding circuitry receiving, in a form of complementary data signals, the internal data read by said internal circuitry for producing a pair of complementary internal read data signals of an amplitude of the level of a second power supply voltage received as an operation power supply voltage thereof, said amplitude expanding circuitry including a circuit for enlarging the amplitude of each of said complementary data signals, and said second power supply voltage being not lower than said first power supply voltage;
a transfer circuit receiving a voltage at a level not lower than said first power supply voltage as one operation power supply voltage for operation, for transferring the internal read data signals outputted from said amplitude expanding circuitry in synchronization with an output clock signal;
an output data latch circuit receiving a voltage not lower than said first power supply voltage as one operation power supply voltage for operation, for latching the data outputted from said transfer circuit; and
an output buffer receiving an output power supply voltage independent of the first and second power supply voltages as one operation power supply voltage for operation, for buffering the latch data of said output data latch circuit to output external read data onto an output node.

29. The clock synchronous semiconductor device according to claim 28, further comprising:
clock control circuitry receiving said second power supply voltage as one operation power supply voltage for operation, for generating and applying said output clock signal having an amplitude of the level of said second power supply voltage to said transfer circuit.

30. The clock synchronous semiconductor device according to claim 29, wherein
said clock control circuitry includes a circuit for producing an input clock signal of an amplitude of the level of said second power supply voltage, and said internal circuitry includes an input circuit for taking in an externally applied signal to produce an internal control signal in synchronization with said input clock signal.

31. The clock synchronous semiconductor device according to claim 29, wherein said clock control circuitry includes a circuit for producing an input clock signal having an amplitude of the level of said first power supply voltage in accordance with an externally applied clock signal, and said internal circuitry includes an input circuit for taking in an externally supplied signal to produce an internal control signal in synchronization with said input clock signal.

32. The clock synchronous semiconductor device according to claim 28, wherein said one operating power supply voltage received by each of said transfer circuit and said output data latch circuit is said second power supply voltage.

33. The clock synchronous semiconductor device according to claim 28, wherein said one operation power supply voltage received by each of said transfer circuit and said output data latch circuit is said output power supply voltage.

34. The clock synchronous semiconductor memory device according to claim 1, wherein said amplitude of each of said complementary signals is smaller than said internal power supply voltage, and said circuit in said amplitude expanding circuitry enlarges said amplitude to the level of said external power supply voltage, and said output power supply voltage is not lower than said external power supply voltage.

35. The clock synchronous semiconductor device according to claim 16, wherein said amplitude of each of said complementary signals is smaller than said first power supply voltage, and said circuit in said amplitude expanding circuitry enlarges said amplitude to the level of said second power supply voltage, and said output power supply voltage is not lower than said second power supply voltage.

36. The clock synchronous semiconductor memory device according to claim 22, wherein said amplitude of each of said complementary signals is smaller than said first power supply voltage, and said circuit in said amplitude expanding circuitry enlarges said amplitude to the level of said second power supply voltage, and said output power supply voltage is not lower than said second power supply voltage.

37. The clock synchronous semiconductor device according to claim 28, wherein said amplitude of each of said complementary signals is smaller than said first power supply voltage, and said circuit in said amplitude expanding circuitry enlarges said amplitude to the level of said second power supply voltage, and said output power supply voltage is not lower than said second power supply voltage.

* * * * *